United States Patent [19]

Imazeki et al.

[11] Patent Number: 4,797,636

[45] Date of Patent: Jan. 10, 1989

[54] RADIO RECEIVER

[75] Inventors: Kazuyoshi Imazeki; Nobuaki Yokoyama, both of Tokyo, Japan

[73] Assignee: General Research of Electronics, Inc., Tokyo, Japan

[21] Appl. No.: 853,846

[22] Filed: Jun. 20, 1986

Related U.S. Application Data

[62] Division of Ser. No. 661,025, Oct. 15, 1984, abandoned.

[51] Int. Cl.$^4$ ............................................. H03B 21/02
[52] U.S. Cl. ...................................... 331/48; 331/179; 455/255; 455/315
[58] Field of Search ................... 331/2, 4, 31, 48, 179; 455/255, 315, 316

[56] References Cited

U.S. PATENT DOCUMENTS

| | | | |
|---|---|---|---|
| 2,529,443 | 11/1950 | Bach | 331/179 |
| 2,567,860 | 9/1951 | Shapiro | 455/315 X |
| 4,322,692 | 3/1982 | Brewerton et al. | 331/2 |
| 4,395,777 | 7/1983 | Oki et al. | 455/316 X |

*Primary Examiner*—Eugene R. LaRoche
*Assistant Examiner*—David Mis
*Attorney, Agent, or Firm*—Trexler, Bushnell, Giangiorgi & Blackstone, Ltd.

[57] ABSTRACT

A radio receiver includes a noise blanking system comprising a switching circuit in the signal path which is responsive to a blanking signal for preventing passage of signals. A blanking signal producing circuit is in the signal path ahead of the switching circuit and is responsive to predetermined noise signals received by the radio receiver for producing the blanking signal. The receiver also includes an AGC circuit for producing a gain control signal and a signal strength meter coupled for response to the gain control signal. A linearity control system comprises a current controlling circuit responsive to a meter control signal for controlling the current flow through the meter so as to increase the range of linear response of the meter. A signalling circuit is coupled with the AGC circuit and with the current controlling circuit and is responsive to the gain control signal for producing the meter control signal. A tuning system for the receiver comprises a first local oscillator responsive to first oscillator control signals for varying the frequency of first oscillator signals over a first range at first increments. A second local oscillator normally produces a second oscillator signal at a fixed frequency. A frequency varying circuit is coupled with the second oscillator and responsive to second oscillator control signals for varying the frequency of the second oscillator signals over a second range at second increments which are smaller than the first increments. A control circuit produces the first and second oscillator control signals.

5 Claims, 11 Drawing Sheets

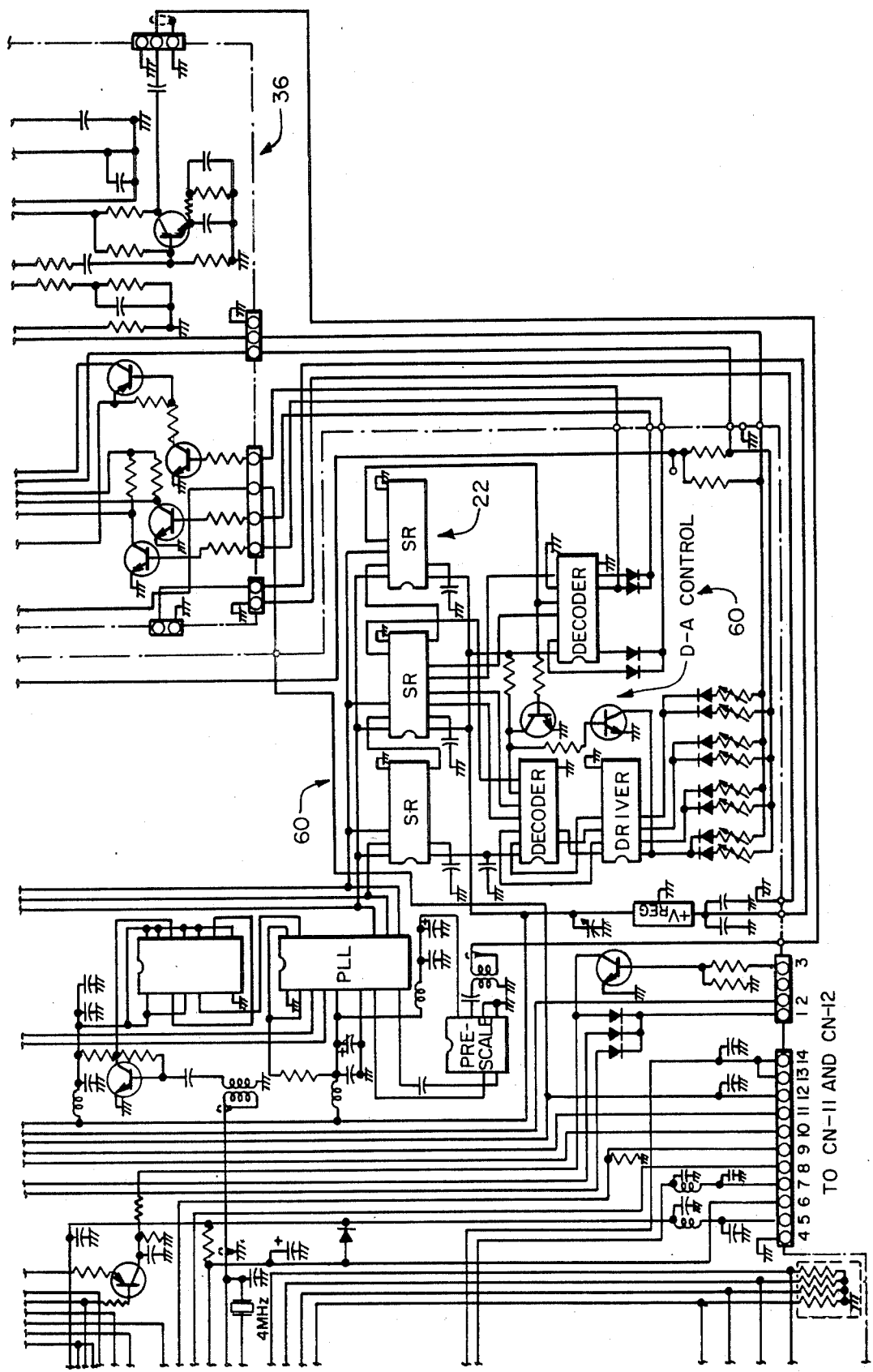

RADIO RECEIVER

This is a divisional of application Ser. No. 661,025 filed on Oct. 15, 1984, now abandoned.

BACKGROUND OF THE INVENTION

This invention is directed generally to the field of radio receivers, and more particularly to a novel noise blanking system for eliminating impulse-type noise from the audio output signal of a radio receiver, to a novel signal strength meter response linearizing system, and to a novel tuning system for a radio receiver.

The problem of adequate noise suppression with respect to a number of potential noise or spurious signal sources has been often encountered in the radio receiver arts. In a radio receiver of the type capable of receiving radio signals over multiple bands or over a relatively broad bandwidth, maintaining reception capability while rejecting noise and spurious signals invariably presents problems in receiver design. While the prior art has addressed the problem of suppression of noise or spurious signals from a variety of sources, there is room for improvement in addressing the problem of eliminating impulse-type noise from the audio output signal of a radio receiver.

Such impulse noise signals are especially bothersome in short wave (SW) receivers, which may receive signals in single side band (SSB) transmissions comprising either upper side band (USB) or lower side band (LSB) as well as continuous wave (CW) transmissions of the type generally utilized to transmit Morse code. Such impulse noise (also referred to as pulsating or pulse-type noises) may come from various sources. For example, motors, fluorescent lamps, and the like, may produce pulsating signals or noise pulses which may be picked up by a radio receiver and reproduced in the audio output signal.

Another source of such pulse-type noise particularly in short wave type receivers is the pulse noises associated with "over the horizon radar" ("the woodpecker"). Since such impulse or pulse-type noises are of relatively short duration, they are difficult to detect and eliminate from the audio output of a radio receiver. However, since such noises are often repetitive and randomly occurring, they are irritating and often obscure portions of the desired signal transmission, when they are reproduced in the audio signal output of the receiver.

Radio receivers often include a signal strength meter for producing an indication of the relative strength of the received signal. Such a signal strength indication is useful in aiding manual tuning of the received signal to attain the maximum signal strength and the optimum tuning closest to the center frequency of the received signal. However, the range of signal strength of received signals generally varies over a relatively wide range. Hence, to permit stable receiver operation and provide a reliable audio signal output well above the noise level, most receivers incorporate an automatic gain control circuit. Such an automatic gain control circuit generally controls the gain at one or more amplifiers which process the received signal. That is, the gain is increased for relatively weak received signals and decreased for relatively strong received signals. This process tends to compress the range of signal strength of the resulting demodulated or discriminated audio signals. Signal strength meters in most receivers reflect the effects of the automatic gain control circuit and, hence give only an abbreviated or compressed indication of the range of signal strength of the received radio signals.

In this regard, such signal strength meters may be coupled to receive a gain control signal of the automatic gain control circuit, which bears an inverse relation to the received signal strength. However, the automatic gain control circuit signal generally has a greatly abbreviated linear range compared with the range of received signal strength. Hence, use of this signal at the meter results in a greatly abbreviated or compressed indication of received signal strength.

Heretofore, radio receiver tuning systems have generally utilized either conventional heterodyne or phase-locked loop circuits and techniques. Such techniques generally provide continuous tuning of frequencies over a given range. However, in many applications such continuous frequency tuning is not necessary. We have found that an incremental frequency tuning system can aid in eliminating spurious signals and in eliminating disturbances such as beat frequencies or "birdies".

OBJECTS AND SUMMARY OF THE INVENTION

Accordingly, it is a general object of this invention to provide a novel and improved radio receiver.

A more particular object is to provide a radio receiver employing a novel noise blanking system particularly adapted to eliminate impulse-type noises from the audio output of a radio receiver.

An additional object is to provide a radio receiver employing a novel signal strength meter response linearizing system for greatly increasing the linear range of response of a signal strength meter of a radio receiver.

Yet a further object is to provide a radio receive employing a novel incremental frequency tuning system for tuning radio signals at predetermined increments over a predetermined range of frequencies.

In accordance with a first aspect of the invention, there is provided a noise blanking system for a radio receiver comprising switching means interposed in a predetermined portion of a signal path in the radio receiver and having a first state for allowing signals in said signal path to pass through said switching means and selectively actuatable to a second state for preventing said signals from passing through said switching means. The switching means includes control input means and is responsive to a predetermined signal condition at said control input means for actuation to said second state. The switching means assumes the first state in the absence of the predetermined signal condition at the control input means. Blanking signal producing means are operatively coupled with the control input means and also coupled to receive signals from a portion of said signal path ahead of said switching means. The blanking signal producing means are responsive to predetermined noise signals received by the radio receiver for producing a blanking signal comprising the predetermined signal condition in a predetermined systematic fashion to thereby prevent the noise signal from passing through the switching means and hence from passing through the signal path.

In accordance with a further aspect of the invention, there is provided a signal strength meter linearity control system for a radio receiver including an automatic gain control circuit for producing an automatic gain control signal and a signal strength meter coupled for response to the automatic gain control signal. The control system comprises current controlling circuit means coupled with the signal strength meter and responsive to a predetermined meter control signal for controlling the current flow through the signal strength meter so as to increase the range of linear response of the meter to the signal from the automatic gain control circuit. Signalling circuit means are coupled with the automatic gain control circuit and with the current controlling circuit means and are responsive to the automatic gain control signal for producing the predetermined meter control signal in a predetermined systematic fashion.

In accordance with a further aspect of the invention there is provided a tuning system for a radio receiver comprising first local oscillator means for producing first local oscillator signals at frequencies over a predetermined range of frequencies; said first local oscillator means being responsive to first predetermined oscillator control signals for varying the frequency of said first local oscillator signals at first predetermined increments. Second local oscillator means are provided for normally producing a second local oscillator signal at a predetermined frequency. Frequency varying means are coupled with the second local oscillator means and responsive to second predetermined oscillator control signals for varying the frequency of the second local oscillator signals over a second predetermined range of frequencies relative to said predetermined frequency normally produced thereby and at second predetermined increments, the second predetermined increments being smaller than the first predetermined increments. Control circuit means are provided for producing the first and second predeterminedooscillator control signals.

BRIEF DESCRIPTION OF THE DRAWINGS

The features of the present invention which are believed to be novel are set forth with particularity in the appended claims. The organization and manner of operation of the invention, together with further objects and advantages thereof, may best be understood by reference to the following description taken in connection with the accompanying drawings in the several figures of which like reference numerals identify like elements, and in which:

FIGS. 3A, 3B, 3C and 3D taken together form a schematic circuit diagram illustrating yet further details of the radio receiver of the invention;

DETAILED DESCRIPTION OF THE ILLUSTRATED EMBODIMENT

Figure 1A:
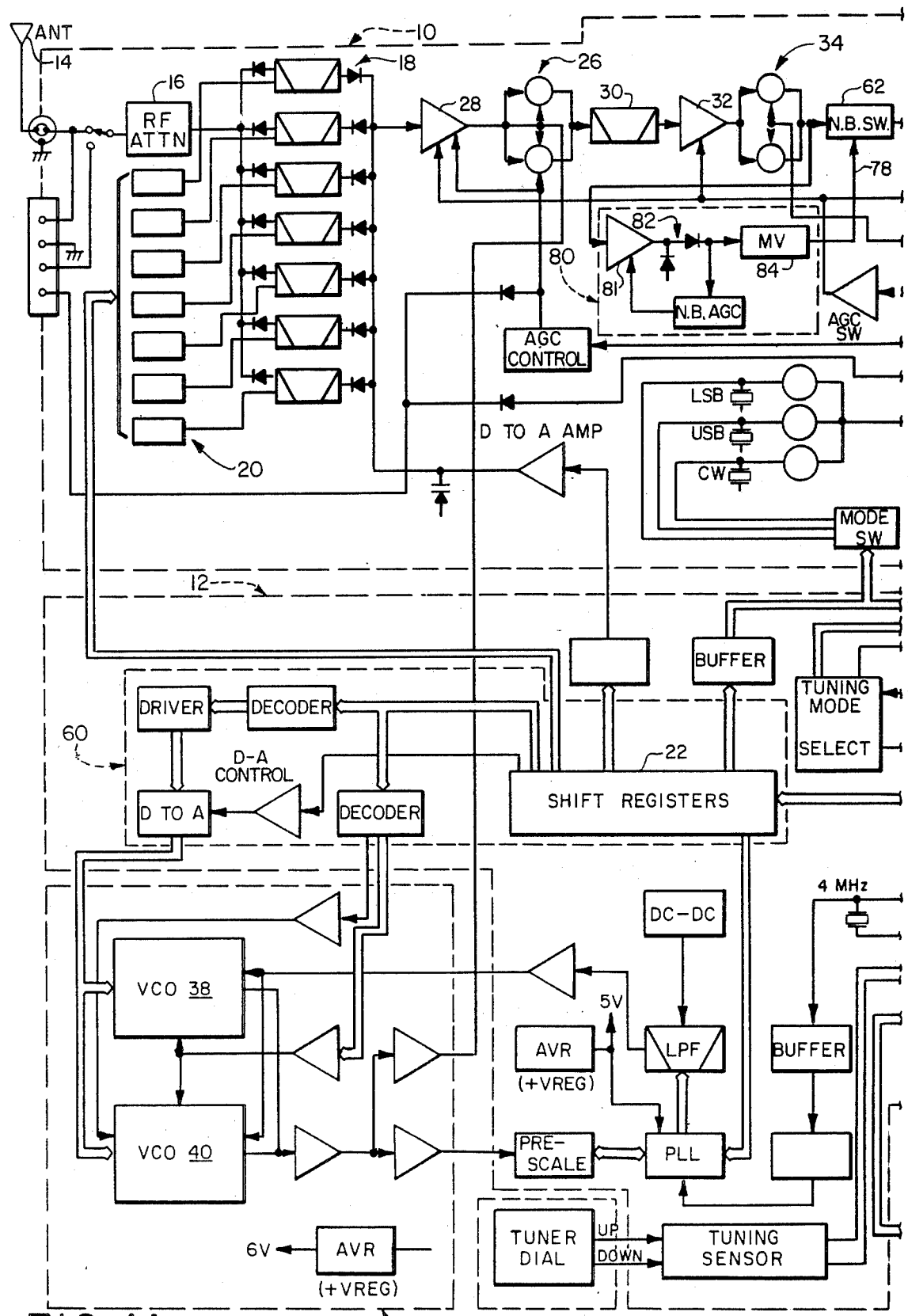
FIGS. 1A and 1B taken together form a block diagram of a radio receiver employing novel systems in accordance with the invention.
Figure 1B:
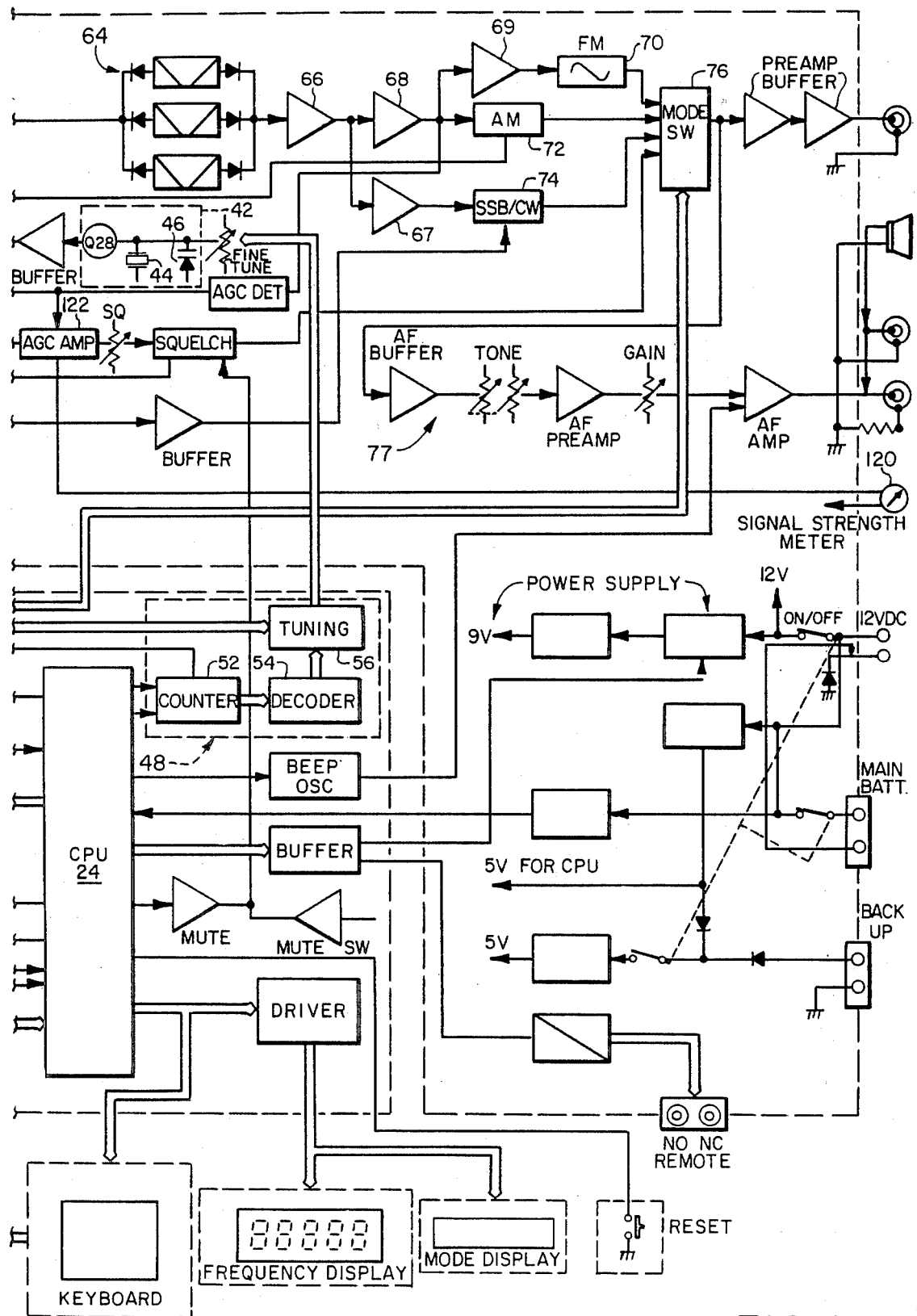

Referring now to the drawings and initially to FIG. 1, a novel radio receiver including features in accordance with the present invention is illustrated in block diagrammatic form. Generally speaking, the receiver includes a linear circuit portion enclosed in dashed line generally indicated at reference numeral 10 and a logic circuit portion enclosed in dashed line indicated generally by reference numeral 12. The schematic circuit diagram formed by FIGS. 2A-2D inclusive illustrates further details of the linear circuit portion 10, while the schematic circuit diagram of FIGS. 3A-3D inclusive illustrates further details of the logic circuit portion 12.

Generally speaking, the linear circuit 10 receives radio signals by way of an antenna (ANT) 14 at a radio frequency attenuator circuit (RF ATTN) 16. This RF attenuator circuit feeds the received radio frequency (RF) signal to a selectable one of a plurality of crystal tuning elements designated generally by reference numeral 18. A corresponding plurality of switching elements designated generally by reference numeral 20 selects a suitable one of the crystal elements 18 for receiving the desired or selected radio signal. These switching elements 20 are in turn controlled by a shift register 22 in the logic circuit 12 which is in turn controlled by a CPU, microprocessor or microcomputer 24. In the illustrated embodiment, the crystals 18 are seven in number and cover the radio frequencies from substantially 10 KHz to 30 MHz. Other ranges of operation, as well as other methods and apparatus for RF tuning in this fashion may be utilized without depating from the invention.

The selected and tuned RF signal is fed to a first mixer circuit 26 by way of an RF amplifier 28. Here, a first local oscillator signal, produced in a manner which will be presently described, is mixed with the received radio frequency signal to produce a first intermediate frequency (IF) signal. This first IF signal is fed through a crystal filter, which in the illustrated embodiment is a 40.455 MHz crystal filter 30 and thence through a first IF amplifier 32 to a second mixer circuit designated generally by the reference numeral 34. At the second mixer circuit 34, the first IF signal is further mixed with a second local oscillator signal to produce a second intermediate frequency (IF) signal.

In accordance with a first aspect of the invention, first local oscillator signals at frequencies over a first prdetermined range of frequencies are produced by first local oscillator means in the form of a voltage-controlled oscillator circuit (VCO) 36 of the logic circuit portion 12. In the illustrated embodiment, this VCO circuit 36 comprises first and second VCO's 38, 40 for covering a range of first local oscillator signal frequencies from substantially 40.465 MHz to 70.455 MHz. However, fewer or more such VCO's may be utilized to produce local oscillator signals at other frequencies without departing from the invention. As previously indicated, these first local oscillator signals are utilized at the first mixer 26 to mix with the RF signals to form the first IF signals.

The first local oscillator means is responsive to first predetermined oscillator control signals for varying the frequency of the first local oscillator signals over a first predetermined range of frequencies at first predetermined increments. In the illustrated embodiment, this range of frequencies comprises the frequencies from 40.465 MHz to 70.455 MHz as discussed above, while the increments of tuning in this range comprise 1 KHz increments.

Further in accordance with this aspect of the invention, the second local oscillator signal utilized at the second mixer circuit 34 normally comprises a signal at a predetermined frequency. This signal is produced by second local oscillator means which in the illustrated embodiment comprise a second local oscillator circuit designated generally by reference numeral 42. This second local oscillator circuit 42 will be seen to include a reference crystal element 44 which in the illustrated embodiment comprises a 40 MHz crystal and a varactor element 46. However, other oscillator circuits may be utilized without departing from the invention.

Further in accordance with the first aspect of the invention, frequency varying means designated generally by reference numeral 48 and forming a part of the logic circuit 12 are coupled with the second local oscillator. These frequency varying means are responsive to second predetermined oscillator control signals for varying the frequency of the second local oscillator signal over a second predetermined range of frequencies relative to the predetermined frequency (40 MHz) normally produced thereby and at second predetermined increments. These second predetermined increments are smaller than the first predetermined increments (1 KHz), and in the illustrated embodiment comprise increments of frequency of substantially on the order of 100 Hz.

Control circuit means comprising the microprocessor or CPU 24 produce the first and second predetermined oscillator control signals for controlling the frequency variations and the frequency increments of the signals produced by the respective first and second local oscillators.

It will be understood that the second local oscillator 42 normally produces a 40 MHz second local oscillator signal. Accordingly, the tuning of the receiver will normally be at 1 KHz increments in response to the increments of frequency of the first local oscillator signal. However, selector means which here take the form of a selector switch 50 (see FIG. 3A) are selectively actuatable for causing the control circuit means or microprocessor 24 to produce the second predetermined control signals, thereby varying the second local oscillator signal at the second predetermined (100 Hz) increments. Hence, when the switch 50 is actuated to the "100 Hz" position, the receiver will tune received radio frequencies in smaller, 100 Hz increments. It should be noted that other increments of tuning for both the first local oscillator and second local oscillator may readily be utilized without departing from the invention.

Referring now again briefly to the frequency varying means or circuit 48, it will be seen that this circuit includes counter means or a counter circuit 52 which is coupled to receive the second predetermine oscillator control signals from the microprocessor or CPU 24, and decoder means or a decoder circuit 54 which is coupled to the counter means or circuit 52. This counter circuit 52 and decoder circuit 54 cooperate for counting and decoding the second predetermined oscillator control signals to form control voltages corresponding to the frequencies at predetermined increments to which the second local oscillator is to be tuned or varied with respect to its normal or nominal 40 MHz frequency.

In the illustrated embodiment, this tuning is further accomplished by a tuning circuit 56 comprising a plurality of variable resistors (see FIG. 3A) coupled with the decoder 54. Moreover, in the illustrated embodiment the tuning of the second local oscillator accomplished by the circuit 48 is over the range 40 MHz plus or minus 500 Hz in 100 Hz increments. Other ranges and increments may be selected without departing from the invention, so long as the second frequency increments are smaller than the first frequency increments provided by the first local oscillator.

In this regard, the second local oscillator also comprises a voltage controlled oscillator and includes control voltage producing means in the form of the previously mentioned crystal 44 and varactor 46 for producing a control voltage corresponding to the predetermined frequency normally produced (40 MHz). This control voltage producing means is responsive to the frequency varying circuit means 48 for varying the control voltage at increments and over a range corresponding to the second predetermined increments and range (40 MHz plus or minus 500 Hz at 100 Hz increments) as previously mentioned.

As also previously indicated the first local oscillator means comprises voltage controlled oscillator means in the form of VCO's 38 and 40 which produce the first local oscillator signal. The first local oscillator further includes control voltage producing means in the form of circuits designated generally by reference numeral 60 which include the previously mentioned shift register 22, which has multiple functions in the illustrated embodiment. This control voltage producing circuit is responsive to the oscillator control signals produced by the CPU or microprocessor 24 for producing control voltages corresponding to the previously mentioned first local oscillator signal frequencies over the previously mentioned frequency range thereof (40.465 MHz-70.455 MHz) and at the previously described 1 KHz increments.

Advantageously, the above-described incremental tuning system accomplishes tuning at increments as close as 100 Hz if desired, without utilizing conventional heterodyne or phase-locked loop (PLL) techniques and circuits. Rather, the circuits utilized are greatly simplified in the present invention Moreover, these simplified circuits and the incremental tuning achieved thereby greatly facilitate the elimination of spurious received signals and disturbance of the received signals such as beat frequencies or "birdies".

Referring again to the block diagram of FIG. 1, the second mixer circuit 34 feeds the second IF signal to a noise blanking switching circuit (N.B. SW) 62 which feeds further second intermediate frequency (IF) filters 64. The second IF filter 64 in turn feeds second IF amplifier stages 66, 67, 68 and 69, which in turn feed respective detector or discriminator circuits 70, 72 and 74. In the illustrated embodiment, three such detector circuits including an FM discriminator 70, an AM detector 72 and a single side band/continuous wave (SSB/CW) detector 74 are utilized so as to properly detect or discriminate the audio in the bands included in the range of RF frequencies received in the illustrated embodiment (10 KHz–30 MHz). However, other arrangements and types of detectors and/or discriminators as suitable for other radio bands included in other selected ranges of frequencies may of course be selected without departing from the invention. The discriminator and detectors 70, 72 and 74 feed a switching or selection circuit 76 which in turn feeds the selected detected audio to audio output circuits designated generally by reference numeral 77.

Reference is further invited to FIGS. 2A-2D and 3A-3D wherein details of the circuit construction of the foregoing circuits in accordance with one practical and preferred form of the invention are illustrated. However, it will be recognized that changes and modifications may be made as to the details of the circuit construction without departing from the invention.

In accordance with a second aspect of the invention the noise blanking switching circuit 62 comprises a switching means portion of a novel noise blanking system. This switching means is interposed in a portion of the signal path in the radio receiver and has a first state for allowing the signals in the signal path to pass therethrough and is selectively actuatable to a second state for preventing passage of the signals therethrough. In this regard, it will be recognized that the second IF signals may be either passed through the signal path to the second IF filter 64 or prevented from passing thereto by actuation of the noise blanking switching circuit or switching means 62. In this regard the noise blanking switching circuit or switching means 62 includes control input means in the form of a control input 78 responsive to a predetermined signal condition for actuating the switching means 62 to the second state for preventing signals from passing therethrough. In the absence of this predetermined signal condition at the control input 78, the switching means 62 assumes the first state for allowing signals to pass therethrough.

Further in accordance with the second aspect of the invention, a blanking signal producing means or circuit designated generally by reference numeral 80 is coupled with the control input 78 and with a portion of the signal path prior to the switching means. In the illustrated embodiment the blanking signal producing means or circuit 80 is also coupled to receive the second IF signal at the output of the second mixer circuit 34. This blanking signal producing circuit is responsive to predetermined or preselected noise signals received by the radio receiver for producing a blanking signal which comprises the predetermined signal condition for actuating the switching means 62 to the second state by way of the control input 78 thereof. Accordingly, this actuation of the switching means 62 in response to a noise signal prevents this noise signal from passing through the switching means and hence through the signal path to be reproduced ultimately at the audio output.

The blanking signal producing means includes tuning means in the form of a noise blanking or tuning amplifier 81 coupled with the signal path (at the output of second mixer 34) for tuning the predetermined or preselected noise signals to be eliminated by the noise blanking system. The blanking signal producing means or circuit 80 also includes demodulating or detecting means in the form of a diode-type detector circuit 82 coupled with the tuning means 81 for demodulating or detecting the noise signals to form pulse signals. A multivibrator (MV) circuit or means 84 is responsive to these pulse signals for producing the blanking signal. In the illustrated embodiment, and referring to FIGS. 2A and 2B, this multivibrator means takes the form of a one-shot multivibrator 84 for producing blanking pulses of controllable width in response to the pulse signals from the detector 82, these blanking pulses comprising the blanking signal fed to the control input 78 of the noise blanking switch 62.

Figure 2A:
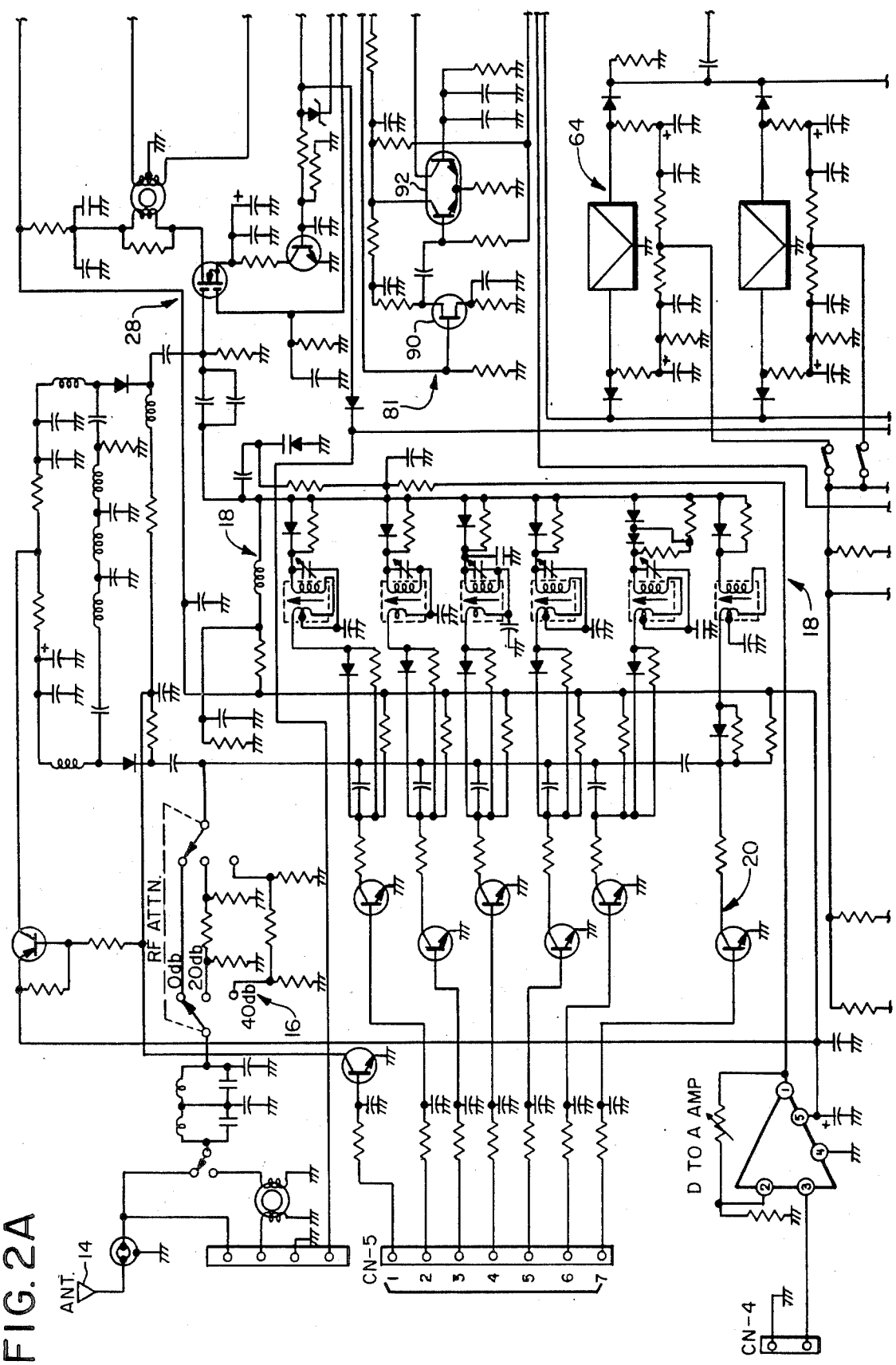
FIGS. 2A, 2B, 2C and 2D taken together form a schematic circuit diagram illustrating further details of the radio receiver of the invention.
Figure 2B:
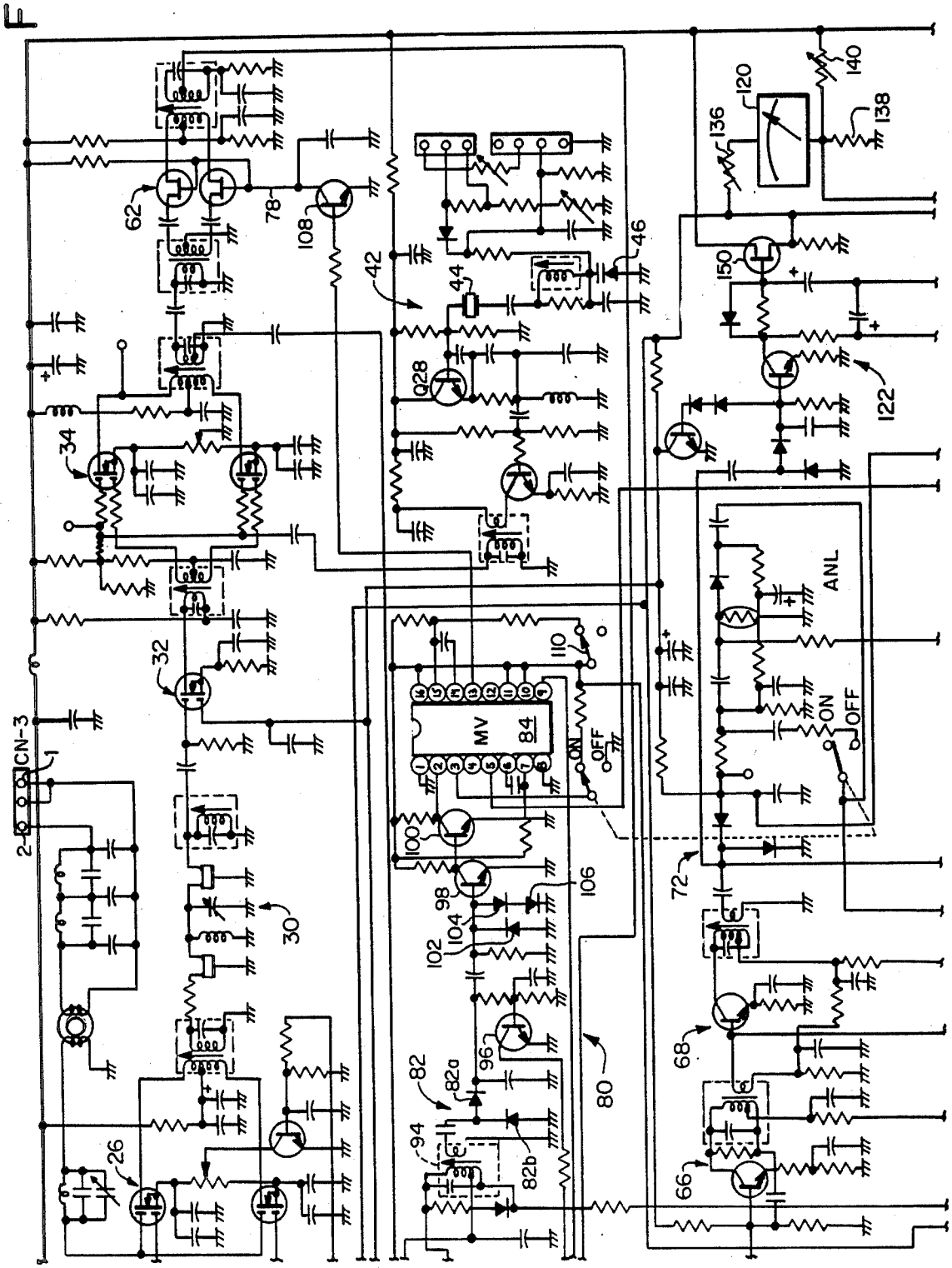
Figure 2C:
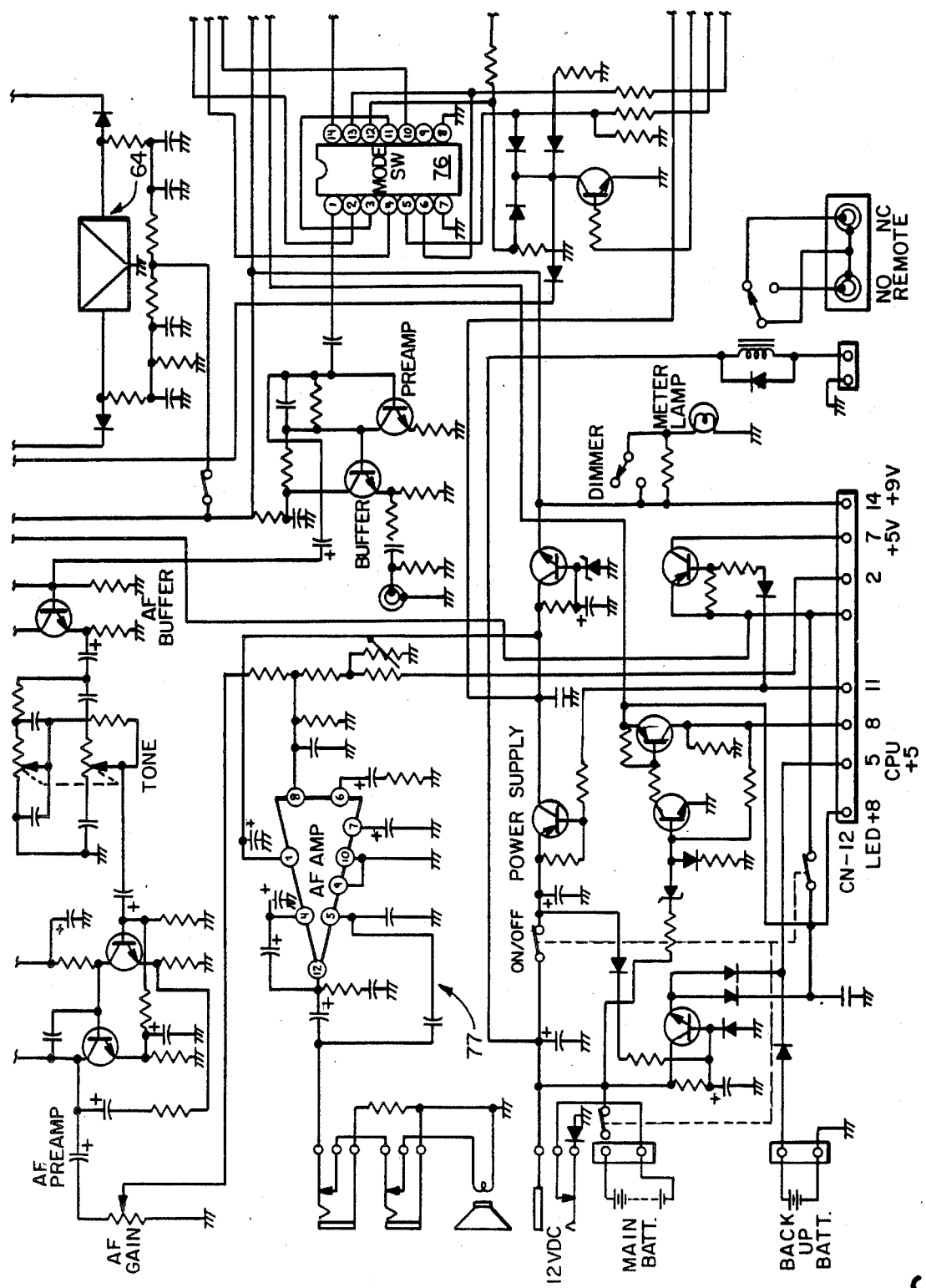
Figure 2D:
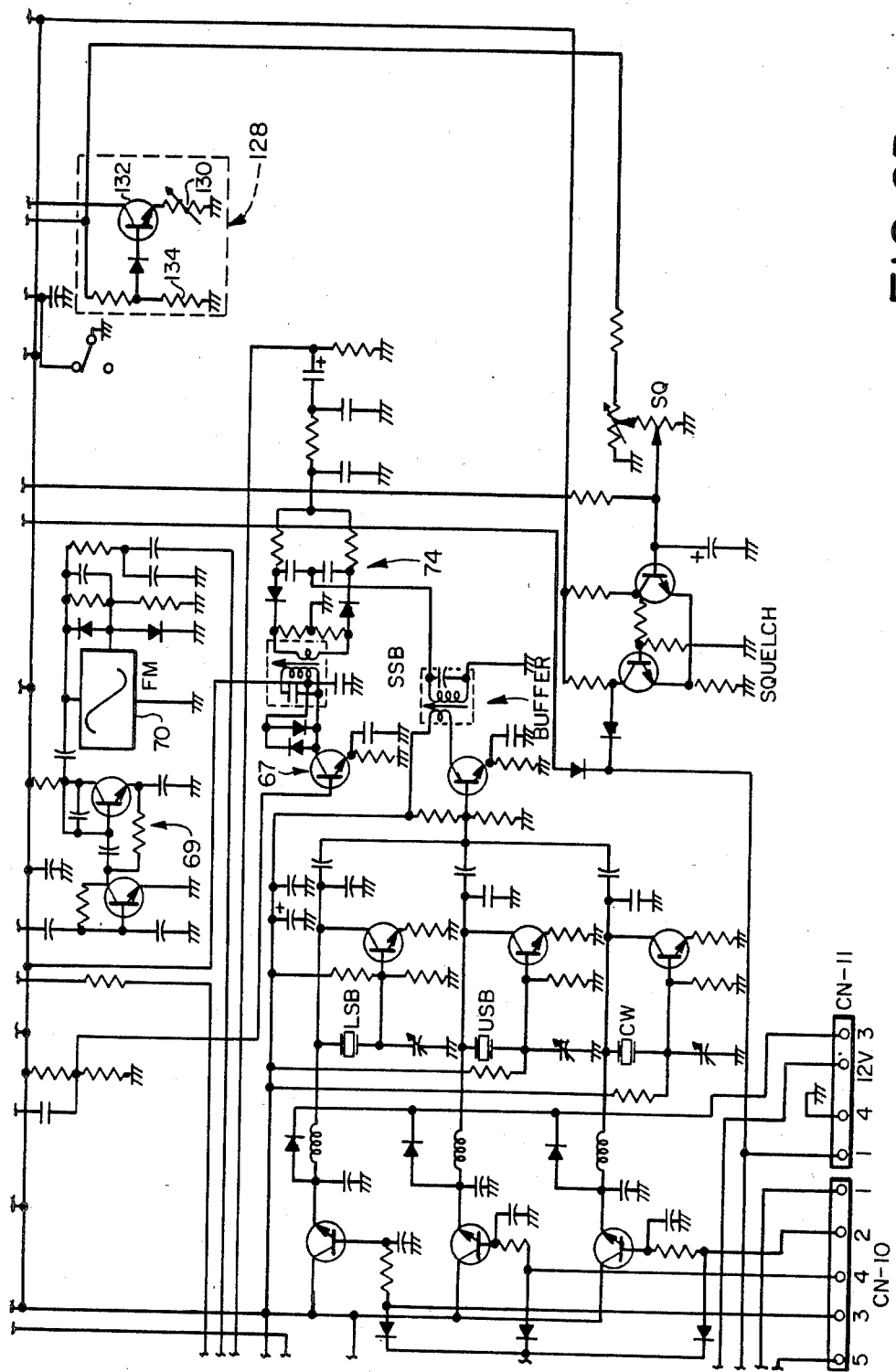
Figure 3A:
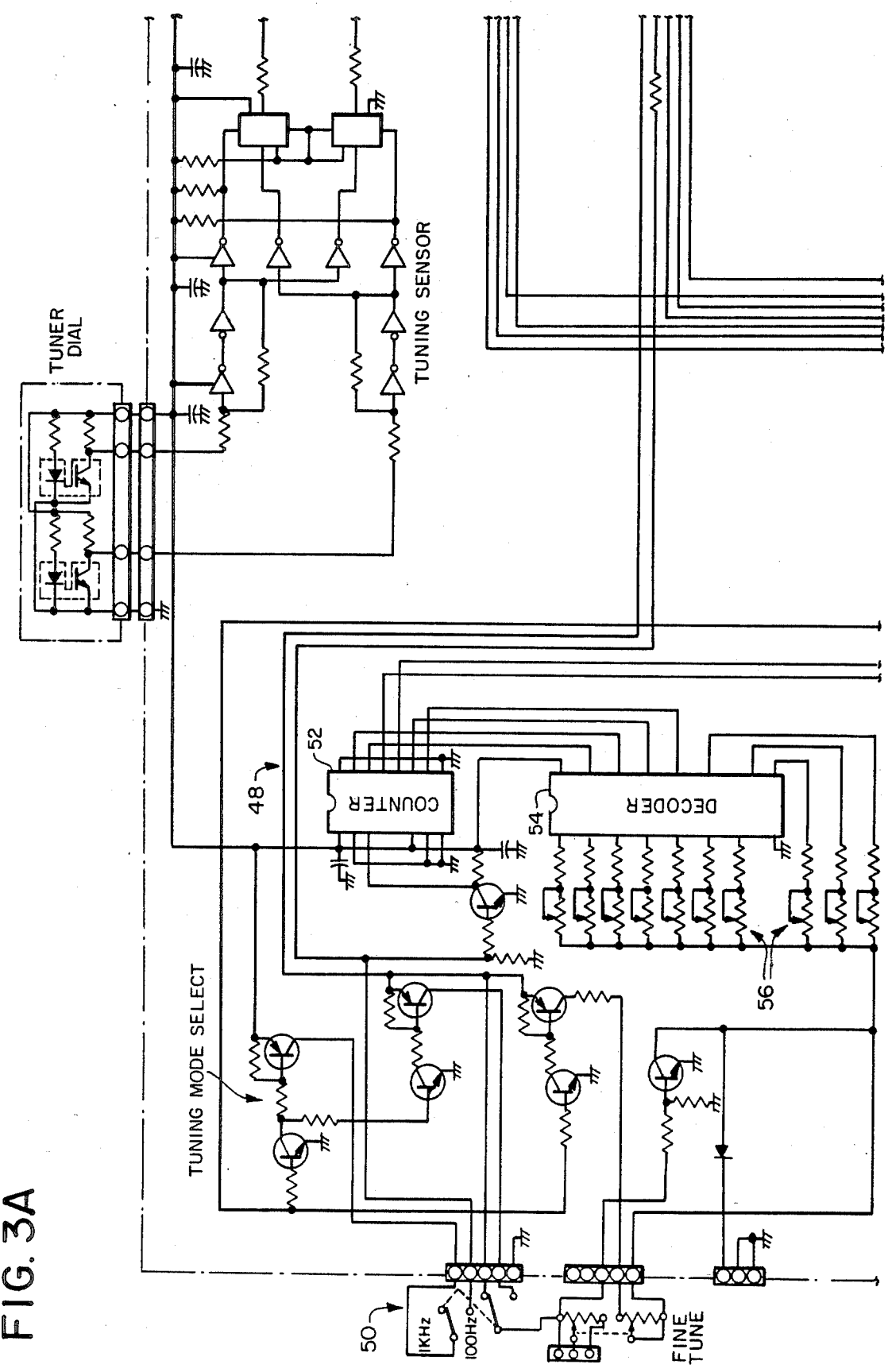
Figure 3B:
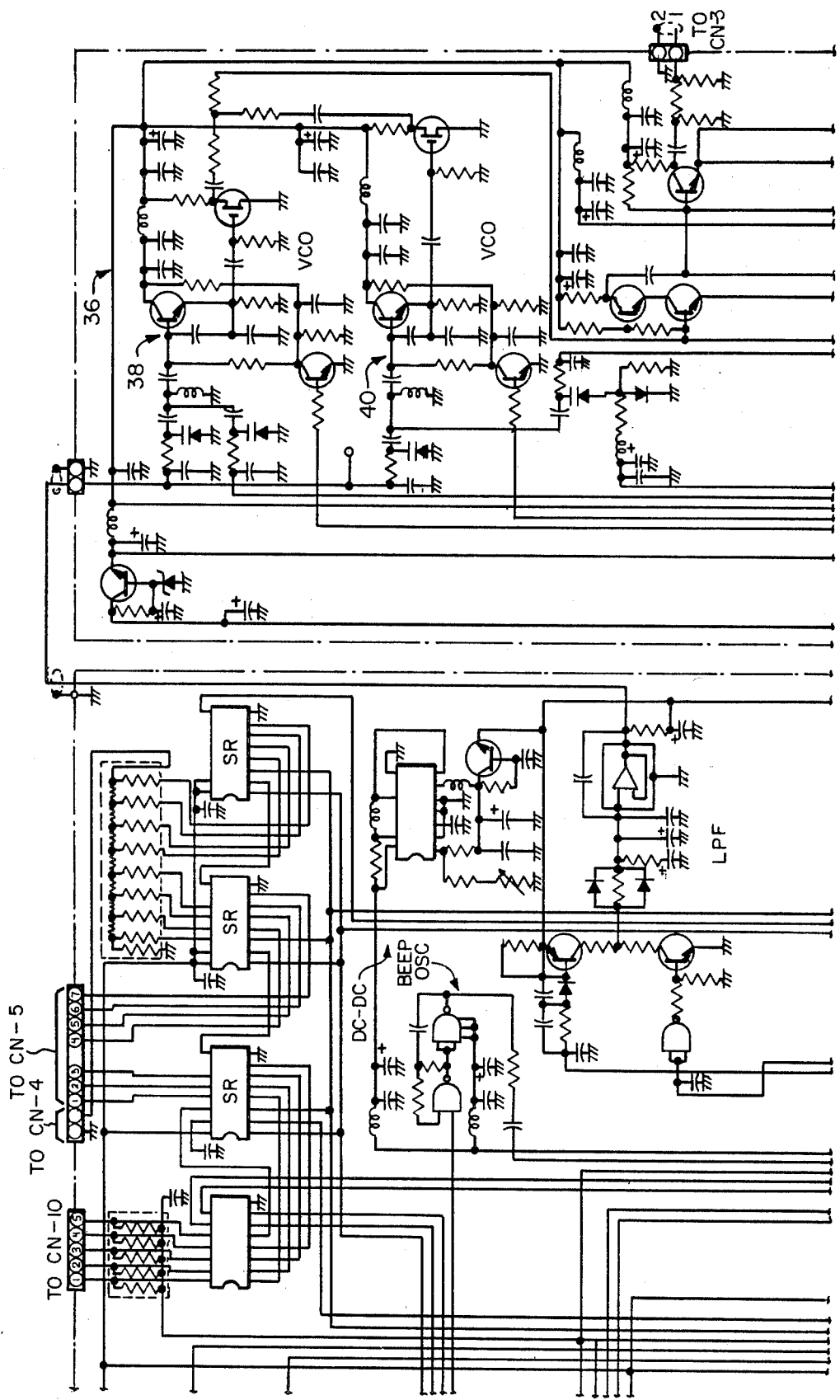
Figure 3C:
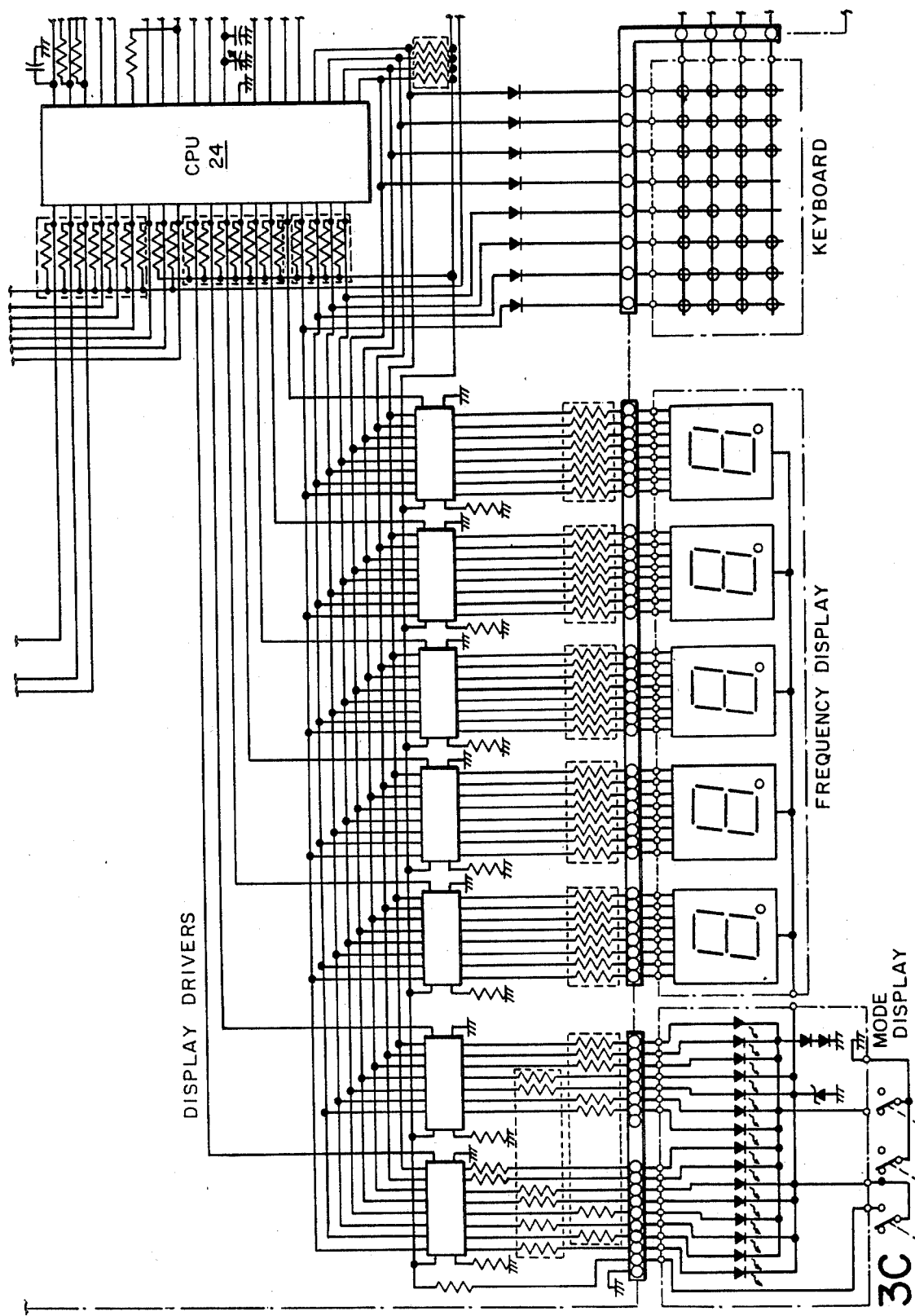
Figure 5:
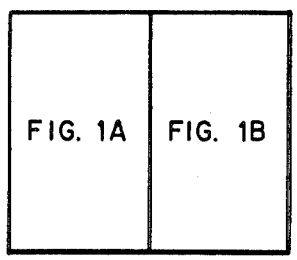
FIGS. 5, 6 and 7 illustrate respectively the manner in which the sheets of drawings bearing FIGS. 1A and 1B, FIGS. 2A, 2B, 2C and 2D, and FIGS. 3A, 3B, 3C and 3D may be respectively arranged to view the respective circuits thereof.
Figure 6:
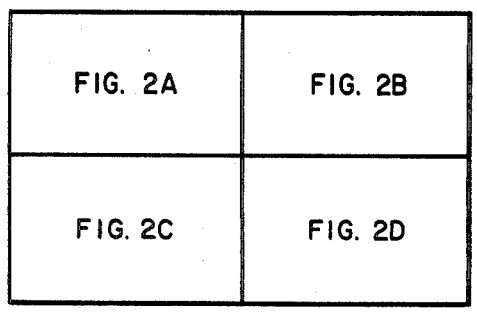
Figure 7:
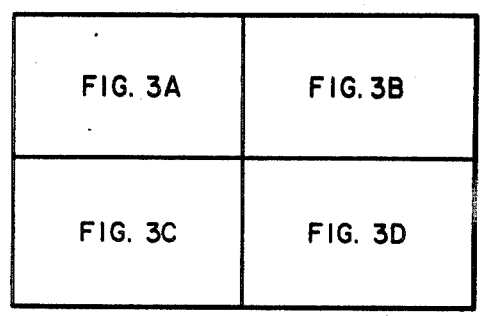

Referring still to FIGS. 2A and 2B, further details of the noise blanking system and related circuits will be described. The noise blanking or tuning amplifier 81 will be seen to comprise a transistorized amplifier circuit including an FET 90, a matched pair of transistors 92 and a tuning coil 94. The diode detector circuit 82 immediately follows tuning coil 94 and comprises diodes 82a and 82b. A further transistor 96 comprises an automatic gain control (AGC) feedback means while the demodulated signal is DC amplified by a further pair of transistors 98, 100. Diodes 102, 104 and 106 comprise a limiter circuit interposed between the demodulating means or circuit 82 and the multivibrator means or circuit 84. Coupling means comprising an additional or second switching means comprising a switching transistor 108 is interposed between the output of the multivibrator 84 and control input 78 of the noise blanking switching circuit 62.

Additionally, pulse width control means are provided for controlling the width of the blanking pulses produced by the multivibrator 84. The pulse width control means includes a selector or switch 110 for selecting either a first or a second predetermined pulse width by selecting resistive and capacitive elements for controlling the RC time constant of the multivibrator 84. This selection of the pulse width of the pulse signal from multivibrator 84 prevents passage through the blanking switching circuit 62 of noise signals of durations less than or equal to the selected pulse width. In the illustrated embodiment, two such pulse widths are provided, of on the order of substantially 20 milliseconds and 100 milliseconds, respectively. However, it will be ecognized that more or other pulse widths may be selected without departing from the invention. In the illustrated embodiment, the faster or 20 millisecond pulse width is particularly advantageous in eliminating impulse-type noises from uch sources as motors, fluorescent lamps and the like. Similarly the relatively slower or 100 millisecond pulse width is particularly useful in eliminating noise pulses from over-the-horizon radar, also known in the art as "the woodpecker".

In the illustrated embodiment, the predetermined noise signals to be eliminated comprise impulse or pulse-type noise signals. Accordingly, the tuning means or circuit 81 is operative for tuning carrier signals having such impulse noise signals superimposed thereon. Similarly, the demodulating means or circuit 82 operates to demodulate or detect these impulse noise signals to form noise pulses. The multivibrator acts as a one-shot multivibrator for responding to these noise pulses to produce a blanking pulse of a controllable, selected width in response to each such noise pulse. Hence, the second switching means or switching transistor 108 comprises coupling means for coupling these blanking pulses to the control input 78 of the noise blanking switching means or circuit 62. Advantageously, then, the noise impulses may be substantially eliminated from the signal path prior to discrimination or detection of the audio signal, by the novel noise blanking system just described.

In accordance with a further or third aspect of the invention a signal strength meter linearity control system is also provided As will be seen presently, this system advantageously extends the range of linear response of the signal strength meter 120. In this regard, in many receivers a signal strength meter such as meter 120 is provided to aid in achieving optimum tuning of the receiver to a desired signal by observing the meter indication of the strength of the signal being received.

To this end, such signal strength meters are often coupled to an automatic gain control (AGC) circuit (such as circuit 122) of the receiver for response to an automatic gain control signal. However, this automatic gain control signal is not linearly related to the signal strength, but rather varies over a rather limited or compressed range relative to the signal strength. The AGC circuit, as is well known in the art, is provided to generally increase the signal strength of relatively weak signals so as to generally compress the overall range of signal strengths, thereby compensating for differences in received signal strength between various channels at the audio output. This in turn obviates the need to frequently readjust the volume of the audio output. However, the effect of this AGC circuit on the signal strength meter is to provide a fairly limited range of linear response of the meter, thereby limiting its usefulness to the operator. That is, the meter tends to reach full scale or saturation very rapidly when driven by the AGC signal.

Figure 4:
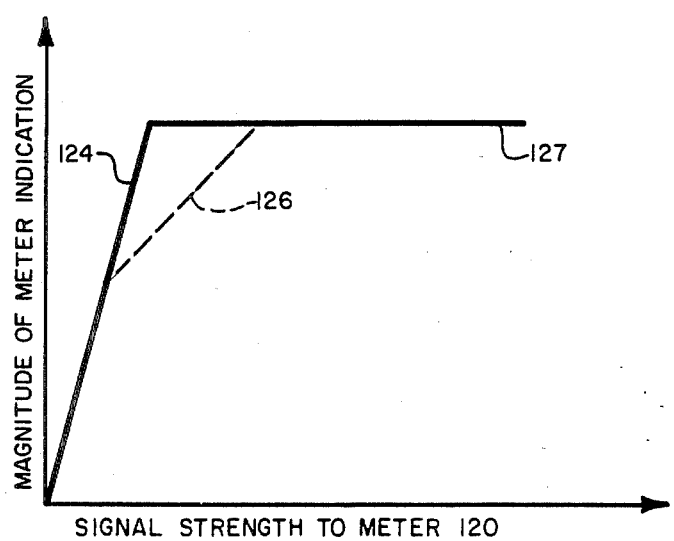
FIG. 4 is a graphic representation of waveforms associated with the signal strength meter linearizing system of the invention.

Advantageously, the signal strength meter linearity control system of the invention greatly extends this linear range of response of the meter 120. Reference is also invited to FIG. 4 wherein a graphical illustration shows the normal linear range of the signal strength meter in response to the normal output signals of the AGC circuit 122. This normal linear range is indicated generally at reference numeral 124, with saturation being indicated by reference numeral 127. The extended linear response provided by the linearity control system of the invention is designated generally at reference numeral 126.

In this regard, and referring again to FIG. 2, the linearity control system of the invention is designated generally by reference numeral 128. This system 128 comprises current controlling circuit means in the form of a variable resistor 130 and a switching transistor 132 coupled to the signal strength meter 120 and responsive to a predetermined current control signal for controlling the current flow through the signal strength meter in a predetermined fashion to increase the linear range of response thereof. The system further includes signalling circuit means, here comprising a lambda-shaped negative resistance element 134 which is coupled with the AGC circuit and with the current controlling circuit at transistor 132 and is responsive to the AGC signal for producing the current control signal in a predetermined systematic fashion.

In the illustrated embodiment the transistor 132 operates as switching means responsive to the output of the lambda-shaped negative resistance element 134 for respectively switching the variable resistor 130 into and out of series circuit with the signal strength meter 120. In this regard, the signal strength meter is coupled to receive the AGC signal through a variable resistor 136 at one end thereof and at its opposite side or terminal is coupled to a voltage divider compris.ing a pair of resistors 138, 140 coupled between a positive potential and circuit ground. The transistor 132 is coupled in circuit for alternatively switching the variable resistor 130 into and out of parallel circuit with the resistor 138.

Accordingly, when variable resistor 130 is switched into parallel circuit with resistor 138, the voltage at this side of meter 120 decreases, thereby bringing the meter away from the saturation region indicated by the line 127 in the graph of FIG. 4 and into the extended linear range indicated by dashed line 126. Transistor 132 comprises switching means including control input means, namely, its base electrode, which is responsive to the predetermined current control signal comprising the current through the lambda-shaped negative resistance device 134 for switching the resistor 130 into circuit in this fashion. In this regard, the current-carrying base and emitter electrodes of the transistor 132 will be seen to be coupled respectively in series circuit between the signal strength meter 120 and the variable resistor 130.

In the illustrated embodiment. the lambda-shaped negative resistance device comprises a device of the type generally designated MA522, available for example from Matsushita Electric Products. This device passes current therethrough with about three volts DC applied to the anode electrode thereof. In this regard, the illustrated embodiment preferably uses a device designated MA522P, which has a voltage-to-current characteristic such that current is passed when the voltage at the anode electrode is from substantially 2.5 to 3.3 volts DC. Other equivalent circuits or devices may of course be utilized without departing from the invention. The voltage-to-current characteristic of such a device is such as to pass current therethrough during but a portion of the output voltage range of the AGC circuit 122, to thereby extend the linear portion of the curve as indicated by curve 126 of FIG. 4.

In the illustrated embodiment the AGC output appears at the source electrode of an FET 150, and is substantially 4.3 volts DC in the absence of a received radio signal. As the level of the received radio signal becomes larger, the AGC level decreases. At about 3 volts at the anode thereof, the lambda-shaped negative resistance device 134 conducts current to switch on the transistor 132 and thereby place the variable resistor 130 in parallel circuit with fixed resistor 138. This decreases the voltage at the junction of resistor 138 with meter 120. It will be remembered that the AGC voltage decreases with increasing signal strength. Accordingly. decreasing the voltage at the opposite side of the signal strength meter, that is at its junction with resistor 138, will generally decrease the voltage applied across the signal strength meter as the AGC signal decreases with increasing received radio signal strength. This effectively decreases the sensitivity of the signal strength meter and provides the increased linear range 126 of FIG. 4.

Further reference to FIGS. 2A through 2D inclusive and 3A through 3D inclusive is invited for further details of the receiver.

While particular embodiments of the invention have been shown and described in detail, it will be obvious to those skilled in the art that changes and modifications of the present invention, in its various aspects, may be made without departing from the invention in its broader aspects, some of which changes and modifications being matters of routine engineering or design, and others being apparent only after study. As such, the scope of the invention should not be limited by the particular embodiment and specific construction described herein but should be defined by the appended claims and equivalents thereof. Accordingly, the aim in the appended claims is to cover all such changes and modifications as fall within the true spirit and scope of the invention.

In the illustrated embodiment, CPU or microcomputer 24 comprises a microcomputer of the type designated Toshiba TMP47C40P. An exemplary program for this microcomputer is reproduced on the following pages.

CP/M TLCS-47 ASSEMBLER V2.2

```
LOC  OBJ        LINE        SOURCE STATEMENT
                 1 ;
                 2 ;
                 3 ;*  COPYRIGHT 1983 GENERAL RESEARCH OF ELECTRONICS
                 4 ;
                 5 ;
ROM PAGE NO. 0

0000             6
                 7 ;************************************************************
                 8 ;*  NAME        RADIO RECEIVER
                 9 ;*  SYSTEM      TOSHIBA TMP47C40P
                10 ;************************************************************

ROM PAGE NO. 0

0000            11              ORG     000
0000 64C0       12              BS      START           ; A/C ON (INITIAL)
                13 ;
0002 61A1       14              BS      INT1            ; HOLD PROC.
                15 ;
0004 61FB       16              BS      ISIO            ; SERIAL EMPTY
                17 ;
0006 8E         18              BSS     IOVF1           ; TIMER(1)
0007 00         19              NOP
0008 2B         20              RETI                    ; TIMER(2)
0009 00         21              NOP
000A 2B         22              RETI                    ; I-TIMER
000B 00         23              NOP
000C 61C4       24              BS      INT2            ; P/W OFF
                25 ;
                26 ;
                27 ;************************************************************
                28 ;*
                29 ;*  7-3)        TIMER(1) INTERRUPT ROUTINE
                30 ;*
                31 ;************************************************************
000E 3F02       32 IOVF1:   ST      A,02            ; REGISTOR HOUSEKEEP
0010 2900       33          XCH     HL,00
0012 28FC       34          LD      HL,H'FC         ; D.C SAVE
0014 29D8       35          XCH     HL,H'08
0016 CF         36          LD      H,#H'F          ; TIMER(1) INITIALIZE
0017 E4         37          LD      L,#H'4
0018 3848       38          ADD     @HL,#H'8
001A E5         39          LD      L,#H'5
001B FF         40          ST      #H'F,@HL+
001C FF         41          ST      #H'F,@HL+
001D 49         42          LD      A,#H'9          ; "EIR" OFF
001E 13         43          XCH     A,EIR
001F 367F       44          EICLR   IL,H'3F         ; "EIF" ON
0021 E6         45          LD      L,#H'6
0022 C7         46          LD      H,#H'7          ; 3-MS TIMER COUNT
0023 0A         47          INC     @HL
                48 ;
                49 ;
                50 ;  7-3)-(1)    CLOCK COUNT
                51 ;
0024 C2         52          LD      H,#H'2
0025 0A         53          INC     @HL             ; 10-MS CLOCK COUNT
0026 44         54          LD      A,#4            ; 10-MS ?
0027 16         55          CMPR    A,@HL
```

```
0028 04         56          TESTP   CF
0029 608D       57          BS      TR30
002B 384B       58          ADD     @HL,#H'8        ; 10-MS CLOCK <--- 0
                59  ;
002D C3         60          LD      H,#H'3          ; 100MS CLOCK COUNT
002E 0A         61          INC     @HL
002F 4A         62          LD      A,#10           ; 100MS ?
0030 16         63          CMPR    A,@HL
0031 6063       64          BS      TR20
0033 3870       65          AND     @HL,#H'0        ; 100MS CLOCK <--- 0
0035 C2         66          LD      H,#H'2          ; 100MS CLOCK HOSEI
0036 0A         67          INC     @HL
0037 C4         68          LD      H,#H'4          ; 1-SEC CLOCK COUNT
0038 0A         69          INC     @HL
                70  ;
0039 3C0E       71          LD      A,H'0E
003B 383E       72          AND     A,#H'E
003D 6040       73          BS      TR10            ; FREQ. DISPLAY ?
003F 9A         74          BSS     TR16
                75  ;

ROM PAGE NO. 1

0040 39FE       76  TR10:   TESTP   H'E,3           ; ERROR DISPLAY ?
0042 9A         77          BSS     TR16
0043 39EE       78          TESTP   H'E,2           ; CLOCK(1) DISPLAY ?
0045 89         79          BSS     TR12
0046 39AC       80          TEST    H'C,2           ; CLOCK(2) INPUT ?
0048 9A         81          BSS     TR16
0049 0C         82  TR12:   LD      A,@HL
004A D5         83          CMPR    A,#5            ; 1-SEC CLOCK = 5 ?
004B 94         84          BSS     TR14            ;-NO-
004C 3CC0       85          LD      A,H'C0
004E D0         86          CMPR    A,#0            ; KETASU = 0 ?
004F A3         87          BSS     TR20            ;-NO-
0050 4F         88          LD      A,#H'F          ; DISPLAY OFF
0051 3FC3       89          ST      A,H'C3
0053 A3         90          BSS     TR20
                91  ;
0054 DA         92  TR14:   CMPR    A,#10           ; 1-SEC CLOCK = 10 ?
0055 A3         93          BSS     TR20            ;-NO-
0056 4A         94          LD      A,#H'A          ; DISPLAY ON
0057 3FC3       95          ST      A,H'C3
0059 9D         96          BSS     TR18
                97  ;
005A 0C         98  TR16:   LD      A,@HL
005B DA         99          CMPR    A,#10           ; 1-SEC CLOCK = 10 ?
005C A3        100          BSS     TR20            ;-NO-
005D C2        101  TR18:   LD      H,#H'2          ; 1-SEC CLOCK HOSEI
005E 0A        102          INC     @HL
005F CF        103          LD      H,#H'F
0060 E4        104          LD      L,#H'4
0061 3844      105          ADD     @HL,#4
               106  ;
               107  ;
               108  ;   7-3)-(2)    TIMER COUNT
               109  ;
0063 C6        110  TR20:   LD      H,#H'6
0064 3936      111          TEST    6,0             ; 50-MS TIMER REQUEST ?
0066 B1        112          BSS     TR21
0067 E6        113          LD      L,#H'6
0068 0A        114          INC     @HL             ; 50-MS TIMER COUNT
0069 45        115          LD      A,#5            ; 50-MS ?
006A 16        116          CMPR    A,@HL
006B B1        117          BSS     TR21
006C 3946      118          CLR     6,0             ; 50-MS REQUEST FLAG OF
006E 3865      119          CLR     %05,2           ; "PEEP" OFF
```

```
0070 BB        120         BSS    TR22           ;==DUMMY==
               121 ;
0071 3996      122 TR21:   TEST   6,1            ; 100MS TIMER REQUEST ?
0073 BB        123         BSS    TR22
0074 E7        124         LD     L,#H'7         ; 100MS TIMER COUNT
0075 0A        125         INC    @HL
0076 4A        126         LD     A,#10          ; 100MS ?
0077 16        127         CMPR   A,@HL
0078 BB        128         BSS    TR22
0079 3917      129         SET    7,1            ; 100MS PASS FLAG ON
               130 ;
007B E8        131 TR22:   LD     L,#H'8         ; 300MS TIMER COUNT
007C 0A        132         INC    @HL
007D 6081      133         BS     TR23
007F E9        134         LD     L,#H'9

ROM PAGE NO. 2

0080 0A        135         INC    @HL
0081 E9        136 TR23:   LD     L,#H'9
0082 41        137         LD     A,#1           ; 300MS ?
0083 16        138         CMPR   A,@HL
0084 8D        139         BSS    TR30
0085 E8        140         LD     L,#H'8
0086 4E        141         LD     A,#14
0087 16        142         CMPR   A,@HL
0088 8D        143         BSS    TR30
0089 3927      144         SET    7,2            ; 300MS PASS FLAG ON
008B F0        145         ST     #0,@HL+
008C F0        146         ST     #0,@HL+
               147 ;
008D C1        148 TR30:   LD     H,#H'1         ; 8-TIMER COUNT
008E E6        149         LD     L,#H'6
008F 0A        150         INC    @HL
0090 0C        151         LD     A,@HL          ; 8-TIMER = 8 ?
0091 D8        152         CMPR   A,#8
0092 94        153         BSS    TR31
0093 B4        154         BSS    TR40
0094 CF        155 TR31:   LD     H,#H'F         ; D.C. <--- PORT ADDRE
0095 EC        156         LD     L,#H'C
0096 1A        157         ST     A,@HL+
0097 F6        158         ST     #6,@HL+
0098 D5        159         CMPR   A,#5           ; 8-TIMER = 6,7 ?
0099 06        160         TEST   CF
009A A5        161         BSS    TR32
               162 ;
009B CC        163         LD     H,#H'C         ; PLA DISPLAY
009C 31        164         XCH    A,L
009D 12        165         OUTB   @HL
009E 11        166         MOV    L,A            ; "." DISPLAY
009F 3EC6      167         CMPR   A,H'C6
00A1 AC        168         BSS    TR33
00A2 3B32      169         SET    %02,3
00A4 AC        170         BSS    TR33
               171 ;
00A5 30        172 TR32:   XCH    A,H            ; LED DISPLAY
00A6 EF        173         LD     L,#H'F
00A7 3AE1      174         OUT    @HL,%01
00A9 19        175         DEC    L
00AA 3AE2      176         OUT    @HL,%02
00AC 33        177 TR33:   LDL    A,@DC          ; SEGMENT OUTPUT
00AD 3AA6      178         OUT    A,%06
00AF 32        179         LDH    A,@DC+
00B0 3AA7      180         OUT    A,%07
00B2 6109      181         BS     TR50
               182 ;
               183 ;
```

```
                       184 ;   7-3)-(4)      KEY INPUT
                       185 ;
00B4  40               186 TR40:    LD      A,#0        ; 8-TIMER 0-CLEAR
00B5  0F               187          ST      A,@HL
00B6  C7               188          LD      H,#H'7
00B7  E8               189          LD      L,#H'8
00B8  39D8             190          TESTP   H'3,1       ; KEY-IN REQUEST : OFF
00BA  8D               191          BSS     TR402
00BB  6109             192          BS      TR50
                       193 ;
00BD  39D9             194 TR402:   TESTP   H'9,1       ; IN-FLAG : ON ?
00BF  A3               195          BSS     TR44

ROM PAGE NO. 3

00C0  48               196          LD      A,#8        ; KEY OFF CHECK
00C1  16               197          CMPR    A,@HL
00C2  84               198          BSS     TR405
00C3  8D               199          BSS     TR41
00C4  04               200 TR405:   TESTP   CF
00C5  12               201          OUTB    @HL
00C6  00               202          NOP
00C7  00               203          NOP
00C8  00               204          NOP
00C9  00               205          NOP
00CA  3A20             206          IN      %00,A
00CC  B8               207          BSS     TR46
00CD  3949             208 TR41:    CLR     H'9,0       ; L/I-FLAG RESET
00CF  40               209          LD      A,#0        ; PORT NO. <--- 0
00D0  0F               210          ST      A,@HL
                       211 ;
00D1  04               212 TR42:    TESTP   CF          ; SEGMENT OUTPUT
00D2  12               213          OUTB    @HL
00D3  00               214          NOP
00D4  00               215          NOP
00D5  00               216          NOP
00D6  00               217          NOP
00D7  3A20             218          IN      %00,A       ; PORT (K0) INPUT
00D9  9E               219          BSS     TR43
00DA  0A               220          INC     @HL         ; PORT NO. COUNT
00DB  5B               221          TEST    @HL,3       ; PORT NO. =< 7 ?
00DC  91               222          BSS     TR42
00DD  B8               223          BSS     TR46
                       224 ;
00DE  19               225 TR43:    DEC     L           ; L/I VALUE <--- (IN)
00DF  0F               226          ST      A,@HL
00E0  3919             227          SET     H'9,1       ; IN-FLAG SET
00E2  B8               228          BSS     TR46
                       229 ;
00E3  04               230 TR44:    TESTP   CF          ; SEGMENT OUTPUT
00E4  12               231          OUTB    @HL
00E5  00               232          NOP
00E6  00               233          NOP
00E7  00               234          NOP
00E8  00               235          NOP
00E9  3A20             236          IN      %00,A       ; PORT (K0) INPUT
00EB  19               237          DEC     L           ; (L/I VALUE)&(IN)
00EC  1E               238          AND     A,@HL
00ED  BA               239          BSS     TR47        ; IN-VALUE NOT ZERO ?
                       240 ;
00EE  3939             241          TEST    H'9,0       ; L/I FLAG : OFF ?
00F0  B4               242          BSS     TR45
00F1  3949             243          CLR     H'9,0       ; L/I FLAG OFF
00F3  B3               244          BSS     TR46
                       245 ;
00F4  3928             246 TR45:    SET     H'8,2       ; N/I FLAG ON
00F6  3959             247          CLR     H'9,1       ; IN-FLAG OFF
```

```
00F3 6109      248 TR46:    BS      TR50
               249 ;
00FA 0F        250 TR47:    ST      A,@HL        ; SET IN-KEY
00FB 39C9      251         TESTP    H'9,0        ; L/I FLAG : ON ?
00FD 6102      252         BS       TR43
00FF 3909      253         SET      H'9,0        ; L/I FLAG ON

ROM PAGE NO. 4 *

0101 89        254         BSS      TR50
               255 ;
0102 39F8      256 TR48:   TESTP    H'3,3        ; F-IN FLAG : ON ?
0104 89        257         BSS      TR50
0105 3953      258         CLR      H'3,1        ; KEY-IN REQUEST OFF
0107 3908      259         SET      H'8,0        ; DECORD REQUEST ON
               260 ;
               261 ;
               262 ;  7-3)-(5)   MANUAL PROC.
               263 ;
0109 2ECF      264 TR50:   CMPR     H'F,#H'C     ; S-MODE : MANUAL ?
010B 6194      265         BS       TR90         ;-NO-
010D 3988      266         TEST     H'8,0        ; KEY DECORD ?
010F 92        267         BSS      TR502
0110 6194      268         BS       TR90
               269 ;
0112 38F8      270 TR502:  TESTP    %08,3        ; UP-DIAL : HIGH ?
0114 99        271         BSS      TR51
0115 395D      272         CLR      H'D,1        ; L-UP = OFF
0117 6150      273         BS       TR60
               274 ;
0119 390D      275 TR51:   TESTP    H'D,1        ; L-UP = ON ?
011B 6194      276         BS       TR90
011D 391D      277         SET      H'D,1        ; L-UP = ON
011F 4A        278         LD       A,#10
0120 39CC      279         TESTP    H'C,0        ; C-MODE : 1KHZ ?
0122 AE        280         BSS      TR55
0123 3854      281         CLR      %04,1        ; R41 = LOW
0125 3B14      282         SET      %04,1
0127 C9        283         LD       H,#H'9
0128 E6        284         LD       L,#H'6
0129 0A        285         INC      @HL          ; CTR = CTR + 1
012A 16        286         CMPR     A,@HL        ; CTR = 10 ?
012B 6194      287         BS       TR90         ;-NO-
012D F0        288         ST       #0,@HL+
012E 39FD      289 TR55:   TESTP    H'D,3        ; FREQ. = 30-MHZ ?
0130 6194      290         BS       TR90
               291 ;
0132 396D      292         CLR      H'D,2        ; RESET UNDER FLAG
0134 CC        293         LD       H,#H'C
0135 E1        294         LD       L,#H'1
0136 0A        295 TR56:   INC      @HL          ; CTR = CTR + 1
0137 B9        296         BSS      TR562        ; CTR : "F" ?
0138 BE        297         BSS      TR57
0139 16        298 TR562:  CMPR     A,@HL        ; CTR = 10 ?
013A 6146      299         BS       TR58         ;-NO-
013C F0        300         ST       #0,@HL+
013D 86        301         BSS      TR56
               302 ;
013E 0A        303 TR57:   INC      @HL
013F 3893      304         CMPR     L,#3         ; 4 KETA ?

ROM PAGE NO. 5 *

0141 6L        305         BSS      TR59         ;-NO-
0142 44        306         LD       A,#4         ; POINT SET
0143 3FC6      307         ST       A,H'C6
0145 3E        308         BSS      TR59
```

```
                    309 ;
0146  3894          310 TR58:    CMPR    L,#4             ; 5 KETA ?
0148  8E            311          BSS     TR59
0149  43            312          LD      A,#3
014A  16            313          CMPR    A,aHL            ; 30-MHZ ?
014B  8E            314          BSS     TR59
014C  393D          315          SET     H'D,3            ; OVER-FLAG SET
014E  6194          316 TR59:    BS      TR90
                    317 ;
0150  38D3          318 TR60:    TESTP   %08,1            ; DOWN-DIAL : HIGH ?
0152  96            319          BSS     TR61
0153  394D          320          CLR     H'D,0            ; L-DOWN = OFF
0155  B3            321          BSS     TR665
                    322 ;
0156  39CD          323 TR61:    TESTP   H'D,0            ; L-DOWN : ON ?
0158  83            324          BSS     TR665
0159  390D          325          SET     H'D,0            ; L-DOWN = ON
015B  39CC          326          TESTP   H'C,0            ; 1/1 MODE ?
015D  A7            327          BSS     TR65
015E  3864          328          CLR     %04,2            ; R42 LOW
0160  3824          329          SET     %04,2
0162  C9            330          LD      H,#H'9
0163  E6            331          LD      L,#H'6
0164  0B            332          DEC     aHL              ; CTR = CTR - 1
0165  83            333          BSS     TR665
0166  F9            334          ST      #9,aHL+
0167  39ED          335 TR65:    TESTP   H'D,2            ; FREQ. = 10-KHZ ?
0169  83            336          BSS     TR665
016A  397D          337          CLR     H'D,3            ; RESET OVER FLAG
016C  CC            338          LD      H,#H'C
016D  E1            339          LD      L,#H'1
016E  384F          340 TR66:    ADD     aHL,#H'F         ; FREQ. = FREQ. - 1
0170  B5            341          BSS     TR67             ; MINUS
0171  0E            342          TESTP   ZF
0172  87            343          BSS     TR68
0173  6194          344 TR665:   BS      TR90
                    345 ;
0175  F9            346 TR67:    ST      #9,aHL+
0176  AE            347          BSS     TR66
                    348 ;
0177  18            349 TR68:    INC     L
0178  3896          350          CMPR    L,#6
017A  0E            351          TESTP   ZF
017B  6180          352          BS      TR685
017D  4F            353          LD      A,#H'F
017E  16            354          CMPR    A,aHL
017F  94            355          BSS     TR90

ROM PAGE NO. 6

0180  19            356 TR685:   DEC     L
0181  4F            357          LD      A,#H'F           ; ZERO SUPPRESS
0182  0F            358          ST      A,aHL
0183  3894          359          CMPR    L,#4             ; 4 KETA ?
0185  0E            360          TESTP   ZF
0186  88            361          BSS     TR69
0187  88            362          BSS     TR695
0188  40            363 TR69:    LD      A,#0             ; POINT CLEAR
0189  3FC6          364          ST      A,H'C6
018B  3CC2          365 TR695:   LD      A,H'C2           ; 10 MIMAN ?
018D  DF            366          CMPR    A,#H'F
018E  94            367          BSS     TR90             ;-NO-
018F  E1            368          LD      L,#H'1
0190  F0            369          ST      #0,aHL+          ; 10 KHZ SET
0191  F1            370          ST      #1,aHL+
0192  392D          371          SET     H'D,2            ; UNDER FLAG SET
                    372 ;
```

```
0194 36BF     373 TR90:   DICLR   IL,H'3F      ; "EIF" OFF
0196 4D       374         LD      A,#H'D       ; "EIR" ON
0197 13       375         XCH     A,EIR
0198 28D3     376         LD      HL,H'D3      ; D.C RECOVERY
019A 29FC     377         XCH     HL,H'FC
019C 3C02     378         LD      A,02         ; REGISTOR RECOVERY
019E 2900     379         XCH     HL,00
01A0 2B       380         RETI
              381 ;
              382 ;*********************************************************
              383 ;*                                                       *
              384 ;* 7-0)            HOLD PROC. ROUTINE                    *
              385 ;*                                                       *
              386 ;*********************************************************
01A1 2C01     387 INT1:   OUT     #0,%01       ; PORT(P1) RESET
01A3 2C02     388         OUT     #0,%02       ; PORT(P2) RESET
01A5 2C06     389         OUT     #0,%06       ; PORT(R6) RESET
01A7 2C07     390         OUT     #0,%07       ; PORT(R7) RESET
01A9 2C04     391         OUT     #0,%04       ; PORT(R4) RESET
01AB 3878     392         CLR     %08,3        ; PORT(R8) RESET
01AD 3858     393         CLR     %08,1
01AF 42       394         LD      A,#2         ; "ISIO" OFF
01B0 3A8F     395         OUT     A,%H'1F
01B2 3BFE     396 INT12:  TESTP   %H'0E,3      ; "ISIO" BUSY ?
01B4 B2       397         BSS     INT12
01B5 3869     398         CLR     %09,2        ; PORT(R9) RESET
01B7 3859     399         CLR     %09,1
01B9 2C05     400         OUT     #0,%05       ; PORT(R5) RESET
01BB 3979     401         CLR     H'9,3        ; "ISIO" OFF
01BD 40       402         LD      A,#H'0       ; OUT-CTR <--- 0
01BE 3FA6     403         ST      A,H'A6

ROM PAGE NO. 7

01C0 393C     404         SET     H'C,3        ; POWER OFF FLAG ON
01C2 64EB     405         BS      HOLD
              406 ;
              407 ;
              408 ;*********************************************************
              409 ;*                                                       *
              410 ;* 7-1)           POWER OFF PROC. ROUTINE                *
              411 ;*                                                       *
              412 ;*********************************************************
01C4 3FFA     413 INT2:   ST      A,H'FA       ; REGISTOR HOUSEKEEP
01C6 29F8     414         XCH     HL,H'F8
01C8 2C04     415         OUT     #0,%04       ; PORT(R4) RESET
01CA 3878     416         CLR     %08,3        ; PORT(R8) RESET
01CC 3858     417         CLR     %08,1
01CE 42       418         LD      A,#2         ; "ISIO" RESET
01CF 3A8F     419         OUT     A,%H'1F
01D1 3BFE     420 INT22:  TESTP   %H'0E,3      ; "ISIO" BUSY ?
01D3 91       421         BSS     INT22
01D4 3869     422         CLR     %09,2        ; PORT(R9) RESET
01D6 3859     423         CLR     %09,1
01D8 2C05     424         OUT     #0,%05       ; PORT(R5) RESET
01DA 3979     425         CLR     H'9,3        ; "ISIO" OFF
01DC 40       426         LD      A,#H'0       ; OUT-CTR <--- 0
01DD 3FA6     427         ST      A,H'A6
01DF 397F     428         CLR     H'F,3        ; S-MODE <--- POWER OF
01E1 393C     429         SET     H'C,3        ; POWER OFF FLAG ON
01E3 3CFA     430         LD      A,H'FA       ; REGISTOR RECOVERY
01E5 29F8     431         XCH     HL,H'F8
01E7 2B       432         RETI
              433 ;
              434 ;-------BUZZER ON(50-MS)-------
01E8 3B85     435 PEEP:   TEST    %05,3        ; SUPPLY OFF ?
01EA B2       436         BSS     PE1
```

```
01EB 3625       437          SET    %5,2           ; PEEP HIGH
01ED 40         438          LD     A,#0           ; 50-MS TIMER SET
01EE 3F66       439          ST     A,H'66
01F0 3906       440          SET    H'6,0
01F2 2A         441 PE1:     RET
                442 ;
                443 ;-------TIMER WAIT-------
01F3 40         444 WAITRT:  LD     A,#0           ; WAIT RTN
01F4 3F76       445          ST     A,H'76
01F6 3E76       446 WAIT1:   CMPR   A,H'76
01F8 BA         447          BSS    WAIT2
01F9 B6         448          BSS    WAIT1
01FA 2A         449 WAIT2:   RET
                450 ;
                451 ;*****************************************************
                452 ;*
                453 ;* 7-2)        SERIAL OUTPUT ROUTINE
                454 ;*
                455 ;*****************************************************
01FB 3FFA       456 ISIO:    ST     A,H'FA         ; REGISTOR HOUSEKEEP
01FD 29F8       457          XCH    HL,H'F8
01FF 38B9       458          TEST   H'9,3          ; ISIO OFF ?

ROM PAGE NO. 8 *

0201 A2         459          BSS    ISIO9
                460 ;
0202 3CA6       461          LD     A,H'A6
0204 D0         462          CMPR   A,#0           ; CTR : 0 ?
0205 91         463          BSS    ISIO2          ;-NO-
0206 42         464          LD     A,#2           ; P(1F) = END CMMND
0207 3A8F       465          OUT    A,%H'1F
0209 38FE       466 ISIO1:   TESTP  %H'0E,3        ; ISIO BUSY ?
020B 89         467          BSS    ISIO1
020C 3806       468          SET    %06,0          ; SEND END-MARK
020E 3979       469          CLR    H'9,3          ; ISIO OFF
0210 A2         470          BSS    ISIO9
                471 ;
0211 D6         472 ISIO2:   CMPR   A,#6           ; CTR : 6 ?
0212 98         473          BSS    ISIO3          ;-NO-
0213 3CA7       474          LD     A,H'A7
0215 3AAF       475          OUT    A,%H'0F        ; P(0F) = LAST DATA
0217 40         476          LD     A,#0
0218 3FA6       477          ST     A,H'A6         ; CTR = 0
021A A2         478          BSS    ISIO9
                479 ;
021B 09         480 ISIO3:   DEC    A              ; CTR = CTR - 1
021C 3FA6       481          ST     A,H'A6
021E CB         482          LD     H,#H'B
021F 31         483          XCH    A,L            ; P(0F) = NEXT DATA
0220 3AEF       484          OUT    @HL,%H'0F
0222 3CFA       485 ISIO9:   LD     A,H'FA         ; REGISTOR RECOVERY
0224 29F8       486          XCH    HL,H'F8
0226 28         487          RETI
                488 ;
                489 ;-------SHIFT RIGHT-------
0227 3F0A       490 RSHIFT:  ST     A,H'0A
0229 40         491          LD     A,#0
022A 0D         492 RSFT1:   XCH    A,@HL
022B 19         493          DEC    L
022C 2FFA       494          ADD    H'A,#H'F
022E B0         495          BSS    RSFT2
022F AA         496          BSS    RSFT1
0230 2A         497 RSFT2:   RET
                498 ;
                499 ;-------SHIFT LEFT-------
0231 3F0A       500 LSHIFT:  ST     A,H'0A
```

```
0233 40         501            LD      A,#0
0234 0D         502 LSFT1:     XCH     A,@HL
0235 18         503            INC     L
0236 2FFA       504            ADD     H'A,#H'F
0238 BA         505            BSS     LSFT2
0239 84         506            BSS     LSFT1
023A 2A         507 LSFT2:     RET
                508 ;
                509 ;-------CLEAR   MEMORY-------
023B F0         510 MCLER:     ST      #0,@HL+              ; MEMORY CLEAR
023C 09         511            DEC     A
023D B8         512            BSS     MCLER
023E 2A         513            RET
                514 ;
                515 ;
023F 3F0A       516 LOAD:      ST      A,H'0A               ; WORK <--- M(H,L-LA)

ROM PAGE NO. 9 *
0241 296C       517            XCH     HL,H'6C
0243 CB         518            LD      H,#H'B
0244 E1         519            LD      L,#H'1
0245 296C       520 LOAD1:     XCH     HL,H'6C
0247 0C         521            LD      A,@HL
0248 18         522            INC     L
0249 296C       523            XCH     HL,H'6C
024B 1A         524            ST      A,@HL+
024C 2FFA       525            ADD     H'A,#H'F
024E 90         526            BSS     LOAD2
024F 85         527            BSS     LOAD1
0250 2A         528 LOAD2:     RET
                529 ;
                530 ;
0251 296C       531 STORE:     XCH     HL,H'6C              ; M(H,L-LA) <--- WORK
0253 CB         532            LD      H,#H'B
0254 E1         533            LD      L,#H'1
0255 3F0A       534 MOVE:      ST      A,H'0A               ; M(I) <--- M(X)
0257 0C         535 STORE1:    LD      A,@HL
0258 18         536            INC     L
0259 296C       537            XCH     HL,H'6C
025B 1A         538            ST      A,@HL+
025C 296C       539            XCH     HL,H'6C
025E 2FFA       540            ADD     H'A,#H'F
0260 A2         541            BSS     STORE2
0261 97         542            BSS     STORE1
0262 2A         543 STORE2:    RET
                544 ;
                545 ;
0263 C9         546 RREAD:     LD      H,#H'9               ; W2 <--- DATA TABLE
0264 EA         547            LD      L,#H'A
0265 33         548 RR1:       LDL     A,@DC
0266 1A         549            ST      A,@HL+
0267 32         550            LDH     A,@DC+
0268 1A         551            ST      A,@HL+
0269 A5         552            BSS     RR1
026A 2A         553            RET
                554 ;
                555 ;
026B 3F0A       556 MOVEL:     ST      A,H'0A               ; WORK(1) <--- LOAD
026D 296C       557            XCH     HL,H'6C
026F C8         558            LD      H,#H'8
0270 EB         559            LD      L,#H'8
0271 296C       560            XCH     HL,H'6C
0273 0C         561 MOVEL1:    LD      A,@HL
0274 18         562            INC     L
0275 296C       563            XCH     HL,H'6C
0277 1A         564            ST      A,@HL+
0278 296C       565            XCH     HL,H'6C
```

```
027A 2FFA    566            ADD     H'A,#H'F
027C BE      567            BSS     MOVEL2
027D B3      568            BSS     MOVEL1
             569 ;
027E 2A      570 MOVEL2:    RET
             571 ;
             572 ;
027F 3F0A    573 MOVES:     ST      A,H'0A         ; STORE <--- WORK(1)

ROM PAGE NO.10 *

0281 296C    574            XCH     HL,H'6C
0283 C8      575            LD      H,#H'8
0284 EB      576            LD      L,#H'B
0285 0C      577 MOVES1:    LD      A,@HL
0286 18      578            INC     L
0287 296C    579            XCH     HL,H'6C
0289 1A      580            ST      A,@HL+
028A 296C    581            XCH     HL,H'6C
028C 2FFA    582            ADD     H'A,#H'F
028E 90      583            BSS     MOVES2
028F 85      584            BSS     MOVES1
0290 2A      585 MOVES2:    RET
             586 ;
             587 ;
0291 CC      588 CLEAR:     LD      H,#H'C
0292 E0      589            LD      L,#H'0
0293 F0      590            ST      #0,@HL+
0294 FF      591 CLR1:      ST      #H'F,@HL+
0295 3895    592            CMPR    L,#5
0297 94      593            BSS     CLR1
0298 F0      594            ST      #0,@HL+
0299 2A      595            RET
             596 ;
             597 ;
029A C6      598 LEDMCL:    LD      H,#H'6         ; LED MODE CLEAR
029B EE      599            LD      L,#H'E
029C 3871    600            AND     @HL,#1
029E C7      601            LD      H,#H'7
029F 3873    602            AND     @HL,#3
02A1 2A      603            RET
             604 ;
             605 ;
02A2 3CB0    606 LEDMST:    LD      A,H'80         ; LED MODE CHENG
02A4 3828    607            OR      A,#H'8
02A6 C7      608            LD      H,#H'7
02A7 31      609            XCH     A,L
02A8 29FC    610            XCH     HL,H'FC
02AA C7      611            LD      H,#H'7
02AB EE      612            LD      L,#H'E
02AC 33      613            LDL     A,@DC
02AD 1D      614            OR      A,@HL
02AE 0F      615            ST      A,@HL
02AF C6      616            LD      H,#H'6
02B0 32      617            LDH     A,@DC+
02B1 1D      618            OR      A,@HL
02B2 0F      619            ST      A,@HL
02B3 2A      620            RET
             621 ;
             622 ;          DISPLAY <--- WORK
02B4 21F3    623 FDSPLY:    CALL    WAITRT
02B6 229A    624            CALL    LEDMCL         ; LED(JMODE) ON
02B8 22A2    625            CALL    LEDMST
02BA EF      626            LD      L,#H'F         ; LED(CLOCK) OFF
02BB C6      627            LD      H,#H'6
02BC 55      628            CLR     @HL,1
02BD 50      629            SET     @HL,0          ; LED(FREQ.) ON
```

```
02BE C7        630         LD      H,#H'7
02BF 55        631         CLR     @HL,1

ROM PAGE NO.11

02C0 CC        632         LD      H,#H'C
02C1 E1        633         LD      L,#H'1
02C2 44        634         LD      A,#4
02C3 2251      635         CALL    STORE
02C5 CC        636         LD      H,#H'C
02C6 E5        637         LD      L,#H'5
02C7 40        638 FD1:    LD      A,#0
02C8 16        639         CMPR    A,@HL
02C9 8F        640         BSS     FD2
02CA 4F        641         LD      A,#H'F
02CB 1B        642         ST      A,@HL-
02CC 11        643         MOV     L,A
02CD D1        644         CMPR    A,#1
02CE 87        645         BSS     FD1
02CF 3CC4      646 FD2:    LD      A,H'C4
02D1 DF        647         CMPR    A,#H'F
02D2 95        648         BSS     FD3
02D3 40        649         LD      A,#0
02D4 96        650         BSS     FD4
02D5 44        651 FD3:    LD      A,#4
02D6 3FC6      652 FD4:    ST      A,H'C6
02D8 2A        653         RET
               654 ;
               655 ;       DISPLAY <--- WORK
02D9 21F3      656 TDSPLY: CALL    WAITRT
02DB EF        657         LD      L,#H'F
02DC C7        658         LD      H,#H'7
02DD 39AE      659         TEST    H'E,2           ; CLOCK(1) ?
02DF A4        660         BSS     TDS10           ;-NO-
02E0 55        661         CLR     @HL,1
02E1 C6        662         LD      H,#H'6
02E2 51        663         SET     @HL,1
02E3 AA        664         BSS     TDS20
02E4 399E      665 TDS10:  TEST    H'E,1           ; CLOCK(2) ?
02E6 AA        666         BSS     TDS20
02E7 51        667         SET     @HL,1
02E8 C6        668         LD      H,#H'6
02E9 55        669         CLR     @HL,1
02EA 54        670 TDS20:  CLR     @HL,0
02EB CC        671         LD      H,#H'C
02EC E5        672         LD      L,#H'5
02ED 3CB4      673         LD      A,H'B4
02EF 2EEF      674         CMPR    H'F,#H'E        ; TIME MODE ?
02F1 0E        675         TESTP   ZF
02F2 B6        676         BSS     TDS25
02F3 39DC      677         TESTP   H'C,1           ; BLINK FLAG ON ?
02F5 B9        678         BSS     TDS30
02F6 D0        679 TDS25:  CMPR    A,#0            ; H.MM = 0.MM ?
02F7 B9        680         BSS     TDS30           ;-NO-
02F8 4F        681         LD      A,#H'F
02F9 1B        682 TDS30:  ST      A,@HL-
02FA 3CB3      683         LD      A,H'B3
02FC 1B        684         ST      A,@HL-
02FD 4A        685         LD      A,#H'A
02FE 1B        686         ST      A,@HL-
02FF 3CB2      687         LD      A,H'B2

ROM PAGE NO.12 *

0301 1B        688         ST      A,@HL-
0302 3CB1      689         LD      A,H'B1
0304 1B        690         ST      A,@HL-
```

```
0305 40        691           LD      A,#0
0306 3FC6      692           ST      A,H'C6
0308 2A        693           RET
               694 ;
               695 ;
               696 ;-------F.CONV  WORK <--- DISPLAY-------
0309 21F3      697 FCONV:    CALL    WAITRT
030B CC        698           LD      H,#H'C
030C E1        699           LD      L,#H'1
030D 44        700           LD      A,#4
030E 223F      701           CALL    LOAD
0310 CB        702           LD      H,#H'B
0311 E5        703           LD      L,#H'5
0312 4F        704 FCONV1:   LD      A,#H'F
0313 16        705           CMPR    A,@HL
0314 98        706           BSS     FCONV2
0315 40        707           LD      A,#0
0316 1B        708           ST      A,@HL-
0317 92        709           BSS     FCONV1
0318 3CC6      710 FCONV2:   LD      A,H'C6
031A D0        711           CMPR    A,#0
031B 9D        712           BSS     FCONV4
031C 2A        713           RET
031D D4        714 FCONV4:   CMPR    A,#4
031E A0        715           BSS     FCONV5
031F 2A        716           RET
0320 03        717 FCONV5:   INC     A
0321 3FC6      718           ST      A,H'C6
0323 CB        719           LD      H,#H'B
0324 E1        720           LD      L,#H'1
0325 44        721           LD      A,#4
0326 2231      722           CALL    LSHIFT
0328 98        723           BSS     FCONV2
               724 ;
               725 ;
               726 ;-------T.CONV  WORK <--- DISPLAY-------
0329 3CC1      727 TCONV:    LD      A,H'C1
032B CB        728           LD      H,#H'B
032C E1        729           LD      L,#H'1
032D 1A        730           ST      A,@HL+
032E 3CC2      731           LD      A,H'C2
0330 1A        732           ST      A,@HL+
0331 3CC4      733           LD      A,H'C4
0333 1A        734           ST      A,@HL+
0334 3CC5      735           LD      A,H'C5
0336 1A        736           ST      A,@HL+
0337 40        737           LD      A,#0
0338 1B        738           ST      A,@HL-
               739 ;
0339 0C        740 TCONV2:   LD      A,@HL                   ; "0" <--- "F"
033A DF        741           CMPR    A,#H'F
033B BF        742           BSS     TCONV9
033C 40        743           LD      A,#0
033D 1B        744           ST      A,@HL-
033E B9        745           BSS     TCONV2
               746 ;
033F 2A        747 TCONV9:   RET
               748 ;
               749 ;

ROM PAGE NO.13

0340 C8        750 WAVECH:   LD      H,#H'8                  ; F-BAND CHECK
0341 EB        751           LD      L,#H'B
0342 44        752           LD      A,#4
0343 2251      753           CALL    STORE
0345 C6        754 WAVEC2:   LD      H,#H'6
```

```
0346  E8         755              LD       L,#H'8
0347  29FC       756              XCH      HL,H'FC
0349  2263       757              CALL     RREAD
034B  44         758              LD       A,#4
034C  247E       759              CALL     COMP
034E  06         760              TEST     CF
034F  9C         761              BSS      W2
0350  C6         762              LD       H,#H'6
0351  EB         763              LD       L,#H'B
0352  29FC       764              XCH      HL,H'FC
0354  2263       765              CALL     RREAD
0356  44         766              LD       A,#4
0357  247E       767              CALL     COMP
0359  9D         768              BSS      W3
035A  41         769  W1:         LD       A,#1
035B  0E         770              TESTP    ZF
035C  2A         771  W2:         RET
035D  04         772  W3:         TESTP    CF
035E  9C         773              BSS      W2
035F  9A         774              BSS      W1
                 775  ;
                 776  ;
                 777  ;------TIME    CHECK------
0360  3CC0       778  TCHK:       LD       A,H'C0
0362  D2         779              CMPR     A,#2           ; KETASU = 3,4 ?
0363  04         780              TESTP    CF
0364  B2         781              BSS      TCHK1          ;-NO-
0365  3CB2       782              LD       A,H'B2
0367  D5         783              CMPR     A,#5           ; MM >= 6. ?
0368  06         784              TEST     CF
0369  B2         785              BSS      TCHK1
036A  3CB4       786              LD       A,H'B4
036C  D2         787              CMPR     A,#2           ; HH > 2. ?
036D  06         788              TEST     CF
036E  B2         789              BSS      TCHK1
036F  0E         790              TESTP    ZF             ; HH = 2. ?
0370  B3         791              BSS      TCHK2
0371  04         792              TESTP    CF
0372  2A         793  TCHK1:      RET
0373  3CB3       794  TCHK2:      LD       A,H'B3
0375  D3         795              CMPR     A,#3           ; HH > 24 ?
0376  06         796              TEST     CF
0377  2A         797              RET
                 798  ;
                 799  ;
0378  0A         800  TIMCNT:     INC      @HL            ; 1-M CLOCK COUNT
0379  4A         801              LD       A,#10          ; 1-M CLOCK = 10 ?
037A  16         802              CMPR     A,@HL
037B  63B5       803              BS       TC40
037D  40         804              LD       A,#0           ; 1-M CLOCK 0-CLEAR
037E  1A         805              ST       A,@HL+
037F  389C       806              CMPR     L,#H'C         ; COUNT : CLOCK(1) ?

ROM PAGE NO.14 *

0381  83         807              BSS      TC10           ;-YES-
0382  8A         808              BSS      TC12
                 809  ;
0383  29A8       810  TC10:       XCH      HL,H'A8
0385  C2         811              LD       H,#H'2         ; 10M CLOCK HOSEI
0386  E6         812              LD       L,#H'6
0387  0A         813              INC      @HL
0388  29A8       814              XCH      HL,H'A8
                 815  ;
038A  0A         816  TC12:       INC      @HL            ; 10M CLOCK COUNT
038B  46         817              LD       A,#6           ; 10M CLOCK = 6 ?
038C  16         818              CMPR     A,@HL
```

```
038D  85        819          BSS    TC40
038E  40        820          LD     A,#0           ; 10H CLOCK 0-CLEAR
038F  1A        821          ST     A,aHL+
0390  339C      822          CMPR   L,#H'C         ; COUNT : CLOCK(1) ?
0392  94        823          BSS    TC20           ;-YES-
0393  A1        824          BSS    TC22
                825  ;
0394  29A8      826  TC20:   XCH    HL,H'A8
0396  C2        827          LD     H,#H'2         ; 1-H CLOCK HOSEI
0397  E6        828          LD     L,#H'6
0398  0A        829          INC    aHL
0399  21F3      830          CALL   WAITRT
039B  CF        831          LD     H,#H'F
039C  E4        832          LD     L,#H'4
039D  3844      833          ADD    aHL,#4
039F  29A8      834          XCH    HL,H'A8
                835  ;
03A1  0A        836  TC22:   INC    aHL            ; 1-H CLOCK COUNT
03A2  4A        837          LD     A,#10          ; 1-H CLOCK = 10 ?
03A3  16        838          CMPR   A,aHL
03A4  A9        839          BSS    TC30
03A5  40        840          LD     A,#0           ; 1-H CLOCK 0-CLEAR
03A6  1A        841          ST     A,aHL+
03A7  0A        842          INC    aHL            ; 10H CLOCK COUNT
03A8  85        843          BSS    TC40
                844  ;
03A9  44        845  TC30:   LD     A,#4           ; HH = 24 ?
03AA  16        846          CMPR   A,aHL
03AB  B5        847          BSS    TC40
03AC  18        848          INC    L
03AD  42        849          LD     A,#2
03AE  16        850          CMPR   A,aHL
03AF  B5        851          BSS    TC40
03B0  40        852          LD     A,#0           ; CLOCK CLEAR
03B1  1B        853          ST     A,aHL-
03B2  1B        854          ST     A,aHL-
03B3  1B        855          ST     A,aHL-
03B4  1B        856          ST     A,aHL-
03B5  2A        857  TC40:   RET
                858  ;
                859  ;-------ADD  BY  BINARY-------
03B6  3F0A      860  BADD:   ST     A,H'0A         ; COUNTER  SAVE
03B8  2FFA      861  BADD2:  ADD    H'0A,#H'F      ; COUNTER = 0 ?
03BA  63CC      862          BS     BADD8
03BC  06        863          TEST   CF
03BD  E7        864          LD     L,#H'7
03BE  3CA8      865          LD     A,H'AB         ; B(..H) = B(..H) + O(.
```

ROM PAGE NO.15

```
03C0  15        866          ADDC   A,aHL
03C1  1A        867          ST     A,aHL+
03C2  3CAC      868          LD     A,H'AC         ; B(.H.) = B(.H.) + O(.
03C4  15        869          ADDC   A,aHL
03C5  1A        870          ST     A,aHL+
03C6  3CAD      871          LD     A,H'AD         ; B(H..) = B(H..) + O(H
03C8  15        872          ADDC   A,aHL
03C9  0F        873          ST     A,aHL
03CA  63B8      874          BS     BADD2
03CC  2A        875  BADD8:  RET
                876  ;
```

ROM PAGE NO.16

```
0400           877           ORG    H'400
               878  ;
               879  ;
               880  ;-------ACCUMULATE------ W1(8,F-B) = W1(8,F-B) + W2(9,F-
```

```
0400 EB    881 ADDS:   LD     L,#H'B
0401 06    882 ADD2:   TEST   CF
0402 C9    883 ADDS1:  LD     H,#H'9
0403 0C    884         LD     A,@HL
0404 C8    885         LD     H,#H'8
0405 15    886         ADDC   A,@HL
0406 8D    887         BSS    ADDS4              ; CF = OFF
0407 04    888 ADDS2:  TESTP  CF
0408 3806  889         ADD    A,#6
040A 1A    890 ADDS3:  ST     A,@HL+
040B 82    891         BSS    ADDS1
040C 2A    892         RET
040D D9    893 ADDS4:  CMPR   A,#H'9             ; ANS. =< 9 ?
040E 06    894         TEST   CF
040F 87    895         BSS    ADDS2              ;-NO-
0410 8A    896         BSS    ADDS3              ;-YES-
           897 ;
           898 ;
           899 ;------ACCUMULATE----- W1(8,F-B) = W1(8,F-B) * W1(8,F-
0411 EA    900 MUL:    LD     L,#H'A
0412 C8    901 MUL01:  LD     H,#H'8
0413 0C    902         LD     A,@HL
0414 CA    903         LD     H,#H'A
0415 1A    904         ST     A,@HL+
0416 92    905         BSS    MUL01
0417 C8    906         LD     H,#H'8
0418 EA    907         LD     L,#H'A
0419 F0    908 MUL02:  ST     #0,@HL+
041A 99    909         BSS    MUL02
041B EF    910         LD     L,#H'F
041C CA    911 MUL03:  LD     H,#H'A
041D 40    912         LD     A,#0
041E 16    913         CMPR   A,@HL
041F A1    914         BSS    MUL04
0420 AF    915         BSS    MUL05
0421 11    916 MUL04:  MOV    L,A
0422 3F0B  917         ST     A,H'0B
0424 EA    918         LD     L,#H'A
0425 2401  919         CALL   ADD2               ; W1 <--- W1 + W2
0427 3C0B  920         LD     A,H'0B
0429 31    921         XCH    A,L
042A CA    922         LD     H,#H'A
042B 0B    923         DEC    @HL
042C 40    924         LD     A,#0
042D 16    925         CMPR   A,@HL
042E A1    926         BSS    MUL04
042F 19    927 MUL05:  DEC    L
0430 3399  928         CMPR   L,#H'9
0432 BF    929         BSS    MUL09
0433 11    930         MOV    L,A
0434 3F0B  931         ST     A,H'0B
0436 C8    932         LD     H,#H'8
0437 EA    933         LD     L,#H'A
0438 45    934         LD     A,#5
0439 2231  935         CALL   LSHIFT
043B 3C0B  936         LD     A,H'0B
043D 31    937         XCH    A,L
043E 9C    938         BSS    MUL03
043F 2A    939 MUL09:  RET

ROM PAGE NO.17

0440       940         ORG    H'440
           941 ;
           942 ;
           943 ;------ACCUMULATE----- W1(8,F-B) = W1(8,F-B) - W2(9,F-
0440 04    944 SUB:    TESTP  CF
```

```
0441 C9        945 SUB1:    LD      H,#H'9
0442 0C        946          LD      A,aHL
0443 C8        947          LD      H,#H'8
0444 14        948          SUBRC   A,aHL
0445 04        949          TESTP   CF
0446 8A        950          BSS     SUB2
0447 380A      951          ADD     A,#H'A
0449 06        952          TEST    CF
044A 1A        953 SUB2:    ST      A,aHL+
044B 81        954          BSS     SUB1
044C 2A        955          RET
               956 ;
               957 ;
               958 ;-------ACCUMULATE------ W3(A,F-B) = W1(8,F-B) / W2(9,F-
044D C8        959 DIV:     LD      H,#H'8
044E 90        960          BSS     D02
044F C9        961 D01:     LD      H,#H'9
0450 EF        962 D02:     LD      L,#H'F
0451 45        963          LD      A,#5
0452 2227      964          CALL    RSHIFT
0454 38D8      965          CMPR    H,#8
0456 8F        966          BSS     D01
0457 CA        967          LD      H,#H'A
0458 EA        968          LD      L,#H'A
0459 40        969          LD      A,#0
045A 1A        970 D04:     ST      A,aHL+
045B 9A        971          BSS     D04
045C 45        972 D05:     LD      A,#5
045D 247E      973          CALL    COMP         ; W1 : W2 COMPEAR
045F 04        974          TESTP   CF
0460 B0        975          BSS     D09
0461 C8        976          LD      H,#H'8
0462 EA        977          LD      L,#H'A
0463 45        978          LD      A,#5
0464 2231      979          CALL    LSHIFT
0466 CA        980          LD      H,#H'A
0467 EA        981          LD      L,#H'A
0468 45        982          LD      A,#5
0469 2231      983          CALL    LSHIFT
046B 2FFB      984          ADD     H'B,#H'F
046D AF        985          BSS     D06
046E 9C        986          BSS     D05
046F 2A        987 D06:     RET
0470 EA        989 D09:     LD      L,#H'A
0471 2440      990          CALL    SUB
0473 CA        991          LD      H,#H'A
0474 EA        992          LD      L,#H'A
0475 0A        993 D10:     INC     aHL
0476 4A        994          LD      A,#H'A
0477 16        995          CMPR    A,aHL
0478 9C        996          BSS     D05
0479 F0        997          ST      #0,aHL+
047A B5        998          BSS     D10
047B 9C        999          BSS     D05
              1000 ;
              1001 ;

ROM PAGE NO.17

047E          1002          ORG     H'47E
              1003 ;
              1004 ;-------COMPAIR-------- W1(8,F-B) : W2(9,F-B)
047E EF       1005 COMP:    LD      L,#H'F
047F 3F0A     1006 COMP2:   ST      A,H'0A
```

ROM PAGE NO.18 *

```
0481 C9        1007 CR1:     LD      H,#H'9
0482 0C        1008          LD      A,@HL
0483 C8        1009          LD      H,#H'8
0484 16        1010          CMPR    A,@HL
0485 8D        1011          BSS     CR2
0486 19        1012          DEC     L
0487 2FFA      1013          ADD     H'A,#H'F
0489 8B        1014          BSS     CR15
048A 81        1015          BSS     CR1
048B 41        1016 CR15:    LD      A,#1
048C 0E        1017          TESTP   ZF
048D 2A        1018 CR2:     RET
               1019 ;
               1020 ;
               1021 ;------- M(A,9-7) <--- W3  ; DECIMAL TO BINARY -------
               1022 ;
048E CA        1023 DBCVA:   LD      H,#H'A
048F E7        1024          LD      L,#H'7
0490 3CAB      1025          LD      A,H'AB
0492 06        1026          TEST    CF
0493 15        1027 DBC02:   ADDC    A,@HL
0494 0F        1028          ST      A,@HL
0495 06        1029          TEST    CF
0496 A2        1030          BSS     DBC10
0497 04        1031          TESTP   CF
0498 13        1032          INC     L
0499 40        1033          LD      A,#0
049A 93        1034          BSS     DBC02
               1035 ;
049B CA        1036 DBCNV:   LD      H,#H'A
049C E7        1037          LD      L,#H'7
049D 3CAB      1038          LD      A,H'AB      ; M(A,9-7) <--- W3(..9)
049F 1A        1039          ST      A,@HL+
04A0 F0        1040          ST      #0,@HL+
04A1 F0        1041          ST      #0,@HL+
04A2 3CAC      1042 DBC10:   LD      A,H'AC      ; M(A,9-7) <--- W3(.9.)
04A4 09        1043 DBC12:   DEC     A
04A5 A7        1044          BSS     DBC14
04A6 AF        1045          BSS     DBC20       ; SKIP IF ZERO
04A7 E7        1046 DBC14:   LD      L,#H'7
04A8 384A      1047          ADD     @HL,#H'A
04AA A4        1048          BSS     DBC12       ; BRANCH IF CF = 0
04AB 18        1049 DBC16:   INC     L
04AC 0A        1050          INC     @HL
04AD A4        1051          BSS     DBC12
04AE AB        1052          BSS     DBC16
               1053 ;
04AF ED        1054 DBC20:   LD      L,#H'D
04B0 0B        1055          DEC     @HL
04B1 83        1056          BSS     DBC22
04B2 BF        1057          BSS     DBC30       ; SKIP IF ZERO
04B3 E7        1058 DBC22:   LD      L,#H'7
04B4 06        1059          TEST    CF
04B5 44        1060          LD      A,#4
04B6 15        1061          ADDC    A,@HL
04B7 1A        1062          ST      A,@HL+
04B8 46        1063          LD      A,#6
04B9 15        1064          ADDC    A,@HL
04BA 1A        1065          ST      A,@HL+
04BB 06        1066          TEST    CF
04BC AF        1067          BSS     DBC20
04BD 0A        1068          INC     @HL
04BE AF        1069          BSS     DBC20
               1070 ;
04BF 2A        1071 DBC30:   RET
```

ROM PAGE NO.19

```
04C0            1072              ORG     H'4C0
                1073  ;****************************************************
                1074  ;*
                1075  ;*        MAIN ROUTINE
                1076  ;*
                1077  ;****************************************************
                1078  ;
04C0  2C01      1079  START:  OUT     #0,%01          ; PORT <--- LOW
04C2  2C02      1080          OUT     #0,%02
04C4  2C06      1081          OUT     #0,%06
04C6  2C07      1082          OUT     #0,%07
04C8  2C04      1083          OUT     #0,%04
04CA  3B78      1084          CLR     %08,3
04CC  3B58      1085          CLR     %08,1
04CE  2C09      1086          OUT     #0,%09
04D0  2C05      1087          OUT     #0,%05
                1089  ;
                1090  ;        INITIAL SHORI
                1091  ;
04D2  C0        1092          LD      H,#0            ; RAM CLEAR
04D3  E0        1093          LD      L,#0
04D4  F0        1094  INI01:  ST      #0,@HL+
04D5  64D4      1095          BS      INI01
04D7  38C1      1096          ADD     H,#1
04D9  64D4      1097          BS      INI01
04DB  41        1098          LD      A,#1            ; STEP FREQ. = 1
04DC  3F86      1099          ST      A,H'86
04DE  C1        1100          LD      H,#1            ; F-BANK INITIALIZE
04DF  E2        1101  INI02:  LD      L,#2
04E0  F1        1102          ST      #1,@HL+
04E1  E0        1103          LD      L,#0
04E2  F4        1104          ST      #4,@HL+
04E3  38C1      1105          ADD     H,#1
04E5  38DD      1106          CMPR    H,#H'D
04E7  64DF      1107          BS      INI02
04E9  391C      1108          SET     H'C,1           ; BLINK FLAG ON
                1109  ;
                1110  ;-------HOLD     PROC.--------
04EB  40        1111  HOLD:   LD      A,#0            ; 4-MS(2-MS) WAIT
04EC  3F8C      1112          ST      A,H'8C
04EE  3F8D      1113          ST      A,H'8D
04F0  3C8C      1114  HOLD1:  LD      A,H'8C
04F2  08        1115          INC     A
04F3  3F8C      1116          ST      A,H'8C
04F5  D0        1117          CMPR    A,#0
04F6  64F0      1118          BS      HOLD1
04F8  3C8D      1119          LD      A,H'8D
04FA  08        1120          INC     A
04FB  3F8D      1121          ST      A,H'8D
04FD  D8        1122          CMPR    A,#8
04FE  64F0      1123          BS      HOLD1
```

ROM PAGE NO.20

```
0500  4C        1124  HOLDC:  LD      A,#H'C          ; HOLD-CMMND SET
0501  3A30      1125          OUT     A,%H'10
0503  2D0F      1126          ST      #H'0,H'0F       ; SMODE <--- INITIAL
                1127  ;
0505  4C        1128          LD      A,#12           ; (SPW) <--- 12
0506  3FFF      1129          ST      A,H'FF
0508  4F        1130          LD      A,#H'F          ; DC(H) <--- "F"
0509  3FFE      1131          ST      A,H'FE
050B  2291      1132          CALL    CLEAR           ; DISPLAY "F"CLEAR
050D  40        1133          LD      A,#0            ; I-TIMER OFF
050E  3A89      1134          OUT     A,%H'19
```

```
0510 CF      1135           LD      H,#H'F
0511 E4      1136           LD      L,#4
0512 F8      1137           ST      #H'8,@HL+         ; TC1 <--- "FF8"
0513 FF      1138           ST      #H'F,@HL+
0514 FF      1139           ST      #H'F,@HL+
0515 43      1140           LD      A,#8              ; TIMER(1) ON
0516 3A8C    1141           OUT     A,%H'1C
0518 40      1142           LD      A,#0              ; TIMER(2) OFF
0519 3A8D    1143           OUT     A,%H'1D
051B 4D      1144           LD      A,#H'D            ; "EIR" SET
051C 13      1145           XCH     A,EIR
051D 3640    1146           EICLR   IL,0              ; "EIF" ON
051F 390C    1147           SET     H'C,0             ; COUNT MODE = 1-KHZ
0521 2D4E    1148           ST      #H'4,H'E          ; DISPLAY = CLOCK(1)
0523 2D06    1149           ST      #H'0,H'6          ; TIMER REQUEST OFF
0525 2D07    1150           ST      #H'0,H'7          ; TIMER PASS-FLAG OFF
0527 2D28    1151           ST      #H'2,H'8          ; KEY-IN REQUEST ON
0529 2D09    1152           ST      #H'0,H'9          ; KEY,ISIO OFF
052B 664C    1153           BS      PWOF0
             1154 ;***********************************************************
             1155 ;*                                                         *
             1156 ;*  0-0)-(0)       L O O P   ( M A I N )                   *
             1157 ;*                                                         *
             1158 ;***********************************************************
             1159 ;
             1160 ;-------C-MODE SET--------
052D 2ECF    1161 MAIN:     CMPR    H'F,#H'G
052F 6554    1162           BS      CC00
0531 C7      1163           LD      H,#H'7
0532 EF      1164           LD      L,#H'F
0533 3BC9    1165           TESTP   %09,0             ; R80 : HIGH ?
0535 6548    1166           BS      CMS20
             1167 ;
0537 3BC9    1168 CMS10:    TESTP   %09,0             ; R80 : HIGH ?
0539 6548    1169           BS      CMS20
053B 3BC9    1170           TESTP   %09,0             ; R80 : HIGH ?
053D 6548    1171           BS      CMS20
053F 390C    1172           SET     H'C,0             ; C-MODE = 1-KHZ

ROM PAGE NO.21 *

0541 50      1173           SET     @HL,0             ; LED(1KHZ) ON
0542 56      1174           CLR     @HL,2
0543 40      1175           LD      A,#0              ; 1/10 COUNT = 0
0544 3F96    1176           ST      A,H'96
0546 6554    1177           BS      CC00
             1178 ;
0548 3889    1179 CMS20:    TEST    %09,0             ; R80 : LOW ?
054A 6537    1180           BS      CMS10
054C 3889    1181           TEST    %09,0             ; R80 : LOW ?
054E 6537    1182           BS      CMS10
0550 394C    1183           CLR     H'C,0             ; C-MODE = 100HZ
0552 54      1184           CLR     @HL,0             ; LED(100HZ) ON
0553 52      1185           SET     @HL,2
             1186 ;
             1187 ;-------BLINK SHORI--------
0554 399C    1188 CC00:     TEST    H'C,1             ; BLINK FLAG ON ?
0556 6587    1189           BS      CC20              ;-OFF-
0558 39EE    1190           TESTP   H'E,2             ; DISPLAY : CLOCK ?
055A 6560    1191           BS      CC10
055C 399E    1192           TEST    H'E,1
055E 6587    1193           BS      CC20              ;-NO-
0560 39FE    1194 CC10:     TESTP   H'E,3             ; ERROR ?
0562 6587    1195           BS      CC20
0564 3CC0    1196           LD      A,H'C0            ; KETASU = 0 ?
0566 D0      1197           CMPR    A,#0
0567 6587    1198           BS      CC20              ;-NO-
```

```
0569 21F3    1199           CALL    WAITRT       ; TIMER WAIT
056B 3C46    1200           LD      A,H'46
056D D5      1201           CMPR    A,#5         ; 1-S CLOCK = 5 ?
056E 6574    1202           BS      CC14         ;-NO-
0570 4F      1203           LD      A,#H'F
0571 CF      1204           LD      H,#H'F       ; DISPLAY OFF
0572 6579    1205           BS      CC16
             1206   ;
0574 DA      1207  CC14:    CMPR    A,#10        ; 1-S CLOCK = 10 ?
0575 6644    1208           BS      PWCHK        ;-NO-
0577 40      1209           LD      A,#H'0
0578 CA      1210           LD      H,#H'A       ; DISPLAY ON
             1211   ;
0579 3FC1    1212  CC16:    ST      A,H'C1
057B 3FC2    1213           ST      A,H'C2
057D 3FC4    1214           ST      A,H'C4
057F 3FC5    1215           ST      A,H'C5

ROM PAGE NO.22  *

0581 30      1216           XCH     A,H
0582 3FC3    1217           ST      A,H'C3
0584 40      1218           LD      A,#0         ; PERIOD OFF
0585 3FC6    1219           ST      A,H'C6
             1220   ;
             1221   ;------CLOCK    COUNT-------
0587 C4      1222  CC20:    LD      H,#4         ; 1-S CLOCK < 10 ?
0588 E6      1223           LD      L,#6
0589 0C      1224           LD      A,@HL
058A D9      1225           CMPR    A,#9
058B 04      1226           TESTP   CF
058C 6644    1227           BS      PWCHK
058E 3846    1228           ADD     @HL,#6       ; 1-S CLOCK - (10)
0590 C6      1229           LD      H,#H'6
0591 EB      1230           LD      L,#H'B
0592 0A      1231           INC     @HL          ; 10S TIMER COUNT
0593 4B      1232           LD      A,#11
0594 16      1233           CMPR    A,@HL        ; 10S TIMER = 10 ?
0595 6598    1234           BS      CC22         ;-NO-
0597 FA      1235           ST      #10,@HL+     ; 10S TIMER - (10)
0598 390C    1236  CC22:    TESTP   H'C,1        ; BLINK FLAG ON ?
059A 6644    1237           BS      PWCHK
059C C5      1238           LD      H,#H'5
059D E6      1239           LD      L,#H'6
059E 0A      1240           INC     @HL          ; 10S CLOCK COUNT
059F 4A      1241           LD      A,#10
05A0 16      1242           CMPR    A,@HL        ; 10S CLOCK = 10 ?
05A1 6644    1243           BS      PWCHK        ;-NO-
05A3 F0      1244           ST      #0,@HL+      ; 10S CLOCK CLEAR
05A4 C2      1245           LD      H,#H'2       ; 10S CLOCK HOSEI
05A5 E6      1246           LD      L,#H'6
05A6 3842    1247           ADD     @HL,#2
05A8 C7      1248           LD      H,#H'7
05A9 E7      1249           LD      L,#H'7
05AA 0A      1250           INC     @HL          ; 1-M CLOCK COUNT
05AB 46      1251           LD      A,#6
05AC 16      1252           CMPR    A,@HL        ; 1-M CLOCK = 6 ?
05AD 6644    1253           BS      PWCHK        ;-NO-
05AF F0      1254           ST      #0,@HL+      ; 1-M CLOCK <--- 0
05B0 C2      1255           LD      H,#H'2       ; 1-M CLOCK HOSEI
05B1 E6      1256           LD      L,#H'6
05B2 0A      1257           INC     @HL
05B3 CC      1258           LD      H,#H'C       ; CLOCK(1) COUNT
05B4 E8      1259           LD      L,#H'8
05B5 2378    1260           CALL    TIMCNT
05B7 39AC    1261           TEST    H'C,2        ; CLOCK(2) INPUT ?
05B9 658F    1262           BS      CC24         ;-NO-
```

```
05B8 CC        1263         LD      H,#H'C         ; CLOCK(2) COUNT
05BC EC        1264         LD      L,#H'C
05BD 2378      1265         CALL    TIMCNT
05BF 3CC0      1266 CC24:   LD      A,H'C0
```

ROM PAGE NO.23 *

```
05C1 D0        1267         CMPR    A,#0           ; KETASU = 0 ?
05C2 65D6      1268         BS      CC30           ;-NO-
05C4 39AE      1269         TEST    H'E,2          ; CLOCK(1) DISPLAY ?
05C6 65CB      1270         BS      CC26           ;-NO-
05C8 E8        1271         LD      L,#H'8         ; CLOCK(1) DISPLAY
05C9 65D0      1272         BS      CC28
               1273 ;
05CB 399E      1274 CC26:   TEST    H'E,1          ; CLOCK(2) DISPLAY ?
05CD 65D6      1275         BS      CC30           ;-NO-
05CF EC        1276         LD      L,#H'C         ; CLOCK(2) DISPLAY
05D0 CC        1277 CC28:   LD      H,#H'C
05D1 43        1278         LD      A,#3
05D2 223F      1279         CALL    LOAD
05D4 2209      1280         CALL    TDSPLY         ; CLOCK DISPLAY
               1281 ;
               1282 ;-------PROGRAM MODE--------
05D6 2EFF      1283 CC30:   CMPR    H'F,#H'F       ; PROGRAM MODE ?
05D8 6644      1284         BS      PWCHK          ;-NO-
05DA 3CD7      1285         LD      A,H'D7         ; T-BANK NO SAVE
05DC 3FC0      1286         ST      A,H'C0
05DE 41        1287         LD      A,#1
05DF 3FD7      1288         ST      A,H'D7         ; T-BANK NO <--- 1
05E1 CC        1289         LD      H,#H'C         ; W2 <--- CLOCK(1)
05E2 E8        1290         LD      L,#H'8
05E3 43        1291         LD      A,#3
05E4 223F      1292         CALL    LOAD
05E6 C9        1293         LD      H,#H'9
05E7 E8        1294         LD      L,#H'8
05E8 43        1295         LD      A,#3
05E9 2251      1296         CALL    STORE
05EB 3CD7      1297 CC32:   LD      A,H'D7         ; W1 <--- ON-TIME
05ED 30        1298         XCH     A,H
05EE E8        1299         LD      L,#H'8
05EF 43        1300         LD      A,#3
05F0 2268      1301         CALL    MOVEL
05F2 EE        1302         LD      L,#H'E
05F3 43        1303         LD      A,#3
05F4 247F      1304         CALL    COMP2          ; CLOCK(1) = ON-TIME ?
05F6 6615      1305         BS      CC36
05F8 3CD7      1306         LD      A,H'D7
05FA 30        1307         XCH     A,H
05FB E7        1308         LD      L,#H'7
05FC 0C        1309         LD      A,@HL
05FD D0        1310         CMPR    A,#0           ; F-LINK NO. = 0 ?
05FE 0E        1311         TESTP   ZF
05FF 6615      1312         BS      CC36
```

ROM PAGE NO.24 *

```
0601 30        1313         XCH     A,H            ; WORK <--- F-BANK
0602 E0        1314         LD      L,#H'0
0603 0C        1315         LD      A,@HL
0604 3FB0      1316         ST      A,H'B0
0606 E1        1317         LD      L,#H'1
0607 44        1318         LD      A,#4
0608 223F      1319         CALL    LOAD
060A 2D1E      1320         ST      #H'1,H'E       ; DISPLAY = "FREQ"
060C 3835      1321         SET     %05,3          ; SUPPLY ON
060E 3834      1322         SET     %04,3          ; PROG.-CTL ON
0610 40        1323         LD      A,#0           ; KETASU <--- 0
```

```
0611 3FC0      1324            ST      A,H'C0
0613 6D83      1325            BS      PLLST
               1326 ;
0615 CD        1327 CC36:      LD      H,#H'D
0616 E7        1328            LD      L,#H'7
0617 0A        1329            INC     @HL                     ; T-BANK NO. COUNT
0618 46        1330            LD      A,#6
0619 16        1331            CMPR    A,@HL                   ; T-BANK NO. = 6 ?
061A 65EB      1332            BS      CC32                    ;-NO-
               1333 ;
061C 40        1334            LD      A,#0                    ; T-BANK NO. RECV
061D 3DC0      1335            XCH     A,H'C0
061F 0F        1336            ST      A,@HL
0620 0E        1337            TESTP   ZF                      ; T-BANK NO. = 0 ?
0621 6644      1338            BS      PWCHK
               1339 ;
0623 30        1340            XCH     A,H                     ; W1 <--- OFF TIME
0624 EC        1341            LD      L,#H'C
0625 43        1342            LD      A,#3
0626 226B      1343            CALL    MOVEL
0628 EE        1344            LD      L,#H'E
0629 43        1345            LD      A,#3
062A 247F      1346            CALL    COMP2                   ; OFF-TIME = CLOCK(1) ?
062C 6644      1347            BS      PWCHK                   ;-NO-
               1348 ;
062E 40        1349            LD      A,#0                    ; T-LINK <--- 0
062F 3DD7      1350            ST      A,H'D7
0631 2291      1351            CALL    CLEAR                   ; DISPLAY CLEAR
0633 229A      1352            CALL    LEDMCL                  ; LED(JMODE) OFF
0635 2D4E      1353            ST      #H'4,H'E                ; DISPLAY CLOCK(1)
0637 CC        1354            LD      H,#H'C
0638 E8        1355            LD      L,#H'8
0639 43        1356            LD      A,#3
063A 223F      1357            CALL    LOAD
063C 22D9      1358            CALL    TDSPLY
063E 2C04      1359            OUT     #0,%04                  ; PORT RESET

ROM PAGE NO.25

0640 2C09      1360            OUT     #0,%09
0642 2C05      1361            OUT     #0,%05
               1362 ;
0644 39FF      1363 PWCHK:     TESTP   H'F,3                   ; POWER ON ?
0646 668B      1364            BS      TIMER
               1365 ;
               1366 ;
               1367 ;           POWER OFF SHORI
               1368 ;
0648 39BC      1369            TEST    H'C,3                   ; P/W OFF MODE ?
064A 665F      1370            BS      PWOF1                   ;-NO-
064C 397C      1371 PWOF0:     CLR     H'C,3                   ; RESET P/W OFF MODE
064E C6        1372            LD      H,#H'6                  ; CLR LED(SMODE)
064F EE        1373            LD      L,#H'E
0650 F0        1374            ST      #0,@HL+
0651 F0        1375            ST      #0,@HL+
0652 C7        1376            LD      H,#H'7
0653 EE        1377            LD      L,#H'E
0654 F0        1378            ST      #0,@HL+
0655 F0        1379            ST      #0,@HL+
0656 40        1380            LD      A,#0                    ; KETASU <--- 0
0657 3FC0      1381            ST      A,H'C0
0659 3F68      1382            ST      A,H'68                  ; TIMER = 0
065B 2D28      1383            ST      #H'2,H'8                ; KEY REQUEST ON
065D 6697      1384            BS      PWOF3
               1385 ;
065F 3988      1386 PWOF1:     TEST    8,0                     ; KEY RECIEVED ?
0661 66A0      1387            BS      PWOF4                   ;-NO-
```

```
0663 3C7B    1388          LD      A,H'7B        ; IN-KEY SAVE
0665 3F79    1389          ST      A,H'79
0667 3C7A    1390          LD      A,H'7A
0669 3F78    1391          ST      A,H'78
066B 3949    1392          CLR     H'9,0         ; IN-KEY REQUEST
066D 3959    1393          CLR     H'9,1
066F 3948    1394          CLR     H'8,0
0671 3918    1395          SET     H'8,1
0673 C7      1396          LD      H,#7
0674 E9      1397          LD      L,#H'9
0675 42      1398          LD      A,#2
0676 16      1399          CMPR    A,@HL         ; CLOCK KEY ?
0677 66A0    1400          BS      PWOF4         ;-NO-
0679 E8      1401          LD      L,#H'8
067A 16      1402          CMPR    A,@HL
067B 66A0    1403          BS      PWOF4         ;-NO-
             1404  ;
067D 21E8    1405          CALL    PEEP
067F 3F7D    1406          ST      A,H'7D
```

ROM PAGE NO.26 *

```
0681 39AE    1407          TEST    H'E,2         ; CLOCK(1) DISPLAY ?
0683 663A    1408          BS      PWOF2         ;-NO-
0685 2D2E    1409          ST      #2,H'E        ; DISPLAY STATUS SET
0687 EC      1410          LD      L,#H'C        ; CLOCK(2) DISPLAY
0689 669A    1411          BS      PWOF35
             1412  ;
068A 399E    1413 PWOF2:   TEST    H'E,1         ; CLOCK(2) DISPLAY ?
068C 6697    1414          BS      PWOF3         ;-NO-
068E 2D1E    1415          ST      #1,H'E        ; DISPLAY STATUS SET
0690 C7      1416          LD      H,#H'7        ; LED(TIME2) OFF
0691 EF      1417          LD      L,#H'F
0692 55      1418          CLR     @HL,1
0693 2291    1419          CALL    CLEAR         ; DISPLAY CLEAR
0695 66A0    1420          BS      PWOF4
             1421  ;
0697 2D4E    1422 PWOF3:   ST      #4,H'E        ; DISPLAY STATUS SET
0699 E8      1423          LD      L,#H'8        ; CLOCK(1) DISPLAY
069A CC      1424 PWOF35:  LD      H,#H'C
069B 43      1425          LD      A,#3
069C 223F    1426          CALL    LOAD
069E 22D9    1427          CALL    TDSPLY
             1428  ;
06A0 3B88    1429 PWOF4:   TEST    %08,0         ; POWER ON ?
06A2 652D    1430          BS      MAIN          ;-NO-
06A4 3818    1431 PWOF5:   SET     %08,1         ; R81,R83,R90 HIGH
06A6 3838    1432          SET     %08,3
06A8 3809    1433          SET     %09,0
06AA 3A28    1434          IN      %08,A         ; SET INPUT-MODE
06AC 3A29    1435          IN      %09,A
06AE 2D9F    1436          ST      #H'9,H'F      ; STATUS INITIALIZE
06B0 2D1E    1437          ST      #H'1,H'E
06B2 2D0D    1438          ST      #H'0,H'D
06B4 3835    1439          SET     %05,3         ; SUPPLY ON
06B6 C7      1440          LD      H,#H'7        ; LED(KEY) ON
06B7 EE      1441          LD      L,#H'E
06B8 51      1442          SET     @HL,1
06B9 6D77    1443          BS      PLLLD
             1444  ;
             1445  ;
             1446  ;       TIMER SHORI
             1447  ;
06BB 3996    1448 TIMER:   TEST    H'6,1         ; 100MS TIMER ?
06BD 66CB    1449          BS      TS20
06BF 3997    1450          TEST    H'7,1         ; 100MS KEIKA ?
```

ROM PAGE NO.27 *

| LOC | OBJ | LINE | SOURCE STATEMENT | |
|---|---|---|---|---|

```
06C1 66CB    1451          BS     TS20
06C3 3956    1452          CLR    H'6,1           ; TIMER RESET
06C5 3957    1453          CLR    H'7,1
06C7 3845    1454          CLR    %05,0           ; MUTE OFF
06C9 3855    1455          CLR    %05,1
             1456 ;
06CB 2E8F    1457 TS20:    CMPR   H'F,#H'B        ; S-MODE = STEP ?
06CD 0E      1458          TESTP  ZF
06CE 66D7    1459          BS     TS40
06D0 2ECF    1460          CMPR   H'F,#H'C        ; S-MODE = MANUAL ?
06D2 0E      1461          TESTP  ZF
06D3 6723    1462          BS     TS60
06D5 6732    1463          BS     TS80
             1464 ;
             1465 ;-------STEP   MODE-------
06D7 39B8    1466 TS40:    TEST   H'8,3           ; KEIZOKU FLAG ON ?
06D9 6732    1467          BS     TS80
06DB 39A8    1468          TEST   H'8,2           ; CHUDAN FLAG ON ?
06DD 66E3    1469          BS     TS42            ;-OFF-
             1470 ;
06DF 2028    1471          ST     #2,H'8
06E1 676E    1472          BS     KEYINQ
             1473 ;
06E3 40      1474 TS42:    LD     A,#0            ; 10SEC TIMER <--- 0
06E4 3F6B    1475          ST     A,H'6B
06E6 39A7    1476          TEST   H'7,2           ; 300MS KEIKA ?
06E8 676E    1477          BS     KEYINQ          ;-NO-
06EA 3967    1478          CLR    H'7,2           ; TIMER CLEAR
06EC 3C6A    1479          LD     A,H'6A
06EE D2      1480          CMPR   A,#2            ; 3SEC KEIKA ?
06EF 0E      1481          TESTP  ZF
06F0 66F7    1482          BS     TS50
06F2 08      1483          INC    A               ; TIMER COUNT
06F3 3F6A    1484          ST     A,H'6A
06F5 676E    1485          BS     KEYINQ
             1486 ;
06F7 C8      1487 TS50:    LD     H,#H'8          ; WORK1 <--- WORK
06F8 EB      1488          LD     L,#H'B
06F9 44      1489          LD     A,#4
06FA 2251    1490          CALL   STORE
06FC C9      1491          LD     H,#H'9          ; WORK2 <--- STEP FREQ
06FD EB      1492          LD     L,#H'B
06FE 3C86    1493          LD     A,H'86

ROM PAGE NO.28

0700 1A      1494          ST     A,@HL+
0701 3C87    1495          LD     A,H'87
0703 1A      1496          ST     A,@HL+
0704 3C97    1497          LD     A,H'97
0706 1A      1498          ST     A,@HL+
0707 F0      1499          ST     #0,@HL+
0708 F0      1500          ST     #0,@HL+
0709 39DD    1501          TESTP  H'D,1           ; ZENKAI = UP ?
```

| LOC | OBJ | LINE | SOURCE STATEMENT | |
|---|---|---|---|---|

```
070B 6716    1502          BS     TS52
070D EB      1503          LD     L,#H'B
070E 2440    1504          CALL   SUB             ; W(1) <--- W(1) - W(2)
0710 2345    1505          CALL   WAVEC2          ; F-BAND CHECK
0712 676E    1506          BS     KEYINQ
0714 671C    1507          BS     TS54
             1508 ;
0716 2400    1509 TS52:    CALL   ADDS            ; W(1) <--- W(1) + W(2)
0718 2345    1510          CALL   WAVEC2
071A 676E    1511          BS     KEYINQ
```

```
            1512 ;
071C C8     1513 TS54:   LD      H,#H'8         ; WORK <--- NEW FREQ.
071D EB     1514         LD      L,#H'B
071E 44     1515         LD      A,#4
071F 223F   1516         CALL    LOAD
0721 6D83   1517         BS      PLLST
            1518 ;
            1519 ;------- MANUAL MODE -------
0723 2309   1520 TS60:   CALL    FCONV          ; WORK <--- DISPLAY
0725 E5     1521         LD      L,#5           ; WORK = CURRENT ?
0726 CB     1522 TS62:   LD      H,#H'B
0727 0C     1523         LD      A,@HL
0728 CD     1524         LD      H,#H'D
0729 16     1525         CMPR    A,@HL
072A 6D83   1526         BS      PLLST          ;-NO-
072C 19     1527         DEC     L
072D 0E     1528         TESTP   ZF
072E 676E   1529         BS      KEYINQ
0730 6726   1530         BS      TS62
            1531 ;
            1532 ;------- 10-SEC TIMER -------
0732 4A     1533 TS80:   LD      A,#10
0733 3E6B   1534         CMPR    A,H'6B         ; 10S TIMER = 10 ?
0735 676E   1535         BS      KEYINQ         ;-NO-
0737 40     1536         LD      A,#0           ; 10S TIMER <--- 0
0738 3F6B   1537         ST      A,H'6B
073A 3C0E   1538         LD      A,H'0E         ; ERROR OR CLOCK ?
073C 383E   1539         AND     A,#H'E
073E 676E   1540         BS      KEYINQ
            1541 ;

ROM PAGE NO.29

0740 2EEF   1542         CMPR    H'F,#H'E       ; TIME MODE ?
0742 6757   1543         BS      TS82           ;-NO-
0744 393D   1544         TEST    H'D,0          ; BANK NO. ?
0746 676E   1545         BS      KEYINQ         ;-NO-
0748 40     1546         LD      A,#0
0749 3EC0   1547         CMPR    A,H'C0         ; KETASU = 0 ?
074B 676E   1548         BS      KEYINQ
074D 39DD   1549         TESTP   H'D,1          ; ON-TIME DISPLAY ?
074F 676E   1550         BS      KEYINQ
0751 394D   1551         CLR     H'D,0          ; BANK-NO. OFF
            1552 ;       LD      A,#0           ; T-LINK = 0
0753 3FD7   1553         ST      A,H'D7
LOC  OBJ    LINE         SOURCE STATEMENT 0755 675C   1554         BS      TS84
            1555 ;
0757 3CC0   1556 TS82:   LD      A,H'C0         ; KETA-SU = 0 ?
0759 0E     1557         TESTP   ZF
075A 676E   1558         BS      KEYINQ
075C 2D1E   1559 TS84:   ST      #1,H'E         ; DISPLAY <--- FREQ.
075E 3CD0   1560         LD      A,H'D0         ; F-CURR. DISPLAY
0760 3F80   1561         ST      A,H'80
0762 CD     1562         LD      H,#H'D
0763 E1     1563         LD      L,#H'1
0764 44     1564         LD      A,#4
0765 223F   1565         CALL    LOAD
0767 22B4   1566         CALL    FDSPLY
0769 40     1567         LD      A,#0
076A 3FC0   1568         ST      A,H'C0         ; KETASU <--- 0
076C 21E8   1569         CALL    PEEP
            1570 ;
            1571 ;
            1572 ; 5-0)-(0)   KAKU KEY NO SHORI
            1573 ;
076E 3988   1574 KEYINQ: TEST    8,0            ; KEY RECIEVED ?
```

```
0770 652D      1575           BS      MAIN              ;-NO-
               1576  ;
0772 40        1577           LD      A,#0              ; 10SEC TIMER <--- 0
0773 3F68      1578           ST      A,H'68
0775 3C7A      1579           LD      A,H'7A            ; K-PORT CONV.
0777 04        1580           TESTP   CF
0778 07        1581           RORC    A
0779 CF        1582           LD      H,#H'F
077A 31        1583           XCH     A,L
077B 29FC      1584           XCH     HL,H'FC
077D 33        1585           LDL     A,aDC
077E CF        1586           LD      H,#H'F
077F EC        1587    -      LD      L,#H'C

ROM PAGE NO.30

0780 0F        1588           ST      A,aHL
0781 3C7B      1589           LD      A,H'7B            ; P-PORT CONVERT
0783 05        1590           ROLC    A
0784 05        1591           ROLC    A
0785 383C      1592           AND     A,#H'C
0787 1D        1593           OR      A,aHL
0788 1A        1594           ST      A,aHL+
0789 06        1595           TEST    CF
078A 678F      1596           BS      KK02
078C FD        1597           ST      #H'D,aHL+
078D 6790      1598           BS      KK04
078F FC        1599 KK02:     ST      #H'C,aHL+
0790 33        1600 KK04:     LDL     A,aDC             ; TRL-ED KEY SET
0791 3F78      1601           ST      A,H'78
0793 32        1602           LDH     A,aDC+
0794 3F79      1603           ST      A,H'79
               1604 ;
0796 3959      1605           CLR     9,1               ; KEY REQUEST SET

LOC   OBJ      LINE           SOURCE STATEMENT 0798 3949      1606           CLR     9,0
079A 2D28      1607           ST      #H'2,H'8
               1608 ;
079C 39BE      1609           TEST    H'E,3             ; ERROR DISPLAY ?
079E 67AE      1610           BS      KK22
07A0 3C79      1611           LD      A,H'79            ; CLEAR KEY ?
07A2 D2        1612           CMPR    A,#2
07A3 652D      1613           BS      MAIN              ;-NO-
07A5 3C78      1614           LD      A,H'78
07A7 D1        1615           CMPR    A,#1
07A8 652D      1616           BS      MAIN              ;-NO-
07AA 397E      1617           CLR     H'E,3             ; ERROR FLAG RESET
07AC 67C3      1618           BS      KK24
               1619 ;
07AE 42        1620 KK22:     LD      A,#2              ; CLEAR KEY ?
07AF 3E79      1621           CMPR    A,H'79
07B1 67F0      1622           BS      KK30              ;-NO-
07B3 41        1623           LD      A,#1
07B4 3E78      1624           CMPR    A,H'78
07B6 67F0      1625           BS      KK30              ;-NO-
07B8 3CC0      1626           LD      A,H'C0            ; KETA-SU = 0?
07BA 0E        1627           TESTP   ZF
07BB 67F0      1628           BS      KK30
07BD 2E8F      1629           CMPR    H'F,#H'B          ; STEP MODE ?
07BF 67C3      1630           BS      KK24              ;-NO-

ROM PAGE NO.31 *

07C1 2D1E      1631           ST      #1,H'E            ; DISPLAY = FREQ.
07C3 2EEF      1632 KK24:     CMPR    H'F,#H'E          ; TIME MODE ?
07C5 0E        1633           TESTP   ZF
07C6 67F0      1634           BS      KK30
07C8 21E8      1635           CALL    PEEP
```

```
07CA 40      1636           LD      A,#0          ; KETASU <--- 0
07CB 3FC0    1637           ST      A,H'C0
07CD 39AE    1638           TEST    H'E,2         ; CLOCK(1) DISPLAY ?
07CF 67D4    1639           BS      KK26          ;-NO-
07D1 E8      1640           LD      L,#H'8        ; CLOCK(1) DISPLAY
07D2 67D9    1641           BS      KK27
             1642 ;
07D4 399E    1643 KK26:     TEST    H'E,1         ; CLOCK(2) DISPLAY ?
07D6 67E1    1644           BS      KK28          ;-NO-
07D8 EC      1645           LD      L,#H'C        ; CLOCK(2) DISPLAY
07D9 CC      1646 KK27:     LD      H,#H'C
07DA 43      1647           LD      A,#3
07DB 223F    1648           CALL    LOAD
07DD 22D9    1649           CALL    TDSPLY
07DF 652D    1650           BS      MAIN
             1651 ;
07E1 201E    1652 KK28:     ST      #1,H'E        ; DISPLAY <--- FREQ.
07E3 3CD0    1653           LD      A,H'D0        ; FREQ. DISPLAY
07E5 3FB0    1654           ST      A,H'B0
07E7 CD      1655           LD      H,#H'D
07E8 E1      1656           LD      L,#H'1
07E9 44      1657           LD      A,#4
LOC  OBJ     LINE           SOURCE STATEMENT

07EA 223F    1658           CALL    LOAD
07EC 22B4    1659           CALL    FDSPLY
07EE 652D    1660           BS      MAIN
             1661 ;
07F0 3C0F    1662 KK30:     LD      A,H'0F
07F2 D9      1663           CMPR    A,#H'9        ; MODE = NORMAL ?
07F3 0E      1664           TESTP   ZF
07F4 6810    1665           BS      FREQ
07F6 DA      1666           CMPR    A,#H'A        ; MODE = CLOCK ?
07F7 0E      1667           TESTP   ZF
07F8 6843    1668           BS      CLOCK
07FA DB      1669           CMPR    A,#H'B        ; MODE = STEP ?
07FB 0E      1670           TESTP   ZF
07FC 68CB    1671           BS      STEP
07FE DC      1672           CMPR    A,#H'C        ; MODE = MANUAL ?
07FF 0E      1673           TESTP   ZF

ROM PAGE NO.32

0800 69B2    1674           BS      MANUAL
0802 DD      1675           CMPR    A,#H'D        ; MODE = MEMORY ?
0803 0E      1676           TESTP   ZF
0804 69DD    1677           BS      MEMORY
0806 DE      1678           CMPR    A,#H'E        ; MODE = TIME ?
0807 0E      1679           TESTP   ZF
0808 6A7E    1680           BS      TIME
080A DF      1681           CMPR    A,#H'F        ; MODE = PROGRAM ?
080B 0E      1682           TESTP   ZF
080C 6BC6    1683           BS      PROGRM
             1684 ;
080E 652D    1685           BS      MAIN
             1686 ;
             1687 ;
             1688 ;   -   NORMAL MODE SHORI
             1689 ;
0810 C7      1690 FREQ:     LD      H,#H'7        ; S-MODE KEY ?
0811 E9      1691           LD      L,#H'9
0812 0C      1692           LD      A,@HL
0813 D8      1693           CMPR    A,#8
0814 6821    1694           BS      FQ10          ;-NO-
0816 21E8    1695           CALL    PEEP
0818 3C78    1696           LD      A,H'78
081A D6      1697           CMPR    A,#6          ; TIME MODE ?
081B 6C22    1698           BS      MODE          ;-NO-
081D 2D0D    1699           ST      #H'0,H'D      ; RECALL ONLY
```

```
081F 6C22      1700            BS      MODE
               1701 ;
0821 D1        1702 FQ10:      CMPR    A,#1            ; J-MODE KEY ?
0822 0E        1703            TESTP   ZF
0823 6D93      1704            BS      PLLJM
               1705 ;
0825 D0        1706 FQ20:      CMPR    A,#0            ; "0"-"9","." ?
0826 0E        1707            TESTP   ZF
0827 6CFC      1708            BS      FREQIN
               1709 ;

LOC  OBJ       LINE            SOURCE STATEMENT

0829 D2        1710            CMPR    A,#2            ; ENTRY KEY ?
082A 652D      1711            BS      MAIN            ;-NO-
082C E8        1712            LD      L,#H'8
082D 0C        1713            LD      A,@HL
082E D0        1714            CMPR    A,#0
082F 652D      1715            BS      MAIN            ;-NO-
               1716 ;
0831 3CC0      1717            LD      A,H'C0
0833 0E        1718            TESTP   ZF              ; KETASU = 0 ?
0834 652D      1719            BS      MAIN
               1720 ;
0836 21E8      1721            CALL    PEEP
0838 2309      1722            CALL    FCONV           ; WORK <--- DISPLAY
083A 2340      1723            CALL    WAVECH          ; FREQ. CHECK
083C 6CDA      1724            BS      ERDISP
083E 40        1725            LD      A,#0            ; KETASU = 0
083F 3FC0      1726            ST      A,H'C0

ROM PAGE NO.33 *

0841 6D83      1727            BS      PLLST
               1728 ;
               1729 ;
               1730 ;          CLOCK MODE SHORI
               1731 ;
0843 3C79      1732 CLOCK:     LD      A,H'79
0845 D8        1733            CMPR    A,#8            ; S-MODE KEY ?
0846 686F      1734            BS      CM20            ;-NO-
0848 3C78      1735            LD      A,H'78
084A D7        1736            CMPR    A,#7            ; PROGRAM KEY ?
084B 6851      1737            BS      CM02            ;-NO-
084D 21E8      1738            CALL    PEEP
084F 6C22      1739            BS      MODE
               1740 ;
0851 D2        1741 CM02:      CMPR    A,#2            ; CLOCK KEY ?
0852 652D      1742            BS      MAIN            ;-NO-
0854 21E8      1743            CALL    PEEP
0856 39AE      1744            TEST    H'E,2           ; CLOCK(1) DISPLAY ?
0858 686A      1745            BS      CM10
085A 396E      1746            CLR     H'E,2           ; DISPLAY STATUS SET
085C 391E      1747            SET     H'E,1
085E EC        1748            LD      L,#H'C          ; CLOCK(2) DISPLAY
085F CC        1749            LD      H,#H'C
0860 43        1750            LD      A,#3
0861 223F      1751            CALL    LOAD
0863 22D9      1752            CALL    TDSPLY
0865 40        1753            LD      A,#0            ; KETASU <--- 0
0866 3FC0      1754            ST      A,H'C0
0868 652D      1755            BS      MAIN
               1756 ;
086A 41        1757 CM10:      LD      A,#1            ; INKEY <--- FREQ.
086B 3F73      1758            ST      A,H'78
086D 6C22      1759            BS      MODE
               1760 ;
086F 3C79      1761 CM20:      LD      A,H'79
```

```
LOC   OBJ      LINE        SOURCE STATEMENT

0871  D0       1762        CMPR    A,#0           ; "0"-"9" ?
0872  0E       1763        TESTP   ZF
0873  6D41     1764        BS      CLOKIN
0875  3C79     1765        LD      A,H'79
0877  D2       1766        CMPR    A,#2           ; ENTRY KEY ?
0878  652D     1767        BS      MAIN           ;-NO-
087A  3C78     1768        LD      A,H'78
087C  D0       1769        CMPR    A,#0
087D  652D     1770        BS      MAIN           ;-NO-
087F  3CC0     1771        LD      A,H'C0

ROM PAGE NO.34 *

0881  0E       1772        TESTP   ZF             ; KETASU = 0 ?
0882  652D     1773        BS      MAIN
               1774  ;
0884  21E8     1775        CALL    PEEP
0886  2329     1776        CALL    TCONV
0888  39EE     1777        TESTP   H'E,2          ; CLOCK(1) DISPLAY ?
088A  689C     1778        BS      CM30
088C  CB       1779        LD      H,#H'B         ; W(3,4) <--- W(1,2)
088D  E3       1780        LD      L,#3
088E  41       1781        LD      A,#1
088F  2251     1782        CALL    STORE
0891  CC       1783        LD      H,#H'C         ; W(1,2) <--- CLK(1)(M
0892  E8       1784        LD      L,#8
0893  41       1785        LD      A,#1
0894  223F     1786        CALL    LOAD
0896  3CC0     1787        LD      A,H'C0         ; KETASU = KETASU + 2
0898  3802     1788        ADD     A,#2
089A  3FC0     1789        ST      A,H'C0
089C  2360     1790 CM30:  CALL    TCHK           ; TIME CHECK
089E  6CDA     1791        BS      ERDISP
08A0  40       1792        LD      A,#0           ; KETASU = 0
08A1  3FC0     1793        ST      A,H'C0
08A3  395C     1794        CLR     H'C,1          ; BLINK-FLAG OFF
08A5  22D9     1795        CALL    TDSPLY
08A7  39AE     1796        TEST    H'E,2          ; CLOCK(1) DISPLAY ?
08A9  68C2     1797        BS      CM40           ;-NO-
08AB  40       1798        LD      A,#0           ; CLOCK CLEAR
08AC  3F26     1799        ST      A,H'26
08AE  3F36     1800        ST      A,H'36
08B0  3F46     1801        ST      A,H'46
08B2  3F56     1802        ST      A,H'56
08B4  3F77     1803        ST      A,H'77
08B6  CC       1804        LD      H,#H'C         ; CLOCK(1) <--- WORK
08B7  E8       1805        LD      L,#H'8
08B8  43       1806        LD      A,#3
08B9  2251     1807        CALL    STORE
08BB  39AC     1808        TEST    H'C,2          ; CLOCK(2) INPUT ?
08BD  652D     1809        BS      MAIN           ;-NO-
08BF  41       1810        LD      A,#1           ; CLOCK(2) <--- MM

ROM PAGE NO.35
LOC   OBJ      LINE        SOURCE STATEMENT

08C0  68C5     1811        BS      CM42
               1812  ;
08C2  392C     1813 CM40:  SET     H'C,2          ; SET INPUT STATUS
08C4  43       1814        LD      A,#3           ; CLOCK(2) <--- WORK
08C5  CC       1815 CM42:  LD      H,#H'C
08C6  EC       1816        LD      L,#H'C
08C7  2251     1817        CALL    STORE
08C9  652D     1818        BS      MAIN
               1819  ;
               1820  ;
```

```
                        1821 ;        STEP MODE SHORI
                        1822 ;
08CB  3C79              1823 STEP:    LD      A,H'79
08CD  D8                1824          CMPR    A,#8              ; S-MODE KEY ?
08CE  68E6               1825          BS      SM10              ;-NO-
08D0  3C78              1826          LD      A,H'78
08D2  D6                1827          CMPR    A,#6              ; TIME KEY ?
08D3  68D9              1828          BS      SM01              ;-NO-
08D5  2D0D              1829          ST      #H'0,H'D          ; RECALL ONLY
08D7  68DF              1830          BS      SM02
08D9  D3                1831 SM01:    CMPR    A,#3              ; STEP KEY ?
08DA  68DF              1832          BS      SM02
08DC  41                1833          LD      A,#1              ; INKEY <--- FREQ.
08DD  3F78              1834          ST      A,H'78
08DF  21E8              1835 SM02:    CALL    PEEP
08E1  C7                1836          LD      H,#H'7            ; LED(STEP)  OFF
08E2  EE                1837          LD      L,#H'E
08E3  54                1838          CLR     @HL,0
08E4  6C22              1839          BS      MODE
                        1840 ;
08E6  D1                1841 SM10:    CMPR    A,#1              ; J-MODE KEY ?
08E7  0E                1842          TESTP   ZF
08E8  6D93              1843          BS      PLLJM
                        1844 ;
08EA  D0                1845 SM20:    CMPR    A,#0              ; "0"-"9","." ?
08EB  6921              1846          BS      SM30              ;-NO-
08ED  3C78              1847          LD      A,H'78
08EF  DA                1848          CMPR    A,#H'A            ; "." ?
08F0  0E                1849          TESTP   ZF
08F1  652D              1850          BS      MAIN
                        1851 ;
08F3  2D0E              1852          ST      #0,H'E            ; DISPLAY <--- STEP
08F5  3CC0              1853          LD      A,H'C0
08F7  D5                1854          CMPR    A,#5              ; KETASU = 5 ?
08F8  68FD              1855          BS      SM22              ;-NO-
08FA  40                1856          LD      A,#0              ; KETASU <--- 0
08FB  3FC0              1857          ST      A,H'C0
08FD  D3                1858 SM22:    CMPR    A,#3              ; KETASU = 3 ?
08FE  0E                1859          TESTP   ZF
08FF  652D              1860          BS      MAIN

ROM PAGE NO.36 *

0901  D2                1861          CMPR    A,#2              ; KETASU = 2 ?
0902  6CFC              1862          BS      FREQIN            ;-NO-
LOC   OBJ               LINE          SOURCE STATEMENT 0904  3CC2              1863          LD      A,H'C2
0906  D1                1864          CMPR    A,#1              ; 1.. KHZ ?
0907  652D              1865          BS      MAIN              ;-NO-
0909  3CC1              1866          LD      A,H'C1
090B  D0                1867          CMPR    A,#0              ; 10. KHZ ?
090C  652D              1868          BS      MAIN              ;-NO-
090E  3C78              1869          LD      A,H'78
0910  D0                1870          CMPR    A,#0              ; 100 KHZ ?
0911  652D              1871          BS      MAIN              ;-NO-
0913  21E8              1872          CALL    PEEP
0915  21F3              1873          CALL    WAITRT
0917  40                1874          LD      A,#0
0918  30C2              1875          XCH     A,H'C2            ; 100 KHZ DISPLAY
091A  3FC3              1876          ST      A,H'C3
091C  43                1877          LD      A,#3              ; KETASU = 3
091D  3FC0              1878          ST      A,H'C0
091F  652D              1879          BS      MAIN
                        1880 ;
0921  D2                1881 SM30:    CMPR    A,#2              ; CL/RCLL/ENT ?
0922  6941              1882          BS      SM40              ;-NO-
0924  3C78              1883          LD      A,H'78
0926  D3                1884          CMPR    A,#3              ; RECALL KEY ?
```

```
0927 652D      1885           BS      MAIN            ;-NO-
0929 21E8      1886           CALL    PEEP
092B 2D0E      1887           ST      #0,H'E          ; DISPLAY <--- STEP
092D CB        1888           LD      H,#H'B          ; WORK <--- STEP FREQ.
092E E1        1889           LD      L,#H'1
092F 3C86      1890           LD      A,H'86
0931 1A        1891           ST      A,@HL+
0932 3C87      1892           LD      A,H'87
0934 1A        1893           ST      A,@HL+
0935 3C97      1894           LD      A,H'97
0937 1A        1895           ST      A,@HL+
0938 F0        1896           ST      #0,@HL+
0939 F0        1897           ST      #0,@HL+
093A 22B4      1898           CALL    FDSPLY
093C 45        1899           LD      A,#5            ; KETASU <--- 5
093D 3FC0      1900           ST      A,H'C0
093F 652D      1901           BS      MAIN
               1902   ;

ROM PAGE NO.37 *

0941 D4        1903 SM40:     CMPR    A,#4            ; IN-KEY = UP/DOWN ?
0942 652D      1904           BS      MAIN            ;-NO-
0944 3C78      1905           LD      A,H'78
0946 D0        1906           CMPR    A,#0            ; IN-KEY = UP ?
0947 694D      1907           BS      SM42            ;-NO-
0949 2D20      1908           ST      #H'2,H'D        ; UP-KEY MODE
094B 6952      1909           BS      SM44
094D D1        1910 SM42:     CMPR    A,#1            ; IN-KEY = DOWN ?
094E 652D      1911           BS      MAIN            ;-NO-
0950 2D1D      1912           ST      #H'1,H'D        ; DOWN-KEY MODE
0952 C6        1913 SM44:     LD      H,#H'6          ; TIMER CLEAR
0953 E8        1914           LD      L,#H'8

LOC  OBJ       LINE           SOURCE STATEMENT 0904 3CC2      1863           LD      A,H'C2
0906 D1        1864           CMPR    A,#1            ; 1.. KHZ ?
0907 652D      1865           BS      MAIN            ;-NO-
0909 3CC1      1866           LD      A,H'C1
090B D0        1867           CMPR    A,#0            ; 10.. KHZ ?
090C 652D      1868           BS      MAIN            ;-NO-
090E 3C78      1869           LD      A,H'78
0910 D0        1870           CMPR    A,#0            ; 100 KHZ ?
0911 652D      1871           BS      MAIN            ;-NO-
0913 21E8      1872           CALL    PEEP
0915 21F3      1873           CALL    WAITRT
0917 40        1874           LD      A,#0
0918 3DC2      1875           XCH     A,H'C2          ; 100 KHZ DISPLAY
091A 3FC3      1876           ST      A,H'C3
091C 43        1877           LD      A,#3            ; KETASU = 3
091D 3FC0      1878           ST      A,H'C0
091F 652D      1879           BS      MAIN
               1880   ;
0921 D2        1881 SM30:     CMPR    A,#2            ; CL/RCLL/ENT ?
0922 6941      1882           BS      SM40            ;-NO-
0924 3C78      1883           LD      A,H'78
0926 D3        1884           CMPR    A,#3            ; RECALL KEY ?
0927 652D      1885           BS      MAIN            ;-NO-
0929 21E8      1886           CALL    PEEP
092B 2D0E      1887           ST      #0,H'E          ; DISPLAY <--- STEP
092D CB        1888           LD      H,#H'B          ; WORK <--- STEP FREQ.
092E E1        1889           LD      L,#H'1
092F 3C86      1890           LD      A,H'86
0931 1A        1891           ST      A,@HL+
0932 3C87      1892           LD      A,H'87
0934 1A        1893           ST      A,@HL+
0935 3C97      1894           LD      A,H'97
```

```
0937 1A      1895          ST     A,aHL+
0938 F0      1896          ST     #0,aHL+
0939 F0      1897          ST     #0,aHL+
093A 22B4    1898          CALL   FDSPLY
093C 45      1899          LD     A,#5           ; KETASU <--- 5
093D 3FC0    1900          ST     A,H'C0
093F 652D    1901          BS     MAIN
             1902 ;

ROM PAGE NO.37 *

0941 D4      1903 SM40:    CMPR   A,#4           ; IN-KEY = UP/DOWN ?
0942 652D    1904          BS     MAIN           ;-NO-
0944 3C78    1905          LD     A,H'78
0946 D0      1906          CMPR   A,#0           ; IN-KEY = UP ?
0947 694D    1907          BS     SM42           ;-NO-
0949 2D2D    1908          ST     #H'2,H'D       ; UP-KEY MODE
094B 6952    1909          BS     SM44
094D D1      1910 SM42:    CMPR   A,#1           ; IN-KEY = DOWN ?
094E 652D    1911          BS     MAIN           ;-NO-
0950 2D1D    1912          ST     #H'1,H'D       ; DOWN-KEY MODE
0952 C6      1913 SM44:    LD     H,#H'6         ; TIMER CLEAR
0953 E8      1914          LD     L,#H'8

LOC  OBJ     LINE          SOURCE STATEMENT

0954 F0      1915          ST     #0,aHL+
0955 F0      1916          ST     #0,aHL+
0956 F0      1917          ST     #0,aHL+
0957 3967    1918          CLR    H'7,2          ; 300MS TIMER SET
0959 3926    1919          SET    H'6,2
095B 2DA8    1920          ST     #H'A,H'8       ; KEY REQUEST SET
095D 3919    1921          SET    H'9,1
095F 3909    1922          SET    H'9,0
             1923 ;
0961 CD      1924          LD     H,#H'D         ; WORK <--- CURRENT
0962 E1      1925          LD     L,#H'1
0963 44      1926          LD     A,#4
0964 223F    1927          CALL   LOAD
0966 C8      1928          LD     H,#H'8         ; WORK1 <--- WORK
0967 EB      1929          LD     L,#H'B
0968 44      1930          LD     A,#4
0969 2251    1931          CALL   STORE
096B 3CC0    1932          LD     A,H'C0         ; KETASU = 0 ?
096D 0E      1933          TESTP  ZF
096E 6934    1934          BS     SM60
0970 3CC3    1935          LD     A,H'C3         ; S-FREQ. <--- DISPLAY
0972 DF      1936          CMPR   A,#H'F
0973 6976    1937          BS     SM52
0975 40      1938          LD     A,#0
0976 3F97    1939 SM52:    ST     A,H'97
0978 3CC2    1940          LD     A,H'C2
097A DF      1941          CMPR   A,#H'F
097B 697E    1942          BS     SM54
097D 40      1943          LD     A,#0
097E 3F87    1944 SM54:    ST     A,H'87

ROM PAGE NO.38

0980 3CC1    1945          LD     A,H'C1
0982 3F86    1946          ST     A,H'86
0984 C9      1947 SM60:    LD     H,#H'9         ; WORK2 <--- STEP FREQ
0985 EB      1948          LD     L,#H'B
0986 3C86    1949          LD     A,H'86
0988 1A      1950          ST     A,aHL+
0989 3C87    1951          LD     A,H'87
098B 1A      1952          ST     A,aHL+
098C 3C97    1953          LD     A,H'97
```

```
098E 1A       1954           ST      A,aHL+
098F F0       1955           ST      #0,aHL+
0990 F0       1956           ST      #0,aHL+
0991 39DD     1957           TESTP   H'D,1            ; ZENKAI = UP ?
0993 699E     1958           BS      SM62
0995 EB       1959           LD      L,#H'B
0996 2440     1960           CALL    SUB              ; W(1) <--- W(1) - W(2)
0998 2345     1961           CALL    WAVEC2           ; F-BAND CHECK
099A 652D     1962           BS      MAIN
099C 69A4     1963           BS      SM64
              1964 ;
099E 2400     1965 SM62:     CALL    ADDS             ; W(1) <--- W(1) + W(2)
09A0 2345     1966           CALL    WAVEC2
LOC  OBJ      LINE           SOURCE STATEMENT

09A2 652D     1967           BS      MAIN
              1968 ;
09A4 21E8     1969 SM64:     CALL    PEEP
09A6 2D1E     1970           ST      #1,H'E           ; FREQ. DISPLAY
09A8 40       1971           LD      A,#0             ; KETASU = 0
09A9 3FC0     1972           ST      A,H'C0
09AB C8       1973           LD      H,#H'8           ; NEW FREQ. DISPLAY
09AC EB       1974           LD      L,#H'B
09AD 44       1975           LD      A,#4
09AE 223F     1976           CALL    LOAD
09B0 6D83     1977           BS      PLLST
              1978 ;
              1979 ;
              1980 ;
              1981 ;        MANUAL MODE SHORI
              1982 ;
09B2 3C79     1983 MANUAL:   LD      A,H'79
09B4 D8       1984           CMPR    A,#8             ; S-MODE KEY ?
09B5 69D8     1985           BS      MN10             ;-NO-
09B7 3C78     1986           LD      A,H'78
09B9 D6       1987           CMPR    A,#6             ; TIME KEY ?
09BA 69C0     1988           BS      MN01             ;-NO-
09BC 2D00     1989           ST      #H'0,H'D         ; RECALL ONLY
09BE 69C6     1990           BS      MN02

ROM PAGE NO.39

09C0 D4       1991 MN01:     CMPR    A,#4             ; MANUAL KEY ?
09C1 69C6     1992           BS      MN02             ;-NO-
09C3 41       1993           LD      A,#1             ; IN-KEY <--- FREQ.
09C4 3F78     1994           ST      A,H'78
09C6 21E8     1995 MN02:     CALL    PEEP
09C8 C6       1996           LD      H,#6             ; LED(MANUAL) OFF
09C9 EE       1997           LD      L,#H'E
09CA 54       1998           CLR     aHL,0
09CB C7       1999           LD      H,#H'7           ; LED(KEY)   ON
09CC EE       2000           LD      L,#H'E
09CD 51       2001           SET     aHL,1
09CE EF       2002           LD      L,#H'F           ; LED(C-MODE) OFF
09CF F0       2003           ST      #0,aHL+
09D0 3844     2004           CLR     %04,0            ; MANUAL-CTL OFF
09D2 3854     2005           CLR     %04,1
09D4 3864     2006           CLR     %04,2
09D6 6C22     2007           BS      MODE
              2008 ;
09D8 D1       2009 MN10:     CMPR    A,#1             ; J-MODE KEY ?
09D9 652D     2010           BS      MAIN             ;-NO-
09DB 6D93     2011           BS      PLLJM
              2012 ;
              2013 ;
              2014 ;        MEMORY MODE SHORI
              2015 ;
09DD 3C79     2016 MEMORY:   LD      A,H'79
```

```
09DF D8      2017          CMPR    A,#8            ; S-MODE KEY ?
09E0 69FE    2018          BS      MM10            ;-NO-
LOC  OBJ     LINE                  SOURCE STATEMENT

09E2 3C78    2019          LD      A,H'78
09E4 D6      2020          CMPR    A,#6            ; TIME KEY ?
09E5 69F1    2021          BS      MM01            ;-NO-
09E7 3CD6    2022          LD      A,H'D6
09E9 D0      2023          CMPR    A,#0            ; F-LINK = 0 ?
09EA 0E      2024          TESTP   ZF
09EB 652D    2025          BS      MAIN
09ED 2D8D    2026          ST      #H'8,H'D        ; MODE = SET TIME
09EF 69F7    2027          BS      MM02
             2028 ;
09F1 D5      2029 MM01:    CMPR    A,#5            ; MEMO KEY ?
09F2 652D    2030          BS      MAIN            ;-NO-
09F4 41      2031          LD      A,#1            ; KEY <--- FREQ.
09F5 3F78    2032          ST      A,H'78
09F7 21E8    2033 MM02:    CALL    PEEP
09F9 C6      2034          LD      H,#H'6
09FA EF      2035          LD      L,#H'F
09FB 57      2036          CLR     aHL,3           ; LED(MEMO) OFF
09FC 6C22    2037          BS      MODE
             2038 ;
09FE 3C79    2039 MM10:    LD      A,H'79

ROM PAGE NO.40

0A00 D0      2040          CMPR    A,#0            ; "0"-"9","." ?
0A01 6A1C    2041          BS      MM20            ;-NO-
0A03 3C78    2042          LD      A,H'78
0A05 DA      2043          CMPR    A,#H'A          ; "." ?
0A06 0E      2044          TESTP   ZF
0A07 652D    2045          BS      MAIN
0A09 21E8    2046          CALL    PEEP
0A0B 2291    2047          CALL    CLEAR           ; IN-KEY DISPLAY
0A0D 3C78    2048          LD      A,H'78
0A0F 3FC1    2049          ST      A,H'C1
0A11 D0      2050          CMPR    A,#0
0A12 6A17    2051          BS      MM12
0A14 41      2052          LD      A,#1
0A15 3FC2    2053          ST      A,H'C2
0A17 41      2054 MM12:    LD      A,#1            ; KETASU <--- 1
0A18 3FC0    2055          ST      A,H'C0
0A1A 652D    2056          BS      MAIN
             2057 ;
0A1C 3C79    2058 MM20:    LD      A,H'79
0A1E D2      2059          CMPR    A,#2            ; CL/ENT/RCLL ?
0A1F 652D    2060          BS      MAIN            ;-NO-
0A21 3CC0    2061          LD      A,H'C0
0A23 D0      2062          CMPR    A,#0            ; KETASU = 0 ?
0A24 0E      2063          TESTP   ZF
0A25 652D    2064          BS      MAIN
0A27 3C78    2065          LD      A,H'78
0A29 D1      2066          CMPR    A,#1            ; CLEAR KEY ?
0A2A 6A3E    2067          BS      MM30            ;-NO-
0A2C 21E8    2068          CALL    PEEP
0A2E 3CC1    2069          LD      A,H'C1          ; F-CURR(I) = 10KHZ AM
0A30 D0      2070          CMPR    A,#0
LOC  OBJ     LINE                  SOURCE STATEMENT

0A31 6A34    2071          BS      MM22
0A33 4A      2072          LD      A,#10
0A34 30      2073 MM22:    XCH     A,H
0A35 E0      2074          LD      L,#H'0
0A36 F4      2075          ST      #4,aHL+
0A37 44      2076          LD      A,#4
0A38 2238    2077          CALL    MCLER
```

```
0A3A E2      2078              LD     L,#H'2
0A3B F1      2079              ST     #1,aHL+
0A3C 652D    2080              BS     MAIN
             2081 ;
0A3E D0      2082 MM30:        CMPR   A,#0              ; ENTRY KEY ?
0A3F 6A63    2083              BS     MM40              ;-NO-
```

ROM PAGE NO.41 *

```
0A41 21E8    2084              CALL   PEEP
0A43 3CD0    2085              LD     A,H'00            ; WORK <--- CURRENT
0A45 3FB0    2086              ST     A,H'B0
0A47 CD      2087              LD     H,#H'D
0A48 E1      2088              LD     L,#1
0A49 44      2089              LD     A,#4
0A4A 223F    2090              CALL   LOAD
0A4C 3CC1    2091              LD     A,H'C1            ; F-BANK NO. <--- DSPL'
0A4E D0      2092              CMPR   A,#0
0A4F 6A52    2093              BS     MM32
0A51 4A      2094              LD     A,#H'A
0A52 30      2095 MM32:        XCH    A,H               ; F-BANK(I) <--- WORK
0A53 E0      2096              LD     L,#H'0
0A54 3CB0    2097              LD     A,H'B0
0A56 1A      2098              ST     A,aHL+
0A57 44      2099              LD     A,#4
0A58 2251    2100              CALL   STORE
0A5A C7      2101              LD     H,#H'7            ; S-MODE = FREQ.
0A5B E8      2102              LD     L,#H'8
0A5C F1      2103              ST     #1,aHL+
0A5D F8      2104              ST     #8,aHL+
0A5E C6      2105              LD     H,#H'6            ; LED(MEMO) OFF
0A5F EF      2106              LD     L,#H'F
0A60 57      2107              CLR    aHL,3
0A61 6C22    2108              BS     MODE
             2109 ;
0A63 D3      2110 MM40:        CMPR   A,#3              ; RECALL KEY ?
0A64 652D    2111              BS     MAIN              ;-NO-
0A66 21E8    2112              CALL   PEEP
0A68 3CC1    2113              LD     A,H'C1
0A6A D0      2114              CMPR   A,#0
0A6B 6A6E    2115              BS     MM42
0A6D 4A      2116              LD     A,#10
0A6E 3FD6    2117 MM42:        ST     A,H'D6            ; F-BANK NO. STORE
0A70 30      2118              XCH    A,H               ; F-BANK(I) DISPLAY
0A71 E0      2119              LD     L,#H'0
0A72 0C      2120              LD     A,aHL
0A73 3FB0    2121              ST     A,H'B0
0A75 E1      2122              LD     L,#H'1
```

```
LOC  OBJ     LINE              SOURCE STATEMENT

0A76 44      2123              LD     A,#4
0A77 223F    2124              CALL   LOAD
0A79 40      2125              LD     A,#0              ; KETASU <--- 0
0A7A 3FC0    2126              ST     A,H'C0
0A7C 6D83    2127              BS     PLLST
             2128 ;
             2129 ;
             2130 ;    TIMER MODE SHORI
             2131 ;
0A7E 3C79    2132 TIME:        LD     A,H'79
```

ROM PAGE NO.42

```
0A80 D8      2133              CMPR   A,#8              ; S-MODE KEY ?
0A81 6A8C    2134              BS     TM10              ;-NO-
0A83 3C78    2135              LD     A,H'78
0A85 D6      2136              CMPR   A,#6              ; TIME KEY ?
0A86 6520    2137              BS     MAIN              ;-NO-
```

```
0A88 21E8    2138          CALL    PEEP
0A8A 6BBE    2139          BS      TM80
             2140  ;
0A8C D0      2141  TM10:   CMPR    A,#0              ; "0"-"9","."  ?
0A8D 6AB6    2142          BS      TM20              ;-NO-
0A8F 39BD    2143          TEST    H'D,3             ; RECALL MODE ?
0A91 6A97    2144          BS      TM12
0A93 39CD    2145          TESTP   H'D,0             ; BANK NO. INPUT ZUMI ?
0A95 6AB0    2146          BS      TM14
0A97 3C78    2147  TM12:   LD      A,H'78
0A99 09      2148          DEC     A
0A9A D4      2149          CMPR    A,#4              ; "1"-"5" ?
0A9B 06      2150          TEST    CF
0A9C 652D    2151          BS      MAIN              ;-NO-
             2152  ;
0A9E 390D    2153          SET     H'D,0             ; BANK-NO. FLAG ON
0AA0 395D    2154          CLR     H'D,1
0AA2 396D    2155          CLR     H'D,2
0AA4 2291    2156          CALL    CLEAR             ; IN-VALUE DISPLAY
0AA6 3C78    2157          LD      A,H'78
0AA8 3FC1    2158          ST      A,H'C1
0AAA 3FD7    2159          ST      A,H'D7            ; T-BANK NO. <--- INPUT
0AAC 21E8    2160          CALL    PEEP
0AAE 652D    2161          BS      MAIN
             2162  ;
0AB0 39AD    2163  TM14:   TEST    H'D,2             ; OFF TIME INPUT ZUMI ?
0AB2 6D41    2164          BS      CLOKIN            ;-NO-
0AB4 652D    2165          BS      MAIN
             2166  ;
0AB6 D4      2167  TM20:   CMPR    A,#4              ; ON/OFF ?
0AB7 6AF7    2168          BS      TM30              ;-NO-
0AB9 39BD    2169          TEST    H'D,3             ; RECALL MODE ?
0ABB 652D    2170          BS      MAIN
0ABD 3CC0    2171          LD      A,H'C0
0ABF 0E      2172          TESTP   ZF                ; KETASU = 0 ?

ROM PAGE NO.43
LOC  OBJ      LINE          SOURCE STATEMENT

0B15 21E8    2224  TM33:   CALL    PEEP
0B17 CB      2225          LD      H,#H'8
0B18 E8      2226          LD      L,#H'8            ; ON TIME DISPLAY
0B19 43      2227          LD      A,#3
0B1A 223F    2228          CALL    LOAD
0B1C 22D9    2229          CALL    TDSPLY
0B1E 6B46    2230          BS      TM38
             2231  ;
0B20 399D    2232  TM34:   TEST    H'D,1             ; ON TIME INPUT ZUMI ?
0B22 6B30    2233          BS      TM36              ;-NO-
0B24 395D    2234          CLR     H'D,1             ; ON TIME INPUT FLAG OFF
0B26 21E8    2235  TM35:   CALL    PEEP
0B28 2291    2236          CALL    CLEAR             ; T-BANK NO. DISPLAY
0B2A 3CD7    2237          LD      A,H'D7
0B2C 3FC1    2238          ST      A,H'C1
0B2E 6B46    2239          BS      TM38
             2240  ;
0B30 398D    2241  TM36:   TEST    H'D,0             ; BANK NO. INPUT ZUMI ?
0B32 652D    2242          BS      MAIN
0B34 21E8    2243          CALL    PEEP
0B36 394D    2244          CLR     H'D,0             ; BANK NO. INPUT FLAG OF
0B38 3CD0    2245          LD      A,H'D0            ; WORK <--- CURRENT
0B3A 3FB0    2246          ST      A,H'B0
0B3C CD      2247          LD      H,#H'D
0B3D E1      2248          LD      L,#H'1
0B3E 44      2249          LD      A,#4
0B3F 223F    2250          CALL    LOAD

ROM PAGE NO.45 *
```

```
0B41 22B4      2251            CALL    FDSPLY          ; FREQ. DISPLAY
0B43 40        2252            LD      A,#0            ; T-BANK NO <--- 0
0B44 3FD7      2253            ST      A,H'D7
0B46 40        2254 TM38:      LD      A,#0            ; KETASU <--- 0
0B47 3FC0      2255            ST      A,H'C0
0B49 652D      2256            BS      MAIN
               2257 ;
0B4B D2        2258 TM40:      CMPR    A,#2            ; TIMECL KEY ?
0B4C 685B      2259            BS      TM50            ;-NO-
0B4E 39D0      2260            TEST    H'D,0           ; BANK NO. INPUT ZUMI ?
0B50 652D      2261            BS      MAIN
0B52 21E8      2262            CALL    PEEP
0B54 3CD7      2263            LD      A,H'D7          ; T-CURRENT CLEAR
0B56 30        2264            XCH     A,H
0B57 E7        2265            LD      L,#H'7
0B58 F0        2266            ST      #0,aHL+
0B59 68BE      2267            BS      TM30
               2268 ;
0B5B D0        2269 TM50:      CMPR    A,#0            ; ENTRY KEY ?
0B5C 6878      2270            BS      TM60            ;-NO-
0B5E 39AD      2271            TEST    H'D,2           ; OFF-TIME INPUT ZUMI ?
0B60 652D      2272            BS      MAIN            ;-NO-
0B62 39BD      2273            TEST    H'D,3           ; TIME-SET MODE ?
0B64 652D      2274            BS      MAIN            ;-NO-
0B66 21E8      2275            CALL    PEEP

LOC   OBJ      LINE            SOURCE STATEMENT

0B68 3CD7      2276            LD      A,H'D7          ; T-BANK(I) <--- CURR.
0B6A 30        2277            XCH     A,H
0B6B E7        2278            LD      L,#H'7
0B6C 3CD6      2279            LD      A,H'D6
0B6E 1A        2280            ST      A,aHL+
0B6F 296C      2281            XCH     HL,H'6C
0B71 CB        2282            LD      H,#H'B
0B72 E8        2283            LD      L,#H'8
0B73 47        2284            LD      A,#7
0B74 2255      2285            CALL    MOVE
0B76 6B8E      2286            BS      TM80
               2287 ;
0B78 D3        2288 TM60:      CMPR    A,#3            ; RECALL KEY ?
0B79 652D      2289            BS      MAIN            ;-NO-
0B7B 398D      2290            TEST    H'D,0           ; BANK NO. INPUT ZUMI ?
0B7D 652D      2291            BS      MAIN
0B7F 390E      2292            SET     H'E,0           ; BANK NO. ON

ROM PAGE NO.46 *

0B81 3CD7      2293            LD      A,H'D7
0B83 30        2294            XCH     A,H
0B84 E7        2295            LD      L,#7
0B85 40        2296            LD      A,#0
0B86 16        2297            CMPR    A,aHL
0B87 0E        2298            TESTP   ZF
0B88 652D      2299            BS      MAIN
0B8A 21E8      2300            CALL    PEEP
0B8C 44        2301            LD      A,#4            ; KETASU : 10-SEC TIMER
0B8D 3FC0      2302            ST      A,H'C0
0B8F 397D      2303            CLR     H'D,3           ; SET RECALL-MODE
0B91 399D      2304            TEST    H'D,1           ; ON TIME INPUT ZUMI ?
0B93 6BAF      2305            BS      TM74
0B95 39AD      2306            TEST    H'D,2           ; OFF TIME INPUT ZUMI ?
0B97 6BA5      2307            BS      TM72
0B99 EC        2308            LD      L,#H'C
0B9A 43        2309            LD      A,#3
0B9B 223F      2310            CALL    LOAD            ; WORK <--- OFF TIME
0B9D 395D      2311            CLR     H'D,1           ; ON-OFF TIME FLAG OFF
0B9F 396D      2312            CLR     H'D,2
0BA1 22D9      2313            CALL    TDSPLY          ; DISPLAY <--- TIME
```

```
0BA3 652D        2314            BS      MAIN
                 2315    ;
0BA5 E8          2316    TM72:   LD      L,#8           ; WORK <--- ON TIME
0BA6 43          2317            LD      A,#3
0BA7 223F        2318            CALL    LOAD
0BA9 392D        2319            SET     H'D,2          ; OFF TIME FLAG ON
0BAB 22D9        2320            CALL    TDSPLY
0BAD 652D        2321            BS      MAIN
                 2322    ;
0BAF E7          2323    TM74:   LD      L,#H'7
0BB0 0C          2324            LD      A,aHL
0BB1 30          2325            XCH     A,H
0BB2 E0          2326            LD      L,#0
0BB3 0C          2327            LD      A,aHL

LOC  OBJ         LINE            SOURCE STATEMENT

0AC0 652D        2173            BS      MAIN
0AC2 3C78        2174            LD      A,H'78
0AC4 D2          2175            CMPR    A,#2           ; ON KEY ?
0AC5 6AD8        2176            BS      TM22           ;-NO-
0AC7 39DD        2177            TESTP   H'D,1          ; ON TIME INPUT ?
0AC9 652D        2178            BS      MAIN
0ACB 21E8        2179            CALL    PEEP
0ACD 2329        2180            CALL    TCONV
0ACF 2360        2181            CALL    TCHK           ; TIME CHECK
0AD1 6CDA        2182            BS      ERDISP
0AD3 391D        2183            SET     H'D,1          ; ON TIME INPUT FLAG 0
0AD5 E8          2184            LD      L,#H'8         ; ON TIME <--- WORK
0AD6 6AEE        2185            BS      TM28
                 2186    ;
0AD8 D3          2187    TM22:   CMPR    A,#3           ; OFF KEY ?
0AD9 652D        2188            BS      MAIN           ;-NO-
0ADB 399D        2189            TEST    H'D,1          ; ON  TIME INPUT ?
0ADD 652D        2190            BS      MAIN           ;-NO-
0ADF 39ED        2191            TESTP   H'D,2          ; OFF TIME INPUT ?
0AE1 652D        2192            BS      MAIN
0AE3 21E8        2193            CALL    PEEP
0AE5 2329        2194            CALL    TCONV          ; WORK <--- DISPLAY
0AE7 2360        2195            CALL    TCHK
0AE9 6CDA        2196            BS      ERDISP
0AEB 392D        2197            SET     H'D,2          ; OFF TIME INPUT FLAG
0AED EC          2198            LD      L,#H'C         ; OFF TIME <--- WORK
0AEE CB          2199    TM28:   LD      H,#H'B
0AEF 43          2200            LD      A,#3
0AF0 2251        2201            CALL    STORE
0AF2 40          2202            LD      A,#0           ; KETASU <--- 0
0AF3 3FC0        2203            ST      A,H'C0
0AF5 652D        2204            BS      MAIN
                 2205    ;
0AF7 D2          2206    TM30:   CMPR    A,#2           ; CL/ENT/RCLL/TCL ?
0AF8 652D        2207            BS      MAIN           ;-NO-
0AFA 3C78        2208            LD      A,H'78
0AFC D1          2209            CMPR    A,#1           ; CLEAR KEY ?
0AFD 6B4B        2210            BS      TM40           ;-NO-
0AFF 398D        2211            TEST    H'D,3          ; RECALL MODE ?

ROM PAGE NO.44 *

0B01 6B30        2212            BS      TM36
0B03 3CC0        2213            LD      A,H'C0
0B05 D0          2214            CMPR    A,#0           ; KETASU = 0 ?
0B06 0E          2215            TESTP   ZF
0B07 6B0F        2216            BS      TM32
0B09 39DD        2217            TESTP   H'D,1          ; ON TIME INPUT ?
0B0B 6B15        2218            BS      TM33
0B0D 6B26        2219            BS      TM35
```

```
                    2220 ;
0B0F 39AD           2221 TM32:    TEST    H'0,2           ; OFF TIME INPUT ZUMI
0B11 6B20           2222          BS      TM34            ;-NO-
0B13 396D           2223          CLR     H'0,2           ; OFF TIME INPUT FLAG :

LOC  OBJ            LINE          SOURCE STATEMENT

0BB4 3FB0           2328          ST      A,H'80
0BB6 E1             2329          LD      L,#1
0BB7 44             2330          LD      A,#4
0BB8 223F           2331          CALL    LOAD
0BBA 391D           2332          SET     H'0,1           ; ON TIME FLAG ON
0BBC 6D83           2333          BS      PLLST
0BBE C7             2334 TM80:    LD      H,#H'7          ; LED(STIME) OFF
0BBF EF             2335          LD      L,#H'F

ROM PAGE NO.47

0BC0 57             2336          CLR     @HL,3
0BC1 41             2337          LD      A,#1            ; IN-KEY <--- FREQ.
0BC2 3F78           2338          ST      A,H'78
0BC4 6C22           2339          BS      MODE
                    2340 ;
                    2341 ;
                    2342 ;        PROGRAM MODE SHORI
                    2343 ;
0BC6 48             2344 PROGRM:  LD      A,#8            ; PROGRAM KEY ?
0BC7 3E79           2345          CMPR    A,H'79
0BC9 6520           2346          BS      MAIN
0BCB 47             2347          LD      A,#7
0BCC 3E78           2348          CMPR    A,H'78
0BCE 6809           2349          BS      PM10
0BD0 21E8           2350          CALL    PEEP
0BD2 C6             2351          LD      H,#6            ; LED(PROG.) OFF
0BD3 EF             2352          LD      L,#H'F
0BD4 56             2353          CLR     @HL,2
0BD5 3B74           2354          CLR     %04,3           ; PROG.-CTL OFF
0BD7 66A4           2355          BS      PWOF5
                    2356 ;
0BD9 42             2357 PM10:    LD      A,#2            ; CLOCK KEY ?
0BDA 3E78           2358          CMPR    A,H'78
0BDC 652D           2359          BS      MAIN
0BDE 21E8           2360          CALL    PEEP
0BE0 39AE           2361          TEST    H'E,2           ; CLOCK(1) DISPLAY ?
0BE2 6BEB           2362          BS      PM20
0BE4 396E           2363          CLR     H'E,2           ; DISPLAY STATUS SET
0BE6 391E           2364          SET     H'E,1
0BE8 EC             2365          LD      L,#H'C          ; CLOCK2 DISPLAY
0BE9 6C1A           2366          BS      PM32
                    2367 ;
0BEB 399E           2368 PM20:    TEST    H'E,1           ; CLOCK(2) DISPLAY ?
0BED 6C0E           2369          BS      PM30
0BEF 395E           2370          CLR     H'E,1           ; DISPLAY STATUS SET
0BF1 390E           2371          SET     H'E,0
0BF3 3CD7           2372          LD      A,H'D7          ; L-NO(TIME) = 0 ?
0BF5 0E             2373          TESTP   ZF
0BF6 6C05           2374          BS      PM25
0BF8 3CD0           2375          LD      A,H'D0          ; WORK <--- F-CURRENT
0BFA 3FB0           2376          ST      A,H'80
0BFC CD             2377          LD      H,#H'D
0BFD E1             2378          LD      L,#H'1
0BFE 44             2379          LD      A,#4

LOC  OBJ            LINE          SOURCE STATEMENT

0BFF 223F           2380          CALL    LOAD

ROM PAGE NO.48 *

0C01 22B4           2381          CALL    FDSPLY
```

```
0C03 652D     2382           BS     MAIN
              2383  ;
0C05 229A     2384  PM25:    CALL   LEDMCL       ; DISPLAY CLEAR
0C07 2291     2385           CALL   CLEAR
0C09 C7       2386           LD     H,#H'7       ; LED(TIME2) OFF
0C0A EF       2387           LD     L,#H'F
0C0B 55       2388           CLR    @HL,1
0C0C 652D     2389           BS     MAIN
              2390  ;
0C0E 394E     2391  PM30:    CLR    H'E,0        ; DISPLAY STATUS SET
0C10 392E     2392           SET    H'E,2
0C12 3CD7     2393           LD     A,H'D7
0C14 D0       2394           CMPR   A,#0         ; T-LINK = 0 ?
0C15 6C19     2395           BS     PM31         ;-NO-
0C17 229A     2396           CALL   LEDMCL
0C19 E8       2397  PM31:    LD     L,#H'8       ; CLOCK(1) DISPLAY
0C1A CC       2398  PM32:    LD     H,#H'C
0C1B 43       2399           LD     A,#3
0C1C 223F     2400           CALL   LOAD
0C1E 22D9     2401           CALL   TDSPLY
0C20 652D     2402           BS     MAIN
              2403  ;
              2404  ;
              2405  ; 5-9)          SHORI MODE SETTEI SHORI
              2406  ;
0C22 40       2407  MODE:    LD     A,#0         ; KETASU, PERIOD <--- 0
0C23 3FC0     2408           ST     A,H'C0
0C25 3FC6     2409           ST     A,H'C6
0C27 3C78     2410           LD     A,H'78
0C29 D2       2411           CMPR   A,#2         ; S-MODE = CLOCK ?
0C2A 0E       2412           TESTP  ZF
0C2B 6C4C     2413           BS     MD30
0C2D 3CD0     2414           LD     A,H'D0       ; CURRENT DISPLAY
0C2F 3F80     2415           ST     A,H'80
0C31 CD       2416           LD     H,#H'D
0C32 E1       2417           LD     L,#H'1
0C33 44       2418           LD     A,#4
0C34 223F     2419           CALL   LOAD
0C36 22B4     2420           CALL   FDSPLY
              2421  ;
0C38 3C78     2422           LD     A,H'78
0C3A D4       2423           CMPR   A,#4         ; S-MODE = STEP ?
0C3B 0E       2424           TESTP  ZF
0C3C 6C68     2425           BS     MD50
0C3E 3828     2426           OR     A,#H'8       ; S-MODE SETTING

ROM PAGE NO.49

0C40 3F0F     2427           ST     A,H'0F
              2428  ;
 LOC  OBJ     LINE           SOURCE STATEMENT

0C42 2E9F     2429  MD20:    CMPR   H'F,#9       ; FREQ. MODE ?
0C44 8C5B     2430           BS     MD40         ;-NO-
              2431  ;
              2432  ;-------FREQ.   MODE-------
              2433           ST     #H'1,H'E     ; STATUS INITIALIZE
0C46 2D1E     2433           ST     #H'1,H'E     ; STATUS INITIALIZE
0C48 2D0D     2434           ST     #H'0,H'D
0C4A 652D     2435           BS     MAIN
              2436  ;
              2437  ;-------CLOCK   MODE-------
0C4C 2DAF     2438  MD30:    ST     #H'A,H'F     ; S-MODE = CLOCK
0C4E 2D4E     2439           ST     #H'4,H'E     ; STATUS INITIALIZE
0C50 2D0D     2440           ST     #H'0,H'D
0C52 CC       2441           LD     H,#H'C       ; CLOCK(1) DISPLAY
0C53 E8       2442           LD     L,#H'8
0C54 43       2443           LD     A,#3
```

```
0C55 223F    2444           CALL    LOAD
0C57 22D9    2445           CALL    TDSPLY
0C59 652D    2446           BS      MAIN
             2447 ;
0C5B 2EBF    2448 MD40:     CMPR    H'F,#H'8         ; STEP MODE ?
0C5D 6C96    2449           BS      MD60             ;-NO-
             2450 ;
             2451 ;------STEP     MODE-------
0C5F 201E    2452           ST      #H'1,H'E         ; S-STATUS SET
0C61 2D0D    2453           ST      #H'0,H'D
0C63 C7      2454           LD      H,#H'7           ; LED(STEP) ON
0C64 EE      2455           LD      L,#H'E
0C65 50      2456           SET     @HL,0
0C68 652D    2457           BS      MAIN
             2458 ;
             2459 ;------MANUAL   MODE-------
0C68 3CC5    2460 MD50:     LD      A,H'C5
0C6A D3      2461           CMPR    A,#3             ; 30-MHZ ?
0C6B 6C71    2462           BS      MD52             ;-NO-
0C6D 2DBD    2463           ST      #H'B,H'D         ; OVER FLAG SET
0C6F 6C83    2464           BS      MD56
             2465 ;
0C71 3CC2    2466 MD52:     LD      A,H'C2
0C73 DF      2467           CMPR    A,#H'F
0C74 6C7F    2468           BS      MD54
0C76 3CC1    2469           LD      A,H'C1
0C78 D1      2470           CMPR    A,#1             ; 10-KHZ ?
0C79 6C7F    2471           BS      MD54             ;-NO-
0C7B 2D7D    2472           ST      #H'7,H'D         ; UNDER FLAG SET
0C7D 6C83    2473           BS      MD56
             2474 ;
0C7F 2D1E    2475 MD54:     ST      #1,H'E           ; S-STATUS SET

ROM PAGE NO.50 *

0C81 2D3D    2476           ST      #3,H'D
0C83 C6      2477 MD56:     LD      H,#6             ; MANUAL(LED) ON
0C84 EE      2478           LD      L,#H'E
0C85 50      2479           SET     @HL,0
0C86 C7      2480           LD      H,#H'7           ; LED(KEY) OFF
LOC  OBJ     LINE           SOURCE STATEMENT

0C87 EE      2481           LD      L,#H'E
0C88 55      2482           CLR     @HL,1
0C89 40      2483           LD      A,#0
0C8A 3F96    2484           ST      A,H'96           ; FREQ. CTR = 0
0C8C 3B24    2485           SET     %04,2            ; MANUAL-CTL ON
0C8E 3B14    2486           SET     %04,1
0C90 3B04    2487           SET     %04,0
0C92 2DCF    2488           ST      #H'C,H'F         ; S-MODE = MANUAL
0C94 652D    2489           BS      MAIN
             2490 ;
0C96 2EDF    2491 MD60:     CMPR    H'F,#H'D         ; MEMO MODE ?
0C98 6CA6    2492           BS      MD70             ;-NO-
             2493 ;
             2494 ;------MEMORY   MODE-------
0C9A 2D1E    2495           ST      #1,H'E           ; S-STATUS SET
0C9C 2D0D    2496           ST      #0,H'D
0C9E C6      2497           LD      H,#H'6           ; LED(MEMO) ON
0C9F EF      2498           LD      L,#H'F
0CA0 53      2499           SET     @HL,3
0CA1 40      2500           LD      A,#0             ; F-LINK = 0
0CA2 3FD6    2501           ST      A,H'D6
0CA4 652D    2502           BS      MAIN
             2503 ;
0CA6 2EEF    2504 MD70:     CMPR    H'F,#H'E         ; TIME MODE ?
```

```
0CA8  6CB4    2505            BS      MD80            ;-NO-
                2506   ;
                2507   ;-------TIME      MODE-------
0CAA  2D1E    2508            ST      #H'1,H'E        ; S-STATUS SET
0CAC  C7      2509            LD      H,#H'7          ; LED(STIME) ON
0CAD  EF      2510            LD      L,#H'F
0CAE  53      2511            SET     @HL,3
0CAF  40      2512            LD      A,#0            ; T-LINK = 0
0CB0  3FD7    2513            ST      A,H'D7
0CB2  652D    2514            BS      MAIN
                2515   ;
0CB4  2EFF    2516   MD80:    CMPR    H'F,#H'F        ; PROGRAM MODE ?
0CB6  652D    2517            BS      MAIN            ;-NO-
                2518   ;
                2519   ;-------PROGRAM   MODE-------
0CB8  2D4E    2520            ST      #4,H'E          ; S-STATUS SET
0CBA  2D0D    2521            ST      #0,H'D
0CBC  C6      2522            LD      H,#H'6          ; LED(PROG.) ON
0CBD  EF      2523            LD      L,#H'F
0CBE  52      2524            SET     @HL,2
0CBF  C7      2525            LD      H,#H'7          ; LED(KEY) OFF

ROM PAGE NO.51

0CC0  EE      2526            LD      L,#H'E
0CC1  55      2527            CLR     @HL,1
0CC2  CC      2528            LD      H,#H'C          ; CLOCK(1) DISPLAY
0CC3  E8      2529            LD      L,#H'8
0CC4  43      2530            LD      A,#3
0CC5  223F    2531            CALL    LOAD
0CC7  22D9    2532            CALL    TDSPLY

LOC  OBJ     LINE            SOURCE STATEMENT

0CC9  40      2533            LD      A,#0            ; T-LINK = 0
0CCA  3FD7    2534            ST      A,H'D7
0CCC  229A    2535            CALL    LEDMCL          ; LED(JMODE) OFF
0CCE  2C04    2536            OUT     #0,%04          ; SUPPLY OFF
0CD0  2C09    2537            OUT     #0,%09
0CD2  3BE5    2538   MD88:    TESTP   %05,2           ; PEEP OFF ?
0CD4  6CD2    2539            BS      MD88            ;-NO-
0CD6  2C05    2540            OUT     #0,%05
0CD8  652D    2541            BS      MAIN
                2542   ;
                2543   ;        ERROR DISPLAY SHORI
                2544   ;
0CDA  393E    2545   ERDISP:  SET     H'E,3           ; ERROR FLAG SET
0CDC  CC      2546            LD      H,#H'C
0CDD  E1      2547            LD      L,#H'1
0CDE  FC      2548            ST      #H'C,@HL+
0CDF  FD      2549            ST      #H'D,@HL+
0CE0  FC      2550            ST      #H'C,@HL+
0CE1  FC      2551            ST      #H'C,@HL+
0CE2  FB      2552            ST      #H'B,@HL+
0CE3  F0      2553            ST      #0,@HL+
0CE4  652D    2554            BS      MAIN
                2555   ;

ROM PAGE NO.51

0CFC            2556            ORG     H'CFC
                2557   ;
                2558   ;
                2559   ;        FREQUENCY NYURYOKU SHORI
                2560   ;
0CFC  3C78    2561   FREQIN:  LD      A,H'78
0CFE  DA      2562            CMPR    A,#H'A          ; "." KEY ?
0CFF  9A      2563            BSS     FI20            ;-NO-
                2564   ;
```

ROM PAGE NO.52

```
0D00 3CC0      2565 FI10:   LD      A,H'C0       ; KETASU = 0 ?
0D02 0E        2566         TESTP   ZF
0D03 8E        2567         BSS     FI12
0D04 3CC6      2568         LD      A,H'C6
0D06 D0        2569         CMPR    A,#0         ; PERIOD = 0 ?
0D07 BF        2570         BSS     FI90         ;-NO-
0D08 3CC0      2571         LD      A,H'C0
0D0A D2        2572         CMPR    A,#2         ; KETASU > 2 ?
0D0B 06        2573         TEST    CF
0D0C BF        2574         BSS     FI90
0D0D 94        2575         BSS     FI14         ;-NO-
               2576 ;
0D0E 2291      2577 FI12:   CALL    CLEAR        ; DISPLAY CLEAR
0D10 CC        2578         LD      H,#H'C
0D11 E0        2579         LD      L,#H'0
0D12 F1        2580         ST      #1,@HL+      ; KETASU <--- 1
0D13 F0        2581         ST      #0,@HL+      ; "0" DISPLAY

LOC  OBJ       LINE                SOURCE STATEMENT

0D14 21E8      2582 FI14:   CALL    PEEP
0D16 41        2583         LD      A,#1         ; PERIOD SET
0D17 3FC6      2584         ST      A,H'C6
0D19 BF        2585         BSS     FI90
               2586 ;
0D1A 3CC0      2587 FI20:   LD      A,H'C0
0D1C D0        2588         CMPR    A,#0         ; KETASU = 0 ?
0D1D A5        2589         BSS     FI22         ;-NO-
0D1E 3C78      2590         LD      A,H'78       ; INPUT = 0 ?
0D20 0E        2591         TESTP   ZF
0D21 BF        2592         BSS     FI90
0D22 2291      2593         CALL    CLEAR
0D24 AD        2594         BSS     FI26
               2595 ;
0D25 D5        2596 FI22:   CMPR    A,#5         ; KETASU = 5 ?
0D26 A8        2597         BSS     FI24
0D27 BF        2598         BSS     FI90
               2599 ;
0D28 3CC6      2600 FI24:   LD      A,H'C6
0D2A D4        2601         CMPR    A,#4         ; PERIOD = 4 ?
0D2B AD        2602         BSS     FI26
0D2C BF        2603         BSS     FI90
               2604 ;
0D2D 21E8      2605 FI26:   CALL    PEEP
0D2F CC        2606         LD      H,#H'C       ; DISPLAY <--- L-SHIFT
0D30 E1        2607         LD      L,#H'1
0D31 44        2608         LD      A,#4
0D32 2231      2609         CALL    LSHIFT
0D34 3C78      2610         LD      A,H'78       ; DISPLAY(1) <--- INPUT
0D36 E1        2611         LD      L,#H'1
0D37 1B        2612         ST      A,@HL-
0D38 0A        2613         INC     @HL          ; KETASU COUNT
0D39 40        2614         LD      A,#0         ; PERIOD INPUT ?
0D3A E6        2615         LD      L,#H'6
0D3B 16        2616         CMPR    A,@HL
0D3C BE        2617         BSS     FI28
0D3D BF        2618         BSS     FI90
0D3E 0A        2619 FI28:   INC     @HL
0D3F 652D      2620 FI90:   BS      MAIN
               2621 ;
               2622 ;
               2623 ;       CLOCK NYURYOKU SHORI
               2624 ;
```

ROM PAGE NO.53 *

```
0D41 3C78    2625 CLOKIN: LD    A,H'78
0D43 DA      2626         CMPR  A,#H'A          ; "." KEY ?
0D44 0E      2627         TESTP ZF
0D45 652D    2628         BS    MAIN
             2629 ;
0D47 40      2630         LD    A,#0            ; KETA-SU = 0 ?
0D48 3EC0    2631         CMPR  A,H'C0
0D4A 8E      2632         BSS   CI10
0D4B 2291    2633         CALL  CLEAR           ; CLEAR SHORI

LOC  OBJ     LINE         SOURCE STATEMENT

0D4D A9      2634         BSS   CI30
             2635 ;
0D4E 3CC0    2636 CI10:   LD    A,H'C0          ; KETASU = 4 ?
0D50 D4      2637         CMPR  A,#H'4
0D51 94      2638         BSS   CI12
0D52 652D    2639         BS    MAIN
             2640 ;
0D54 399E    2641 CI12:   TEST  H'E,1           ; CLOCK(2) ?
0D56 9B      2642         BSS   CI20            ;-NO-
0D57 D2      2643         CMPR  A,#2            ; KETASU = 2 ?
0D58 9B      2644         BSS   CI20
0D59 652D    2645         BS    MAIN
             2646 ;
0D5B 21F3    2647 CI20:   CALL  WAITRT          ; WAIT SHORI
0D5D 3CC4    2648         LD    A,H'C4          ; DISPLAY SHIFT
0D5F 3FC5    2649         ST    A,H'C5
0D61 3CC2    2650         LD    A,H'C2
0D63 3FC4    2651         ST    A,H'C4
0D65 3CC1    2652         LD    A,H'C1
0D67 3FC2    2653         ST    A,H'C2
0D69 4A      2654 CI30:   LD    A,#H'A          ; DISPLAY(3) <--- "A"
0D6A 3FC3    2655         ST    A,H'C3
0D6C 3C78    2656         LD    A,H'78          ; DISPLAY(1) <--- INPUT
0D6E 3FC1    2657         ST    A,H'C1
0D70 CC      2658         LD    H,#H'C
0D71 E0      2659         LD    L,#H'0
0D72 0A      2660         INC   @HL
0D73 21E8    2661         CALL  PEEP
0D75 6520    2662         BS    MAIN
             2663 ;
             2664 ;
             2665 ; 5-12)  PLL OUTPUT PROC.
             2666 ;
0D77 3CD0    2667 PLLLD:  LD    A,H'D0          ; WORK <--- F.CURRENT
0D79 3FB0    2668         ST    A,H'B0
0D7B CD      2669         LD    H,#H'D
0D7C E1      2670         LD    L,#H'1
0D7D 44      2671         LD    A,#4
0D7E 223F    2672         CALL  LOAD

ROM PAGE NO.54

0D80 22B4    2673         CALL  FDSPLY
0D82 A7      2674         BSS   PLL1
             2675 ;
0D83 3CB0    2676 PLLST:  LD    A,H'B0          ; F.CURRENT <--- WORK
0D85 3FD0    2677         ST    A,H'D0
0D87 CD      2678         LD    H,#H'D
0D88 E1      2679         LD    L,#H'1
0D89 44      2680         LD    A,#4
0D8A 2251    2681         CALL  STORE
0D8C 2ECF    2682         CMPR  H'F,#H'C        ; MANUAL MODE ?
0D8E 0E      2683         TESTP ZF
0D8F A7      2684         BSS   PLL1
0D90 22B4    2685         CALL  FDSPLY
```

| LOC  | OBJ  | LINE | | SOURCE STATEMENT | | |
|------|------|------|--|------|------|------|
| 0D92 | A7   | 2686 |        | BSS   | PLL1   | |
|      |      | 2687 | ;      |       |        | |
| 0D93 | 21E8 | 2688 | PLLJM: | CALL  | PEEP   | ; J-MODE CHANGE |
| 0D95 | 3C78 | 2689 |        | LD    | A,H'78 | |
| 0D97 | 3FB0 | 2690 |        | ST    | A,H'B0 | |
| 0D99 | 3FD0 | 2691 |        | ST    | A,H'D0 | |
| 0D9B | 229A | 2692 |        | CALL  | LEDMCL | |
| 0D9D | 22A2 | 2693 |        | CALL  | LEDMST | |
| 0D9F | 2EBF | 2694 |        | CMPR  | H'F,#H'B | ; STEP MODE ? |
| 0DA1 | A7   | 2695 |        | BSS   | PLL1   | ;-NO- |
| 0DA2 | CD   | 2696 |        | LD    | H,#H'D | ; WORK <--- F.CURRENT |
| 0DA3 | E1   | 2697 |        | LD    | L,#H'1 | |
| 0DA4 | 44   | 2698 |        | LD    | A,#4   | |
| 0DA5 | 223F | 2699 |        | CALL  | LOAD   | |
|      |      | 2700 | ;      |       |        | |
| 0DA7 | 3996 | 2701 | PLL1:  | TEST  | H'6,1  | ; 100MS TIMER REQUEST ? |
| 0DA9 | 85   | 2702 |        | BSS   | PL00   | ;-NO- |
| 0DAA | 3997 | 2703 | PLL2:  | TEST  | H'7,1  | ; 100MS KEIKA ? |
| 0DAC | AA   | 2704 |        | BSS   | PLL2   | |
| 0DAD | 3B55 | 2705 |        | CLR   | %05,1  | ; MUTE OFF |
| 0DAF | 3B45 | 2706 |        | CLR   | %05,0  | |
| 0DB1 | 3956 | 2707 |        | CLR   | H'6,1  | ; TIMER OFF |
| 0DB3 | 3957 | 2708 |        | CLR   | H'7,1  | |
|      |      | 2709 | ;      |       |        | |
| 0DB5 | C8   | 2710 | PL00:  | LD    | H,#H'8 | ; W1 <--- WORK |
| 0DB6 | EB   | 2711 |        | LD    | L,#H'B | |
| 0DB7 | 44   | 2712 |        | LD    | A,#4   | |
| 0DB8 | 2251 | 2713 |        | CALL  | STORE  | |
| 0DBA | C9   | 2714 |        | LD    | H,#H'9 | |
| 0DBB | EB   | 2715 |        | LD    | L,#H'B | |
| 0DBC | F5   | 2716 |        | ST    | #5,@HL+ | ; W2 <--- 00055 |
| 0DBD | F5   | 2717 |        | ST    | #5,@HL+ | |
| 0DBE | F0   | 2718 |        | ST    | #0,@HL+ | |
| 0DBF | F0   | 2719 |        | ST    | #0,@HL+ | |

ROM PAGE NO.55

| LOC  | OBJ  | LINE | | SOURCE STATEMENT | | |
|------|------|------|--|------|------|------|
| 0DC0 | F0   | 2720 |        | ST    | #0,@HL+ | |
| 0DC1 | 2400 | 2721 |        | CALL  | ADDS   | ; W1 <--- W1 + W2 |
| 0DC3 | C8   | 2722 |        | LD    | H,#H'8 | ; W2 <--- 1KHZ |
| 0DC4 | E1   | 2723 |        | LD    | L,#H'1 | |
| 0DC5 | 29FC | 2724 |        | XCH   | HL,H'FC | |
| 0DC7 | 2263 | 2725 |        | CALL  | RREAD  | |
| 0DC9 | 3CB0 | 2726 |        | LD    | A,H'B0 | |
| 0DCB | D2   | 2727 |        | CMPR  | A,#2   | ; J-MODE : LSB ? |
| 0DCC | 91   | 2728 |        | BSS   | PL12   | ;-NO- |
| 0DCD | EB   | 2729 |        | LD    | L,#H'B | |
| 0DCE | 2440 | 2730 |        | CALL  | SUB    | |
| 0DD0 | 95   | 2731 |        | BSS   | PL20   | |
| 0DD1 | D3   | 2732 | PL12:  | CMPR  | A,#3   | ; J-MODE : USB ? |
| 0DD2 | 95   | 2733 |        | BSS   | PL20   | ;-NO- |
| 0DD3 | 2400 | 2734 |        | CALL  | ADDS   | |
| 0DD5 | C8   | 2735 | PL20:  | LD    | H,#H'8 | ; W2 <--- VCO CHECK FREC |
| 0DD6 | E7   | 2736 |        | LD    | L,#H'7 | |
| 0DD7 | 29FC | 2737 |        | XCH   | HL,H'FC | |

| LOC  | OBJ  | LINE | | SOURCE STATEMENT | | |
|------|------|------|--|------|------|------|
| 0DD9 | 2263 | 2738 | PL22:  | CALL  | RREAD  | |
| 0DDB | 44   | 2739 |        | LD    | A,#4   | |
| 0DDC | 247E | 2740 |        | CALL  | COMP   | ; W1 : W2 |
| 0DDE | 04   | 2741 |        | TESTP | CF     | |
| 0DDF | 99   | 2742 |        | BSS   | PL22   | |
| 0DE0 | 3C9A | 2743 |        | LD    | A,H'9A | ; EDIT PLL(VCO) |
| 0DE2 | 3FBA | 2744 |        | ST    | A,H'BA | |
|      |      | 2745 | ;      |       |        | |
| 0DE4 | CA   | 2746 |        | LD    | H,#H'A | ; BIN = "1F4" + "005" |

```
0DE5  E7      2747        LD      L,#H'7
0DE6  F9      2748        ST      #H'9,@HL+
0DE7  FF      2749        ST      #H'F,@HL+
0DE8  F1      2750        ST      #H'1,@HL+
0DE9  EB      2751        LD      L,#H'B              ; BIN = + "07D"*9....
0DEA  FD      2752        ST      #H'D,@HL+
0DEB  F7      2753        ST      #H'7,@HL+
0DEC  F0      2754        ST      #H'0,@HL+
0DED  40      2755        LD      A,#0
0DEE  3D8F    2756        XCH     A,H'8F
0DF0  23B6    2757        CALL    BADD
0DF2  EB      2758        LD      L,#H'B              ; BIN = + "019"*.9...
0DF3  F9      2759        ST      #H'9,@HL+
0DF4  F1      2760        ST      #H'1,@HL+
0DF5  F0      2761        ST      #H'0,@HL+
0DF6  E0      2762        LD      L,#0
0DF7  3C8E    2763        LD      A,H'8E
0DF9  06      2764        TEST    CF
0DFA  07      2765        RORC    A
0DFB  31      2766        XCH     A,L
0DFC  05      2767        ROLC    A
0DFD  3F8E    2768        ST      A,H'8E
0DFF  11      2769        MOV     L,A

ROM PAGE NO.56

0E00  23B6    2770        CALL    BADD
              2771    ;
0E02  CA      2772        LD      H,#H'A              ; W3 <--- 00000-0
0E03  EA      2773        LD      L,#H'A
0E04  45      2774        LD      A,#5
0E05  223B    2775        CALL    MCLER
0E07  C7      2776        LD      H,#H'7
0E08  ED      2777        LD      L,#H'D              ; W2 <--- 00030-0
0E09  29FC    2778        XCH     HL,H'FC
0E0B  2263    2779        CALL    RREAD
0E0D  2D0B    2780        ST      #0,H'B
0E0F  244D    2781        CALL    DIV                 ; W3 <--- W1 / W2
0E11  248E    2782        CALL    DBCVA               ; W3 BINARY
0E13  06      2783        TEST    CF                  ; EDIT PLL(NP)
0E14  C0      2784        LD      H,#0
0E15  3CA7    2785        LD      A,H'A7
0E17  07      2786        RORC    A
0E18  30      2787        XCH     A,H
0E19  07      2788        RORC    A
0E1A  3FBC    2789        ST      A,H'BC
 LOC  OBJ     LINE        SOURCE STATEMENT

0E1C  10      2790        MOV     H,A
0E1D  05      2791        ROLC    A
0E1E  30      2792        XCH     A,H
0E1F  3CA8    2793        LD      A,H'A8
0E21  07      2794        RORC    A
0E22  30      2795        XCH     A,H
0E23  07      2796        RORC    A
0E24  3FBD    2797        ST      A,H'BD
0E26  10      2798        MOV     H,A
0E27  05      2799        ROLC    A
0E28  30      2800        XCH     A,H
0E29  3CA9    2801        LD      A,H'A9
0E2B  07      2802        RORC    A
0E2C  30      2803        XCH     A,H
0E2D  07      2804        RORC    A
0E2E  3FBE    2805        ST      A,H'BE
0E30  10      2806        MOV     H,A
0E31  3FBF    2807        ST      A,H'BF
              2808    ;
0E33  EB      2809 PL30:  LD      L,#H'B              ; WORK3 <--- WORK1
```

```
0E34 CA      2810           LD      H,#H'A
0E35 44      2811           LD      A,#4
0E36 227F    2812           CALL    MOVES
0E38 249B    2813           CALL    DBCNV           ; W3 BINARY
0E3A CB      2814           LD      H,#H'B
0E3B EB      2815           LD      L,#H'B
0E3C 3CA7    2816           LD      A,H'A7          ; EDIT PLL(A)
0E3E 1A      2817           ST      A,aHL+
0E3F 3CA8    2818           LD      A,H'A8
```

ROM PAGE NO.57 *

```
0E41 1D      2819           OR      A,aHL
0E42 0F      2820           ST      A,aHL
             2821   ;
             2822   ;------EDIT    MSB(D-A)------
0E43 C8      2823 PL40:     LD      H,#H'8          ; W1 <--- WORK
0E44 EB      2824           LD      L,#H'B
0E45 44      2825           LD      A,#4
0E46 2251    2826           CALL    STORE
0E48 C9      2827           LD      H,#H'9
0E49 E9      2828           LD      L,#H'9
0E4A 29FC    2829           XCH     HL,H'FC         ; DC <--- BAND ADRS
0E4C 2263    2830 PL42:     CALL    RREAD
0E4E 44      2831           LD      A,#4
0E4F 247E    2832           CALL    COMP            ; WORK1 : WORK2 COMPEAR
0E51 06      2833           TEST    CF
0E52 8C      2834           BSS     PL42
0E53 C7      2835           LD      H,#H'7
0E54 3C9A    2836           LD      A,H'9A
0E56 31      2837           XCH     A,L
0E57 29FC    2838           XCH     HL,H'FC
0E59 33      2839           LDL     A,aDC           ; MSB(BAND) <--- ROM TA
0E5A 3F86    2840           ST      A,H'86
0E5C 32      2841           LDH     A,aDC+
```

| LOC  OBJ    LINE        SOURCE STATEMENT |

```
0E5D 3FB7    2842           ST      A,H'B7
0E5F 41      2843           LD      A,#1
0E60 3E9A    2844           CMPR    A,H'9A          ; BAND = 1 ?
0E62 AA      2845           BSS     PL44            ;-NO-
0E63 4F      2846           LD      A,#H'F          ; MSB(R-F) <--- "FF"
0E64 3FB8    2847           ST      A,H'B8
0E66 3FB9    2848           ST      A,H'B9
0E68 6EC4    2849           BS      PL60
             2850   ;
0E6A 2D3B    2851 PL44:     ST      #3,H'B          ; W3 <--- W1 / W2
0E6C 244D    2852           CALL    DIV
0E6E EB      2853           LD      L,#H'B          ; WORK1 <--- WORK3
0E6F CA      2854           LD      H,#H'A
0E70 44      2855           LD      A,#4
0E71 226B    2856           CALL    MOVEL
0E73 CA      2857           LD      H,#H'A          ; DC <--- MSB ADDRESS
0E74 EE      2858           LD      L,#H'E
0E75 29FC    2859           XCH     HL,H'FC
0E77 2263    2860 PL46:     CALL    RREAD           ; W2 <--- MSB WAVE
0E79 44      2861           LD      A,#4
0E7A 247E    2862           CALL    COMP            ; W1 : W2
0E7C 8F      2863           BSS     PL48
0E7D 6E87    2864           BS      PL50
             2865   ;
0E7F 06      2866 PL48:     TEST    CF
```

ROM PAGE NO.58

```
0E80 87      2867           BSS     PL50
0E81 CF      2868           LD      H,#H'F
0E82 EC      2869           LD      L,#H'C
```

```
0E83  3843        2870          ADD    @HL,#3          ; DC <--- DC + 3
0E85  6E77        2871          BS     PL46
                  2872  ;
0E87  C8          2873  PL50:   LD     H,#H'8          ; W1 R-SHIFT
0E88  EA          2874          LD     L,#H'A
0E89  44          2875          LD     A,#4
0E8A  227F        2876          CALL   MOVES
0E8C  40          2877          LD     A,#0
0E8D  3F8F        2878          ST     A,H'8F
0E8F  C9          2879          LD     H,#H'9          ; W2 <--- 00000-0
0E90  EA          2880          LD     L,#H'A
0E91  45          2881          LD     A,#5
0E92  223B        2882          CALL   MCLER
0E94  33          2883          LDL    A,@DC           ; W2 <--- MSB(MUL) DATA
0E95  3F9A        2884          ST     A,H'9A
0E97  32          2885          LDH    A,@DC+
0E98  3F9B        2886          ST     A,H'9B
0E9A  33          2887          LDL    A,@DC
0E9B  3F9C        2888          ST     A,H'9C
0E9D  2411        2889          CALL   MUL             ; W1 <--- W1 X W2
0E9F  C8          2890          LD     H,#H'8          ; W1 R-SHIFT
0EA0  ED          2891          LD     L,#H'D
0EA1  42          2892          LD     A,#2
0EA2  226B        2893          CALL   MOVEL

LOC   OBJ         LINE          SOURCE STATEMENT

0EA4  40          2894          LD     A,#0
0EA5  3F8E        2895          ST     A,H'8E
0EA7  3F8F        2896          ST     A,H'8F
0EA9  32          2897          LDH    A,@DC+          ; W2 <--- MSB SUB DATA
0EAA  3F9B        2898          ST     A,H'9B
0EAC  33          2899          LDL    A,@DC
0EAD  3F9C        2900          ST     A,H'9C
0EAF  32          2901          LDH    A,@DC+
0EB0  3F9D        2902          ST     A,H'9D
0EB2  EB          2903          LD     L,#H'B
0EB3  2440        2904          CALL   SUB             ; W1 <--- W1 - W2
0EB5  EB          2905          LD     L,#H'B          ; WORK3 <--- WORK1
0EB6  CA          2906          LD     H,#H'A
0EB7  44          2907          LD     A,#4
0EB8  227F        2908          CALL   MOVES
0EBA  249B        2909          CALL   DBCNV           ; W3 BINARY
0EBC  3CA7        2910          LD     A,H'A7          ; MSB(R-F) <--- BINARY
0EBE  3FB8        2911          ST     A,H'B8

ROM PAGE NO.59

0EC0  3CA8        2912          LD     A,H'A8
0EC2  3FB9        2913          ST     A,H'B9
0EC4  39BF        2914  PL60:   TEST   H'F,3           ; POWER ON ?
0EC6  652D        2915          BS     MAIN            ;-NO-
0EC8  3CBA        2916          LD     A,H'BA          ; NEW VCO SAVE
0ECA  3F03        2917          ST     A,H'03
0ECC  2ECF        2918          CMPR   H'F,#H'C        ; S-MODE = MANUAL ?
0ECE  A5          2919          BSS    PL62            ;-NO-
0ECF  3C79        2920          LD     A,H'79
0ED1  D1          2921          CMPR   A,#1            ; J-MODE INPUT ?
0ED2  97          2922          BSS    PL61            ;-NO-
0ED3  48          2923          LD     A,#8            ; INPUT CLEAR
0ED4  3F79        2924          ST     A,H'79
0ED6  A5          2925          BSS    PL62
                  2926  ;
0ED7  3C04        2927  PL61:   LD     A,H'04          ; OLD-VCO MAKE
0ED9  06          2928          TEST   CF
0EDA  07          2929          RORC   A
0EDB  3FFC        2930          ST     A,H'FC
0EDD  3CBA        2931          LD     A,H'BA          ; NEW-VCO MAKE
0EDF  06          2932          TEST   CF
```

| LOC | OBJ | LINE | | SOURCE | STATEMENT | |
|---|---|---|---|---|---|---|
| 0EE0 | 07 | 2933 | | RORC | A | |
| 0EE1 | 3EFC | 2934 | | CMPR | A,H'FC | ; OLD-VCO = NEW-VCO ? |
| 0EE3 | 0E | 2935 | | TESTP | ZF | |
| 0EE4 | 80 | 2936 | | BSS | PL64 | |
| | | 2937 | ; | | | |
| 0EE5 | 3815 | 2938 | PL62: | SET | %05,1 | ; MUTE(1) ON |
| 0EE7 | 40 | 2939 | | LD | A,#0 | |
| 0EE8 | 3F76 | 2940 | | ST | A,H'76 | ; 3-MS TIMER CLEAR |
| 0EEA | 3F67 | 2941 | | ST | A,H'67 | ; 100MS TIMER REQUEST |
| 0EEC | 3957 | 2942 | | CLR | H'7,1 | |
| 0EEE | 3916 | 2943 | | SET | H'6,1 | |
| 0EF0 | CF | 2944 | PL64: | LD | H,#H'F | ; MSB(MODE) <--- JMODE |
| 0EF1 | 3CB0 | 2945 | | LD | A,H'B0 | |

| LOC | OBJ | LINE | | SOURCE | STATEMENT | |
|---|---|---|---|---|---|---|
| 0EF3 | 31 | 2946 | | XCH | A,L | |
| 0EF4 | 29FC | 2947 | | XCH | HL,H'FC | |
| 0EF6 | CF | 2948 | | LD | H,#H'F | |
| 0EF7 | EE | 2949 | | LD | L,#H'E | |
| 0EF8 | 33 | 2950 | | LDL | A,@DC | |
| 0EF9 | 1F | 2951 | | XOR | A,@HL | |
| 0EFA | 3FA7 | 2952 | | ST | A,H'A7 | |
| 0EFC | 32 | 2953 | | LDH | A,@DC+ | |
| 0EFD | 1F | 2954 | | XOR | A,@HL | |
| 0EFE | 3831 | 2955 | | AND | A,#1 | |

ROM PAGE NO.60

| LOC | OBJ | LINE | | SOURCE | STATEMENT | |
|---|---|---|---|---|---|---|
| 0F00 | CB | 2956 | | LD | H,#H'B | |
| 0F01 | E6 | 2957 | | LD | L,#6 | |
| 0F02 | 1D | 2958 | | OR | A,@HL | |
| 0F03 | 0F | 2959 | | ST | A,@HL | |
| | | 2960 | ; | | | |
| 0F04 | 45 | 2961 | PL70: | LD | A,#H'5 | ; PLL HENKAN |
| 0F05 | 3FFD | 2962 | | ST | A,H'FD | |
| 0F07 | CB | 2963 | | LD | H,#H'B | |
| 0F08 | E6 | 2964 | | LD | L,#H'6 | |
| 0F09 | 0C | 2965 | PL72: | LD | A,@HL | |
| 0F0A | 3FFC | 2966 | | ST | A,H'FC | |
| 0F0C | 33 | 2967 | | LDL | A,@DC | |
| 0F0D | 1A | 2968 | | ST | A,@HL+ | |
| 0F0E | 89 | 2969 | | BSS | PL72 | |
| 0F0F | 3CA7 | 2970 | | LD | A,H'A7 | |
| 0F11 | 3FFC | 2971 | | ST | A,H'FC | |
| 0F13 | 33 | 2972 | | LDL | A,@DC | |
| 0F14 | 3FA7 | 2973 | | ST | A,H'A7 | |
| | | 2974 | ; | | | |
| 0F16 | 42 | 2975 | | LD | A,#2 | |
| 0F17 | 3E76 | 2976 | PL80: | CMPR | A,H'76 | ; 3-MS KEIKA ? |
| 0F19 | 97 | 2977 | | BSS | PL80 | ;-NO- |
| | | 2978 | ; | | | |
| 0F1A | 3C03 | 2979 | | LD | A,H'03 | |
| 0F1C | 3E04 | 2980 | | CMPR | A,H'04 | |
| 0F1E | 0E | 2981 | | TESTP | ZF | |
| 0F1F | AB | 2982 | | BSS | PL82 | |
| 0F20 | 3805 | 2983 | | SET | %05,0 | ; MUTE(2) ON |
| 0F22 | 40 | 2984 | | LD | A,#0 | ; 100MS TIMER REQUEST |
| 0F23 | 3F67 | 2985 | | ST | A,H'67 | |
| 0F25 | 3916 | 2986 | | SET | H'6,1 | |
| 0F27 | 3957 | 2987 | | CLR | H'7,1 | |
| 0F29 | 3C03 | 2988 | | LD | A,H'03 | |
| 0F2B | 3F04 | 2989 | PL82: | ST | A,H'04 | ; VCO SAVE |
| 0F2D | 3B29 | 2990 | | SET | %09,2 | ; PORT(R9) INITIALIZE |
| 0F2F | 3819 | 2991 | | SET | %09,1 | |
| 0F31 | 3939 | 2992 | | SET | H'9,3 | ; ISIO ON |
| 0F33 | 4F | 2993 | | LD | A,#H'F | ; COUNTER <--- "F" |
| 0F34 | 3FA6 | 2994 | | ST | A,H'A6 | |
| 0F36 | 42 | 2995 | | LD | A,#2 | ; SET OUTPUT COMMAND |
| 0F37 | 3A8F | 2996 | | OUT | A,%H'1F | |
| 0F39 | 3CBF | 2997 | | LD | A,H'BF | ; SET FIRST DATA |

```
LOC  OBJ     LINE         SOURCE STATEMENT

0F3B 3AAF   2998          OUT     A,%H'0F
0F3D 4A     2999          LD      A,#H'A        ; "EISO" ON
0F3E 3A8F   3000          OUT     A,%H'1F

ROM PAGE NO.61

0F40 652D   3001          BS      MAIN
            3002 ;
            3003 ;*************************************************

ROM PAGE NO.61

0F50        3004          ORG     H'F50
            3005 ;
            3006 ; ----< PATTERN TABLE >----
            3007 ;
            3008 ;         PLLOUT HENKAN TABLE
0F50 00     3009          DATA    H'00           ; 0
0F51 08     3010          DATA    H'08           ; 1
0F52 04     3011          DATA    H'04           ; 2
0F53 0C     3012          DATA    H'0C           ; 3
0F54 02     3013          DATA    H'02           ; 4
0F55 0A     3014          DATA    H'0A           ; 5
0F56 06     3015          DATA    H'06           ; 6
0F57 0E     3016          DATA    H'0E           ; 7
0F58 01     3017          DATA    H'01           ; 8
0F59 09     3018          DATA    H'09           ; 9
0F5A 05     3019          DATA    H'05           ; 10
0F5B 0D     3020          DATA    H'0D           ; 11
0F5C 03     3021          DATA    H'03           ; 12
0F5D 0B     3022          DATA    H'0B           ; 13
0F5E 07     3023          DATA    H'07           ; 14
0F5F 0F     3024          DATA    H'0F           ; 15
            3025 ;
0F60 00     3026          DATA    H'00           ; PLA,LED PORT
0F61 80     3027          DATA    H'80           ; R73
0F62 40     3028          DATA    H'40           ; R72
0F63 20     3029          DATA    H'20           ; R71
0F64 10     3030          DATA    H'10           ; R70
0F65 08     3031          DATA    H'08           ; R63
0F66 04     3032          DATA    H'04           ; R62
0F67 02     3033          DATA    H'02           ; R61
            3034 ;
0F68 00     3035          DATA    H'00           ; 10(KHZ)
0F69 01     3036          DATA    H'01
0F6A 00     3037          DATA    H'00
0F6B 00     3038          DATA    H'00
0F6C 00     3039          DATA    H'00
0F6D 30     3040          DATA    H'30
            3041 ;
0F6E 00     3042          DATA    H'00           ; NO USE
0F6F 00     3043          DATA    H'00
            3044 ;
            3045 ; MSB BAND TABLE
0F70 00     3046          DATA    H'00           ; -

LOC  OBJ     LINE         SOURCE STATEMENT

0F71 80     3047          DATA    H'80           ; (1)
0F72 40     3048          DATA    H'40           ; (2)
0F73 20     3049          DATA    H'20           ; (3)
0F74 10     3050          DATA    H'10           ; (4)
0F75 08     3051          DATA    H'08           ; (5)
0F76 04     3052          DATA    H'04           ; (6)
0F77 02     3053          DATA    H'02           ; (7)
            3054 ;
```

```
                3055 ; LED MODE TABLE
0F78 20         3056        DATA    H'20            ; (0)
0F79 04         3057        DATA    H'04            ; (1)
0F7A 08         3058        DATA    H'08            ; (2)
0F7B 40         3059        DATA    H'40            ; (3)
0F7C 80         3060        DATA    H'80            ; (4)
                3061 ;
                3062 ;
0F7D 00         3063        DATA    H'00            ; 0.080-0
0F7E 08         3064        DATA    H'08
0F7F 00         3065        DATA    H'00
                3066 ;

ROM PAGE NO.62

0F80 00         3067        DATA    H'00
                3068 ;
                3069 ; USB/LSB COUNT AREA (+,- 1 KHZ)
0F81 10         3070        DATA    H'10            ; 0.001-0
0F82 00         3071        DATA    H'00
0F83 00         3072        DATA    H'00
                3073 ;
                3074 ; FREQ COUNT AREA
0F84 50         3075        DATA    H'50            ; STD 40.455
0F85 45         3076        DATA    H'45
0F86 40         3077        DATA    H'40
                3078 ;
                3079 ; VCO CHECK TABLE
0F87 79         3080        DATA    H'79            ; (1) 44.457-1H
0F88 05         3081        DATA    H'05
0F89 04         3082        DATA    H'04
0F8A 68         3083        DATA    H'68            ; (2) 48.456-1L
0F8B 05         3084        DATA    H'05
0F8C 08         3085        DATA    H'08
0F8D 15         3086        DATA    H'15            ; (3) 53.221-2H
0F8E 82         3087        DATA    H'82
0F8F 12         3088        DATA    H'12
0F90 64         3089        DATA    H'64            ; (4) 58.456-2L
0F91 05         3090        DATA    H'05
0F92 18         3091        DATA    H'18
0F93 63         3092        DATA    H'63            ; (5) 64.176-1H
0F94 77         3093        DATA    H'77
0F95 23         3094        DATA    H'23
0F96 92         3095        DATA    H'92            ; (6) (MAX)-1L
0F97 99         3096        DATA    H'99
0F98 99         3097        DATA    H'99
                3098 ;

LOC  OBJ        LINE        SOURCE STATEMENT

3099 ; BAND CHECK TABLE
0F99 77         3100        DATA    H'77            ; (1) 12.757-7
0F9A 75         3101        DATA    H'75
0F9B 12         3102        DATA    H'12
0F9C 06         3103        DATA    H'06            ; (2)  5.230-6
0F9D 23         3104        DATA    H'23
0F9E 05         3105        DATA    H'05
0F9F 45         3106        DATA    H'45            ; (3)  2.144-5
0FA0 14         3107        DATA    H'14
0FA1 02         3108        DATA    H'02
0FA2 94         3109        DATA    H'94            ; (4)  0.879-4
0FA3 87         3110        DATA    H'87
0FA4 00         3111        DATA    H'00
0FA5 03         3112        DATA    H'03            ; (5)  0.360-3
0FA6 36         3113        DATA    H'36
0FA7 00         3114        DATA    H'00
0FA8 02         3115        DATA    H'02            ; (6)  0.150-2
0FA9 15         3116        DATA    H'15
0FAA 00         3117        DATA    H'00
```

```
OFAB 01      3118         DATA    H'01        ; (7)  0.010-1
OFAC 01      3119         DATA    H'01
OFAD 00      3120         DATA    H'00
             3121    ;
             3122    ; MSB CHECK TABLE
OFAE 00      3123         DATA    H'00        ; (1)  1.300*179-142
OFAF 30      3124         DATA    H'30
OFB0 01      3125         DATA    H'01
OFB1 79      3126         DATA    H'79
OFB2 21      3127         DATA    H'21
OFB3 14      3128         DATA    H'14
OFB4 00      3129         DATA    H'00        ; (2)  2.000*L49-103
OFB5 00      3130         DATA    H'00
OFB6 02      3131         DATA    H'02
OFB7 49      3132         DATA    H'49
OFB8 31      3133         DATA    H'31
OFB9 10      3134         DATA    H'10
OFBA 90      3135         DATA    H'90        ; (3)  (MAX)*133-071
OFBB 99      3136         DATA    H'99
OFBC 99      3137         DATA    H'99
OFBD 33      3138         DATA    H'33
OFBE 11      3139         DATA    H'11
OFBF 07      3140         DATA    H'07
             3141    ;
             3142    ; IN-KEY CONVERT TABLE

ROM PAGE NO.63

OFC0 13      3143         DATA    H'13        ; 0<0> USB
OFC1 42      3144         DATA    H'42        ; 0<1> ON
OFC2 41      3145         DATA    H'41        ; 0<2> DOWN
OFC3 14      3146         DATA    H'14        ; 0<3> AM
OFC4 12      3147         DATA    H'12        ; 1<0> LSB
OFC5 43      3148         DATA    H'43        ; 1<1> OFF
OFC6 83      3149         DATA    H'83        ; 1<2> STEP
OFC7 86      3150         DATA    H'86        ; 1<3> TIME

LOC  OBJ     LINE         SOURCE STATEMENT

OFC8 11      3151         DATA    H'11        ; 2<0> CW
OFC9 82      3152         DATA    H'82        ; 2<1> CLOCK
OFCA 85      3153         DATA    H'85        ; 2<2> MEMO
OFCB 40      3154         DATA    H'40        ; 2<3> UP
OFCC 10      3155         DATA    H'10        ; 3<0> FM
OFCD 22      3156         DATA    H'22        ; 3<1> TIME/CL
OFCE 23      3157         DATA    H'23        ; 3<2> RECALL
OFCF FF      3158         DATA    H'FF        ; 3<3> ---
OFD0 84      3159         DATA    H'84        ; 4<0> MANUAL
OFD1 87      3160         DATA    H'87        ; 4<1> PROGRAM
OFD2 21      3161         DATA    H'21        ; 4<2> CLEAR
OFD3 FF      3162         DATA    H'FF        ; 4<3> ---
OFD4 01      3163         DATA    H'01        ; 5<0> "1"
OFD5 04      3164         DATA    H'04        ; 5<1> "4"
OFD6 07      3165         DATA    H'07        ; 5<2> "7"
OFD7 00      3166         DATA    H'00        ; 5<3> "0"
OFD8 02      3167         DATA    H'02        ; 6<0> "2"
OFD9 05      3168         DATA    H'05        ; 6<1> "5"
OFDA 08      3169         DATA    H'08        ; 6<2> "8"
OFDB 0A      3170         DATA    H'0A        ; 6<3> "."
OFDC 03      3171         DATA    H'03        ; 7<0> "3"
OFDD 06      3172         DATA    H'06        ; 7<1> "6"
OFDE 09      3173         DATA    H'09        ; 7<2> "9"
OFDF 20      3174         DATA    H'20        ; 7<3> ENTRY
             3175    ;
             3176    ; DISPLAY PATTERN
OFE0 7E      3177         DATA    H'7E        ; "0"
OFE1 30      3178         DATA    H'30        ; "1"
OFE2 6D      3179         DATA    H'6D        ; "2"
OFE3 79      3180         DATA    H'79        ; "3"
```

```
OFE4 33       3181         DATA     H'33           ; "4"
OFE5 5B       3182         DATA     H'5B           ; "5"
OFE6 5F       3183         DATA     H'5F           ; "6"
OFE7 72       3184         DATA     H'72           ; "7"
OFE8 7F       3185         DATA     H'7F           ; "8"
OFE9 78       3186         DATA     H'78           ; "9"
OFEA 01       3187         DATA     H'01           ; "-"
OFEB 4F       3188         DATA     H'4F           ; "E"
OFEC 05       3189         DATA     H'05           ; "R"
OFED 1D       3190         DATA     H'1D           ; "O"
OFEE 00       3191         DATA     H'00           ; ---
OFEF 00       3192         DATA     H'00           ; " "
              3193 ;
              3194 ; PATTERN AREA  NUMERIC---> BIT
OFF0 01       3195         DATA     H'01           ; (0)
OFF1 02       3196         DATA     H'02           ; (1)
OFF2 04       3197         DATA     H'04           ; (2)
OFF3 08       3198         DATA     H'08           ; (3)
OFF4 10       3199         DATA     H'10           ; (4)
OFF5 20       3200         DATA     H'20           ; (5)
OFF6 40       3201         DATA     H'40           ; (6)
OFF7 80       3202         DATA     H'80           ; (7)
              3203 ;
              3204 ; PATTERN AREA  U = BIT---> NUMERIC
              3205 ;                I = PORT---> NUMERIC

LOC  OBJ      LINE         SOURCE STATEMENT

OFF8 00       3206         DATA     H'00           ; <01> <0>
OFF9 11       3207         DATA     H'11           ; <02> <1>
OFFA 22       3208         DATA     H'22           ; <04> <2>
OFFB 32       3209         DATA     H'32           ; <08> <2-1>
OFFC 43       3210         DATA     H'43           ; <10> <3>
OFFD 53       3211         DATA     H'53           ; <20> <3-1>
OFFE 63       3212         DATA     H'63           ; <40> <3-2>
OFFF 73       3213         DATA     H'73           ; <80> <3-2-1>
              3214 ;
              3215 ;       END
              3216         END
```

ASSEMBLY COMPLETE,    0 PROGRAM ERROR(S)

SYMBOL TABLE

| | | | | | | | |
|---|---|---|---|---|---|---|---|
| ADD2 | 0401 | ADDS | 0400 | ADDS1 | 0402 | ADDS2 | 0407 |
| ADDS3 | 040A | ADDS4 | 040D | BADD | 03B6 | BADD2 | 03B8 |
| BADD8 | 03CC | CC00 | 0554 | CC10 | 0560 | CC14 | 0574 |
| CC16 | 0579 | CC20 | 0587 | CC22 | 0598 | CC24 | 05BF |
| CC26 | 05CB | CC28 | 05D0 | CC30 | 05D6 | CC32 | 05EB |
| CC36 | 0615 | CI10 | 0D4E | CI12 | 0D54 | CI20 | 0D58 |
| CI30 | 0D69 | CLEAR | 0291 | CLOCK | 0843 | CLOKIN | 0D41 |
| CLR1 | 0294 | CM02 | 0851 | CM10 | 086A | CM20 | 086F |
| CM30 | 089C | CM40 | 08C2 | CM42 | 08C5 | CMS10 | 0537 |
| CMS20 | 0548 | COMP | 047E | COMP2 | 047F | CR1 | 0481 |
| CR15 | 048B | CR2 | 048D | D01 | 044F | D02 | 0450 |
| D04 | 045A | D05 | 045C | D06 | 046F | D09 | 0470 |
| D10 | 0475 | DBC02 | 0493 | DBC10 | 04A2 | DBC12 | 04A4 |
| DBC14 | 04A7 | DBC16 | 04AB | DBC20 | 04AF | DBC22 | 04B3 |
| DBC30 | 04BF | DBCNV | 049B | DBCVA | 048E | DIV | 044D |
| ERDISP | 0CDA | FCONV | 0309 | FCONV1 | 0312 | FCONV2 | 0318 |
| FCONV4 | 031D | FCONV5 | 0320 | FD1 | 02C7 | FD2 | 02CF |
| FD3 | 02D5 | FD4 | 02D6 | FDSPLY | 02B4 | *FI10 | 0D00 |
| FI12 | 0D0E | FI14 | 0D14 | FI20 | 0D1A | FI22 | 0D25 |
| FI24 | 0D28 | FI26 | 0D2D | FI28 | 0D3E | FI90 | 0D3F |
| FQ10 | 0821 | *FQ20 | 0825 | FREQ | 0810 | FREQIN | 0CFC |
| HOLD | 04EB | HOLD1 | 04F0 | *HOLDC | 0500 | INI01 | 04D4 |
| INI02 | 04DF | INT1 | 01A1 | INT12 | 01B2 | INT2 | 01C4 |
| INT22 | 01D1 | IOVF1 | 000E | ISI0 | 01FB | ISI01 | 0209 |

| | | | | | | | |
|---|---|---|---|---|---|---|---|
| ISI02 | 0211 | ISI03 | 021B | ISI09 | 0222 | KEYINQ | 076E |
| KK02 | 078F | KK04 | 0790 | KK22 | 07AE | KK24 | 07C3 |
| KK26 | 07D4 | KK27 | 07D9 | KK28 | 07E1 | KK30 | 07F0 |
| LEDMCL | 029A | LEDMST | 02A2 | LOAD | 023F | LOAD1 | 0245 |
| LOAD2 | 0250 | LSFT1 | 0234 | LSFT2 | 023A | LSHIFT | 0231 |
| MAIN | 052D | MANUAL | 09B2 | MCLER | 023B | * MD20 | 0C42 |
| MD30 | 0C4C | MD40 | 0C5B | MD50 | 0C68 | MD52 | 0C71 |
| MD54 | 0C7F | MD56 | 0C83 | MD60 | 0C96 | MD70 | 0CA6 |
| MD80 | 0CB4 | MD88 | 0CD2 | MEMORY | 09DD | MM01 | 09F1 |
| MM02 | 09F7 | MM10 | 09FE | MM12 | 0A17 | MM20 | 0A1C |
| MM22 | 0A34 | MM30 | 0A3E | MM32 | 0A52 | MM40 | 0A63 |
| MM42 | 0A6E | MN01 | 09C0 | MN02 | 09C6 | MN10 | 09D3 |
| MODE | 0C22 | MOVE | 0255 | MOVEL | 026B | MOVEL1 | 0273 |
| MOVEL2 | 027E | MOVES | 027F | MOVES1 | 0285 | MOVES2 | 0290 |
| MUL | 0411 | MUL01 | 0412 | MUL02 | 0419 | MUL03 | 041C |
| MUL04 | 0421 | MUL05 | 042F | MUL09 | 043F | PE1 | 01F2 |
| PEEP | 01E8 | PL00 | 0DB5 | PL12 | 0DD1 | PL20 | 0DD5 |
| PL22 | 0DD9 | * PL30 | 0E33 | * PL40 | 0E43 | PL42 | 0E4C |
| PL44 | 0E6A | PL46 | 0E77 | PL48 | 0E7F | PL50 | 0E87 |
| PL60 | 0EC4 | PL61 | 0ED7 | PL62 | 0EE5 | PL64 | 0EF0 |
| * PL70 | 0F04 | PL72 | 0F09 | PL80 | 0F17 | PL82 | 0F2B |
| PLL1 | 0DA7 | PLL2 | 0DAA | PLLJM | 0D93 | PLLLD | 0D77 |
| PLLST | 0D83 | PM10 | 0BD9 | PM20 | 0BEB | PM25 | 0C05 |
| PM30 | 0C0E | PM31 | 0C19 | PM32 | 0C1A | PROGRM | 08C6 |
| PWCHK | 0644 | PWOF0 | 064C | PWOF1 | 065F | PWOF2 | 068A |
| PWOF3 | 0697 | PWOF35 | 069A | PWOF4 | 06A0 | PWOF5 | 06A4 |
| RR1 | 0265 | RREAD | 0263 | RSFT1 | 022A | RSFT2 | 0230 |
| RSHIFT | 0227 | SM01 | 08D9 | SM02 | 08DF | SM10 | 08E6 |
| * SM20 | 08EA | SM22 | 08FD | SM30 | 0921 | SM40 | 0941 |
| SM42 | 094D | SM44 | 0952 | SM52 | 0976 | SM54 | 097E |

SYMBOL TABLE

| | | | | | | | |
|---|---|---|---|---|---|---|---|
| SM60 | 0984 | SM62 | 099E | SM64 | 09A4 | START | 04C0 |
| STEP | 08CB | STORE | 0251 | STORE1 | 0257 | STORE2 | 0262 |
| SUB | 0440 | SUB1 | 0441 | SUB2 | 044A | TC10 | 0383 |
| TC12 | 038A | TC20 | 0394 | TC22 | 03A1 | TC30 | 03A9 |
| TC40 | 03B5 | TCHK | 0360 | TCHK1 | 0372 | TCHK2 | 0373 |
| TCONV | 0329 | TCONV2 | 0339 | TCONV9 | 033F | TDS10 | 02E4 |
| TDS20 | 02EA | TDS25 | 02F6 | TDS30 | 02F9 | TDSPLY | 02D9 |
| TIMCNT | 0378 | TIME | 0A7E | TIMER | 0BBB | TM10 | 0A8C |
| TM12 | 0A97 | TM14 | 0AB0 | TM20 | 0AB6 | TM22 | 0AD8 |
| TM28 | 0AEE | TM30 | 0AF7 | TM32 | 0B0F | TM33 | 0B15 |
| TM34 | 0B20 | TM35 | 0B26 | TM36 | 0B30 | TM38 | 0B46 |
| TM40 | 0B48 | TM50 | 0B5B | TM60 | 0B78 | TM72 | 0BA5 |
| TM74 | 0BAF | TM80 | 0BBE | TR10 | 0040 | TR12 | 0049 |
| TR14 | 0054 | TR16 | 005A | TR18 | 005D | TR20 | 0063 |
| TR21 | 0071 | TR22 | 007B | TR23 | 0081 | TR30 | 008D |
| TR31 | 0094 | TR32 | 00A5 | TR33 | 00AC | TR40 | 00B4 |
| TR402 | 00BD | TR405 | 00C4 | TR41 | 00CD | TR42 | 00D1 |
| TR43 | 00DE | TR44 | 00E3 | TR45 | 00F4 | TR46 | 00F8 |
| TR47 | 00FA | TR48 | 0102 | TR50 | 0109 | TR502 | 0112 |
| TR51 | 0119 | TR55 | 012E | TR56 | 0136 | TR562 | 0139 |
| TR57 | 013E | TR58 | 0146 | TR59 | 014E | TR60 | 0150 |
| TR61 | 0156 | TR65 | 0167 | TR66 | 016E | TR665 | 0173 |
| TR67 | 0175 | TR68 | 0177 | TR685 | 0180 | TR69 | 0188 |
| TR695 | 018B | TR90 | 0194 | TS20 | 06CB | TS40 | 06D7 |
| TS42 | 06E3 | TS50 | 06F7 | TS52 | 0716 | TS54 | 071C |
| TS60 | 0723 | TS62 | 0726 | TS80 | 0732 | TS82 | 0757 |
| TS84 | 075C | W1 | 035A | W2 | 035C | W3 | 035D |
| WAIT1 | 01F6 | WAIT2 | 01FA | WAITRT | 01F3 | WAVEC2 | 0345 |
| WAVECH | 0340 | | | | | | |

DEFINED   329 USER SYMBOL(S)

A>

The invention is claimed as follows:

1. A tuning system for a radio receiver comprising: first local oscillator means for producing first local oscillator signals at frequencies over a first predetermined range of frequencies; said first local oscillator means being responsive to first predetermined oscillator control signals for varying the frequency of said first local oscillator signals over said first predetermined range at first predetermined increments; second local oscillator means for normally producng a second local oscillator signal at a predetermined frequency; frequency varying means coupled with said second local oscillator means and responsive to second predetermined oscillator control signals for varying the frequency of said second local oscillator signal over a second predetermined range of frequencies relative to said predetermined frequency normally produced thereby and at second predetermined increments, said second predetermined increments being smaller than said first predetermined increments; and control circuit means for producing said first and second predetermined oscillator control signals; wherein said frequency varying means comprises counter means coupled to receive said second predetermined oscillator control signals and decoder means coupled to said counter means, for counting and decoding said second predetermined oscillator control signals to form control signals corresponding to frequencies in said second predetermined range and at said second predetermined increments.

2. A system according to claim 1 and further including selector means selectively actuatable for causing said control circuit means to produce said second predetermined oscillator control signals, thereby varying said second local oscillator signal at said second predetermined increments.

3. A system according to claim 1 wherein said control circuit means comprises microprocessor means.

4. A system according to claim 12 wherein said second local oscillator means comprises voltage controlled oscillator means and con.trol voltage producing means for normally producing a control voltage corresponding to the predetermined, frequency normally produced by said second local oscillator means; said control voltage producing means being responsive to said frequency varying means for varying said control voltage at increments and over a range corresponding to said second predetermined increments and to said second predetermined range of frequencies.

5. A system according to claim 1 wherein said first local oscillator means comprises voltage controlled oscillator means responsive to a control voltage for producing said first local oscillator signal in a predetermined systematic fashion; and further including control voltage producing means intermediate said control circuit means and said first local oscillator means and responsive to said first predetermined oscillator control signals for producing control voltages over a range and at increments corresponding to said first predetermined range of frequencies and said first predetermined increments.

* * * * *